US012751121B2

(12) United States Patent
Sung et al.

(10) Patent No.: US 12,751,121 B2
(45) Date of Patent: Sep. 29, 2026

(54) DISPLAY DEVICE AND METHOD OF FABRICATING THE SAME

(71) Applicant: SAMSUNG DISPLAY CO., LTD., Yongin-si (KR)

(72) Inventors: Woo Yong Sung, Yongin-si (KR); Seung Yong Song, Yongin-si (KR); Jeong Seok Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 393 days.

(21) Appl. No.: 18/225,895

(22) Filed: Jul. 25, 2023

(65) Prior Publication Data

US 2024/0145654 A1 May 2, 2024

(30) Foreign Application Priority Data

Oct. 26, 2022 (KR) ........................ 10-2022-0139298

(51) Int. Cl.
*H10H 20/857* (2025.01)
*H10H 20/831* (2025.01)
(Continued)

(52) U.S. Cl.
CPC ........ *H10H 20/857* (2025.01); *H10H 20/831* (2025.01); *H10H 20/853* (2025.01);
(Continued)

(58) Field of Classification Search
CPC .............. H01L 25/0753; H10H 20/831; H10H 20/853; H10H 20/857
See application file for complete search history.

(56) References Cited

U.S. PATENT DOCUMENTS

| | | | |
|---|---|---|---|
| 11,476,313 | B2 | 10/2022 | Choung et al. |
| 11,610,952 | B2 | 3/2023 | Choung et al. |

(Continued)

FOREIGN PATENT DOCUMENTS

| | | |
|---|---|---|
| KR | 10-2015-0033345 | 4/2015 |
| KR | 10-2015-0071642 | 6/2015 |

(Continued)

OTHER PUBLICATIONS

Office Action issued in corresponding Korean Patent Application No. KR 10-2022-0139298 on Jun. 12, 2026.

*Primary Examiner* — Abdulmajeed Aziz
*Assistant Examiner* — Nathaniel J Lee
(74) *Attorney, Agent, or Firm* — F. CHAU & ASSOCIATES, LLC

(57) ABSTRACT

A display device includes first and second pixel electrodes disposed on a substrate and spaced apart from each other. An inorganic insulating layer is disposed on the substrate and partially overlaps the first and second pixel electrodes. A metal layer structure is disposed on the inorganic insulating layer and includes first and second openings overlapping the first and second pixel electrodes, respectively. First and second light-emitting layers are disposed on the first and second pixel electrodes, respectively. First and second common electrodes are disposed on the first and second light-emitting layers, respectively. The metal layer structure includes first and second metal layers alternately stacked with each other in which the first metal layers comprise uppermost and lowermost layers thereof. Each of the first metal layers includes metal tips that protrude beyond the second metal layers and are positioned on sidewalls of each of the first and second openings.

20 Claims, 32 Drawing Sheets

CP: CP1, CP2, CP3

(51) Int. Cl.

| | |
|---|---|
| ***H10H 20/853*** | (2025.01) |
| ***H10W 90/00*** | (2026.01) |
| *H10H 20/01* | (2025.01) |

(52) U.S. Cl.

CPC .......... *H10W 90/00* (2026.01); *H10H 20/032* (2025.01); *H10H 20/0364* (2025.01)

(56) References Cited

U.S. PATENT DOCUMENTS

| | | | | |
|---|---|---|---|---|
| 11,690,254 | B2 | 6/2023 | Choung et al. | |
| 11,690,255 | B2 | 6/2023 | Choung et al. | |
| 11,910,657 | B2 | 2/2024 | Choung et al. | |
| 12,082,447 | B2 | 9/2024 | Choung et al. | |
| 12,120,938 | B1 | 10/2024 | Choung et al. | |
| 12,295,215 | B2 | 5/2025 | Choung et al. | |
| 2003/0006697 | A1* | 1/2003 | Weaver | H10K 59/179 313/503 |
| 2018/0351126 | A1* | 12/2018 | Choi | H10K 59/122 |
| 2019/0081273 | A1* | 3/2019 | Sung | H10K 77/111 |
| 2019/0245017 | A1* | 8/2019 | Jeon | H10K 59/352 |
| 2020/0185573 | A1* | 6/2020 | Shim | H10K 59/38 |
| 2021/0226154 | A1* | 7/2021 | Ban | H10K 59/873 |
| 2022/0077251 | A1 | 3/2022 | Choung et al. | |
| 2023/0301139 | A1* | 9/2023 | Choung | H10K 59/122 257/40 |
| 2025/0234737 | A1 | 7/2025 | Choung et al. | |
| 2025/0234738 | A1 | 7/2025 | Choung et al. | |
| 2025/0301876 | A1 | 9/2025 | Choung et al. | |

FOREIGN PATENT DOCUMENTS

| | | |
|---|---|---|
| KR | 10-2020-0073805 | 6/2020 |
| WO | 2022050983 A1 | 3/2022 |

* cited by examiner

DISPLAY DEVICE AND METHOD OF FABRICATING THE SAME

CROSS-REFERENCE TO RELATED APPLICATION

This application claims priority under 35 U.S.C. § 119 to Korean Patent Application No. 10-2022-0139298, filed on Oct. 26, 2022 in the Korean Intellectual Property Office, the disclosure of which is incorporated by reference in its entirety herein.

1. TECHNICAL FIELD

The present disclosure relates to a display device and a method of fabricating the same.

2. DISCUSSION OF RELATED ART

The demand for display devices for displaying images has diversified as the information society has developed. For example, display devices have been applied to various different types of electronic devices, such as smart phones, digital cameras, notebook computers, navigation systems, and smart televisions. The display devices may be flat panel display devices, such as a liquid crystal display (LCD) device, a field emission display (FED) device or an organic light-emitting diode (OLED) display device. Light-emitting display devices, among such flat panel display devices, include self emitting light-emitting elements capable in which the pixels of the display device may emit light without the need of a backlight unit for providing light to the display panel.

SUMMARY

Aspects of embodiments of the present disclosure provide a display device in which separate light-emitting elements can be formed in each emission area without a requirement of a mask process.

However, aspects of embodiments of the present disclosure are not restricted to those set forth herein. The above and other aspects of embodiments of the present disclosure will become more apparent to one of ordinary skill in the art to which the present disclosure pertains by referencing the detailed description of the present disclosure given below.

According to an embodiment of the present disclosure, a display device includes a first pixel electrode and a second pixel electrode disposed on a substrate and arranged to be spaced apart from each other. An inorganic insulating layer is disposed on the substrate and partially overlaps the first pixel electrode and the second pixel electrode. A metal layer structure is disposed on the inorganic insulating layer and includes a first opening overlapping the first pixel electrode and a second opening overlapping the second pixel electrode. A first light-emitting layer and a second light-emitting layer are disposed on the first pixel electrode and the second pixel electrode, respectively. A first common electrode and a second common electrode are disposed on the first light-emitting layer and the second light-emitting layer, respectively. The metal layer structure includes a plurality of first metal layers and a plurality of second metal layers that are alternately stacked with each other. The first metal layers comprise uppermost and lowermost layers of the alternately stacked plurality of first and second metal layers. Each of the plurality of first metal layers includes metal tips that protrude beyond the plurality of second metal layers and are positioned on sidewalls of each of the first opening and the second opening.

In an embodiment, the plurality of first metal layers may include titanium (Ti), and the plurality of second metal layers may include aluminum (Al).

In an embodiment, the first common electrode and the second common electrode may directly contact side surfaces of one second metal layer of the plurality of second metal layers disposed directly above a lowermost first metal layer of the metal layer structure.

In an embodiment, the first light-emitting layer and the second light-emitting layer may be directly contact the side surfaces of the one second metal layer disposed directly above the lowermost first metal layer of the metal layer structure.

In an embodiment, the inorganic insulating layer may be spaced apart from top surfaces of the first pixel electrode and the second pixel electrode. A portion of the first light-emitting layer may be disposed between the first pixel electrode and the inorganic insulating layer. A portion of the second light-emitting layer may be disposed between the second pixel electrode and the inorganic insulating layer.

In an embodiment, the display device may further comprise residual organic patterns disposed on metal tips of a middle first metal layer that is positioned between a lowermost first metal layer and an uppermost first metal layer of the metal layer structure. The residual organic patterns include a same material as the first light-emitting layer or the second light-emitting layer. Residual electrode patterns are disposed on the residual organic patterns and include a same material as the first common electrode or the second common electrode.

In an embodiment, the display device may further comprise first organic patterns disposed on an uppermost first metal layer of the plurality of first metal layers and including a same material as the first light-emitting layer. First electrode patterns are disposed on the first organic patterns and include a same material as the first common electrode. Second organic patterns are disposed on the first electrode patterns and including a same material as the second light-emitting layer. Second electrode patterns are disposed on the second organic patterns and include a same material as the second common electrode.

In an embodiment, the display device may further comprise a first capping layer disposed on the sidewalls of the first opening and on the first common electrode and the first electrode pattern, and a second capping layer disposed on the sidewalls of the second opening and on the second common electrode and the second electrode pattern. The second organic patterns may be disposed directly on the first capping layer.

In an embodiment, one second organic pattern of the second organic patterns and one second electrode pattern of the second electrode patterns disposed around the first opening may have a smaller width than one second organic pattern of the second electrode patterns and one second electrode pattern of the second electrode patterns disposed around the second opening.

In an embodiment, the display device may further comprise a third pixel electrode disposed on the substrate and arranged to be spaced apart from the second pixel electrode, a third light-emitting layer disposed on the third pixel electrode, and a third common electrode disposed on the third light-emitting layer. The metal layer structure may further include a third opening overlapping with the third pixel electrode, and the display device may further comprise third organic patterns disposed on the second electrode patterns and including a same material as the third light-emitting layer, and third electrode patterns disposed on the third organic patterns and including a same material as the third common electrode.

In an embodiment, the metal layer structure may further include a trench disposed between the first opening and the second opening and penetrating an uppermost first metal layer of the plurality of first metal layers and at least one of the second metal layers of the plurality of second metal layers, and metal tips may be formed in each of the first metal layers positioned on sidewalls of the trench to protrude beyond the plurality of second metal layers.

In an embodiment, the display device may further comprise fourth organic patterns disposed in the trench of the metal layer structure and including a same material as the first light-emitting layer, fourth electrode patterns disposed on the fourth organic patterns and including a same material as the first common electrode, fifth organic patterns disposed on the fourth electrode patterns and including a same material as the second light-emitting layer, and fifth electrode patterns disposed on the fifth organic patterns and including a same material as the second common electrode.

In an embodiment, the display device may further comprise a first thin-film encapsulation layer disposed on the metal layer structure, the first common electrode, and the second common electrode, a second thin-film encapsulation layer disposed on the first thin-film encapsulation layer, and a third thin-film encapsulation layer disposed on the second thin-film encapsulation layer.

In an embodiment, the display device may further comprise a light-blocking layer disposed on the third thin-film encapsulation layer and including a plurality of holes overlapping the first opening and the second opening, a first color filter disposed on the first light-emitting layer and overlapping the first opening, and a second color filter overlapping the second opening.

According to an embodiment of the present disclosure, a method of fabricating a display device, comprises forming a first pixel electrode and a second pixel electrode on a substrate. The first pixel electrode and the second pixel electrode are arranged to be spaced apart from each other. A sacrificial layer is disposed on the first pixel electrode and the second pixel electrode. An inorganic insulating layer is disposed on the sacrificial layer. A plurality of first metal layers and a plurality of second metal layers are alternately stacked on the inorganic insulating layer. A first hole is formed that does not overlap with the first pixel electrode and the second pixel electrode and penetrates at least some of the plurality of first metal layers and at least some of the plurality of second metal layers. A second hole penetrates the first metal layers and the second metal layers to expose a portion of the sacrificial layer on the first pixel electrode. The sacrificial layer is removed by wet-etching the sacrificial layer and sidewalls of each of the first hole and the second hole to form metal tips in each of the plurality of first metal layers that protrude beyond sidewalls of each of the second metal layers. A first light-emitting layer and a first common electrode are formed on the first pixel electrode in a first opening that is obtained from the wet etching of the second hole. A first capping layer is formed on the first common electrode, the first metal layers, and the second metal layers.

In an embodiment, the forming of the first light-emitting layer and the first common electrode may comprise depositing materials for forming the first light-emitting layer and the first common electrode. The depositing of the materials for forming the first light-emitting layer and the first common electrode may comprise depositing the materials for forming the first light-emitting layer and the first common electrode in a diagonal direction with respect to a top surface of the substrate.

In an embodiment, the depositing of the materials for forming the first light-emitting layer and the first common electrode may comprise depositing the material for forming the first light-emitting layer at an angle in a range of about 45° to about 50° with respect to the top surface of the substrate and depositing the material for forming the first common electrode at an angle less than or equal to about 30° with respect to the top surface of the substrate.

In an embodiment, the forming of the first light-emitting layer and the first common electrode may comprise forming residual organic patterns in the first opening. The residual organic patterns are disposed on the metal tips and include a same material as the first light-emitting layer. Residual electrode patterns are formed that are disposed on the residual organic patterns and include a same material as the first common electrode.

In an embodiment, the forming of the first light-emitting layer and the first common electrode may comprise forming first organic patterns that are disposed on the plurality of first metal layers and the plurality of second metal layers and include a same material as the first light-emitting layer, and first electrode patterns that include a same material as the first common electrode, and the first capping layer may be disposed on the first electrode patterns.

In an embodiment, the method of fabricating a display device may further comprise after the forming the first capping layer, forming a second opening overlapping the second pixel electrode and penetrating the first organic patterns, the first electrode patterns, the first capping layer, the first metal layers, and the second metal layers, and forming a second light-emitting layer and a second common electrode on the second pixel electrode, in the second opening, and forming a second capping layer on the second common electrode, the plurality of first metal layers, and the plurality of second metal layers.

According to the aforementioned and other embodiments of embodiments of the present disclosure, light-emitting elements may be disposed in openings of a metal layer structure including multiple metal layers that are alternately stacked. The metal layer structure may include metal tips that are formed in one or more metal layers to protrude, and light-emitting elements that are not connected between the openings can be formed through a deposition process that does not involve the use of a mask. Accordingly, unnecessary components of a display device can be omitted by using processes that do not involve the use of a mask, and the size of unnecessary part of a non-display area can be reduced.

It should be noted that the effects of embodiments of the present disclosure are not limited to those described above, and other effects of embodiments of the present disclosure will be apparent from the following description.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF EMBODIMENTS

The present disclosure will now be described more fully hereinafter with reference to the accompanying drawings, in which embodiments of the present disclosure are shown. The present disclosure may, however, be embodied in different forms and should not be construed as limited to embodiments set forth herein.

It will also be understood that when a layer is referred to as being "on" another layer or substrate, it can be directly on the other layer or substrate, or intervening layers may also be present. When a layer is referred to as being "directly on" another layer or substrate, no intervening layers are present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

Hereinafter, embodiments of the present disclosure will be described with reference to the accompanying drawings.

Figure 1:
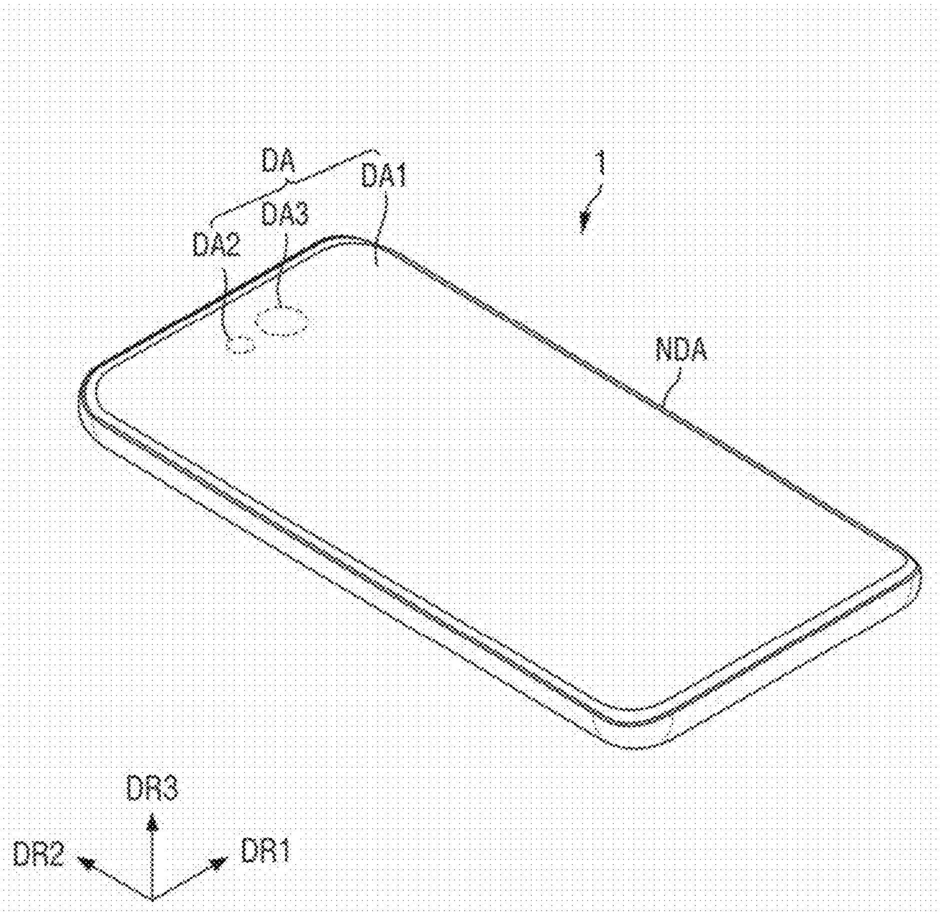
FIG. 1 is a perspective view of an electronic device according to an embodiment of the present disclosure.

FIG. 1 is a perspective view of an electronic device according to an embodiment of the present disclosure.

Referring to FIG. 1, an electronic device 1 displays a moving images and/or still images. The electronic device 1 may refer to different types of electronic devices providing a display screen. Examples of the electronic device 1 include a television (TV), a notebook computer, a monitor, an electronic billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book reader, a portable multimedia player (PMP), a navigation device, a gaming console, a digital camera, and a camcorder. However, embodiments of the present disclosure are not necessarily limited thereto.

Figure 2:
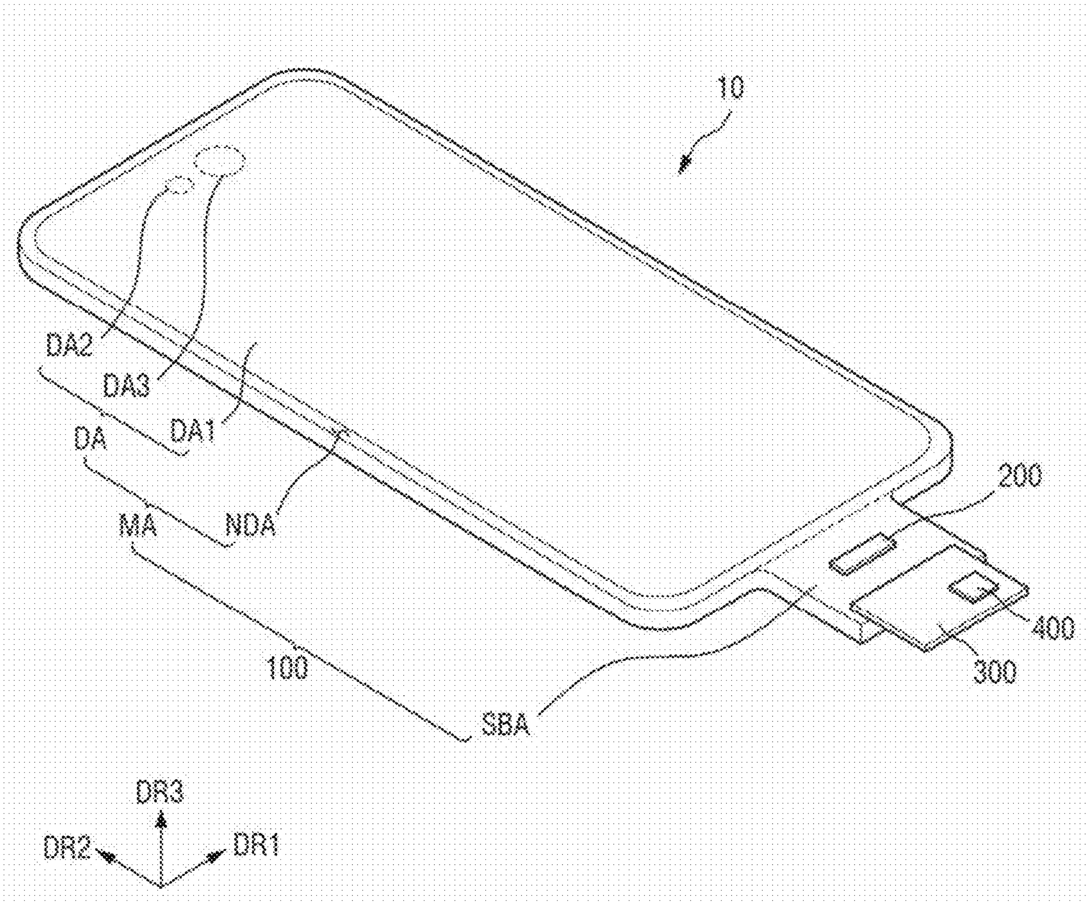
FIG. 2 is a perspective view of a display device included in the electronic device according to an embodiment of the present disclosure.

In an embodiment, the electronic device 1 may include a display device 10 as shown in FIG. 2. Examples of the display device 10 include an inorganic light-emitting diode display device, an organic light-emitting diode (OLED) display device, a quantum-dot light-emitting display device, a plasma display device, and a field emission display (FED) device. The display device 10 will hereinafter be described as being, for example, an OLED display device for convenience of explanation, but embodiments of the present disclosure are not necessarily limited thereto. Obviously, the display device 10 may also be applicable to various other display devices.

The shape of the electronic device 1 may vary. For example, the electronic device 1 may have a rectangular shape that extends longer horizontally than vertically, a rectangular shape that extends longer vertically than horizontally, a square shape, a rectangular shape with rounded corners, another polygonal shape, a circular shape, an irregular shape, etc. In an embodiment, a display area DA of the electronic device 1 may generally have a similar shape to the electronic device 1. FIG. 1 illustrates that the electronic device 1 has a rectangular shape that extends longer in a second direction DR2 than in a first direction DR1.

The electronic device 1 may include a display area DA and a non-display area NDA. The display area DA may be an area where an image can be displayed, and the non-display area NDA may be an area where an image is not displayed. The display area DA may also be referred to as an active area, and the non-display area NDA may also be referred to as an inactive area. In an embodiment, the display area DA may be positioned in the middle of the electronic device 1 (e.g., in the first and second directions DR1, DR2).

In an embodiment, the display area DA may include first, second, and third display areas DA1, DA2, and DA3. The second and third display areas DA2 and DA3 may be component areas where components for adding various functions are disposed.

FIG. 2 is a perspective view of a display device included in the electronic device of FIG. 1.

Referring to FIG. 2, the electronic device 1 may include a display device 10. The display device 10 may provide a display screen for the electronic device 1 for displaying one or more images. In an embodiment, the display device 10 may have a similar shape to the electronic device 1. For example, the display device 10 may have an almost rectangular shape having short sides extending in the first direction DR1 and long sides extending in the second direction DR1. In an embodiment, the corners where the short sides and the long sides of the display device 10 meet may be rounded to have a predetermined curvature or may be right-angled. However, the shape of the display device 10 is not necessarily limited thereto, and the display device 10 may be formed in various other shapes such as another polygonal shape, a circular shape, an elliptical shape, an irregular shape, etc.

The display device 10 may include a display panel 100, a display driving unit 200, a circuit board 300, and a touch driving unit 400.

The display panel 100 may include a main area MA and a sub-area SBA.

The main area MA may include a display area DA, which includes pixels for displaying an image, and a non-display area NDA, which is disposed around the display area DA (e.g., in the first and second directions DR1, DR2). For example, in an embodiment, the non-display area NDA may fully surround the display area (e.g., in the first and second directions DR1, DR2). However, embodiments of the present disclosure are not necessarily limited thereto. In an embodiment, the display area DA may include the first, second, and third display areas DA1, DA2, and DA3. However, embodiments of the present disclosure are not necessarily limited thereto and the number of the display areas may vary. The display area DA may emit light through a plurality of emission areas or openings. For example, the display panel 100 may include pixel circuits including switching elements, a pixel-defining film defining the emission areas or the openings, and self-light-emitting elements.

For example, in an embodiment the self-light-emitting elements may include organic light-emitting diodes (OLEDs), quantum-dot light-emitting diodes (LEDs) including a quantum-dot light-emitting layer, inorganic LEDs including an inorganic semiconductor, and/or microLEDs. However, embodiments of the present disclosure are not necessarily limited thereto.

The non-display area NDA may be arranged on the outside of the display area DA (e.g., in the first and/or second directions DR1, DR2). The non-display area NDA may be defined as an edge part of the main area MA. In an embodiment, the non-display area NDA may include a gate driving unit providing gate signals to gate lines and fan-out lines connecting the display driving unit 200 and the display area DA.

The sub-area SBA may be an area extending from one side of the main area MA. In an embodiment, the sub-area SBA may include a flexible material that is bendable, foldable, or rollable. For example, in an embodiment in which the sub-area SBA is bendable, the sub-area SBA may be bent to overlap with the main area MA in a thickness direction (e.g., a third direction DR3). The sub-area SBA may include the display driving unit 200 and a pad unit, which is connected to the circuit board 300. However, embodiments of the present disclosure are not necessarily limited thereto. For example, in some embodiments the sub-area SBA may not be provided, and the display driving unit 200 and the pad unit may be disposed in the non-display area NDA.

The display driving unit 200 may output signals and voltages for driving the display panel 100. The display driving unit 200 may provide data voltages to data lines. The display driving unit 200 may provide power supply voltages to power supply lines and may provide gate control signals to the gate driving unit. In an embodiment, the display driving unit 200 may be formed as an integrated circuit (IC) and may be mounted on the display panel 100 in a chip-on-glass (COG) or chip-on-plastic (COP) manner or via ultrasonic bonding. For example, the display driving unit 200 may be disposed in the sub-area SBA and may overlap with the main area MA (e.g., in the third direction DR3) when the sub-area SBA is bent. In another example, the display driving unit 200 may be mounted on the circuit board 300.

The circuit board 300 may be attached to the pad unit of the display panel 100 via an anisotropic conductive film (ACF). Lead lines of the circuit board 300 may be electrically connected to the pad unit of the display panel 100. In an embodiment, the circuit board 300 may be a printed circuit board (PCB), a flexible PCB (FPCB), or a flexible film such as a chip-on-film (COF).

The touch driving unit 400 may be mounted on the circuit board 300. The touch driving unit 400 may be electrically connected to a touch sensing unit of the display panel 100. The touch driving unit 400 may provide a touch driving signal to a plurality of touch electrodes of the touch sensing unit and may sense capacitance variations between the touch electrodes. For example, the touch driving signal may be a pulse signal having a predetermined frequency. The touch driving unit 400 may calculate the presence and coordinates of input based on the capacitance variations between the touch electrodes. The touch driving unit 400 may be formed as an integrated circuit (IC).

Figure 3:
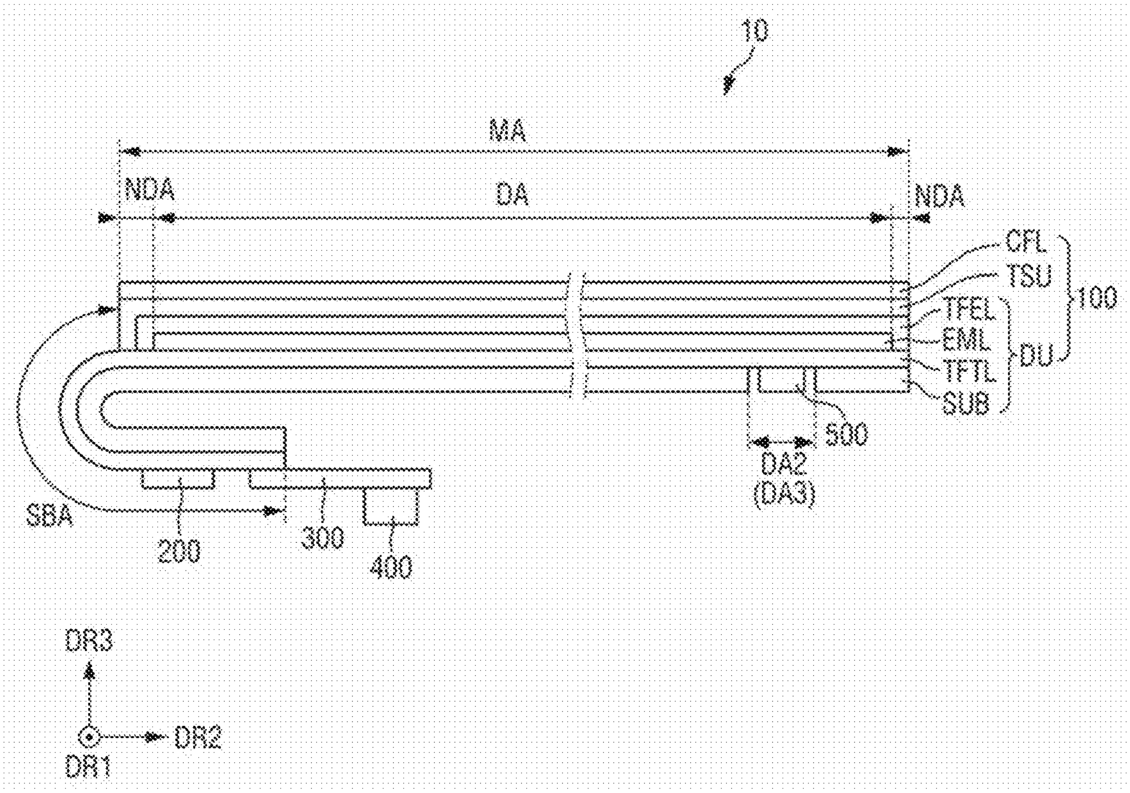
FIG. 3 is a cross-sectional view of the display device of FIG. 2 according to an embodiment of the present disclosure.

FIG. 3 is a cross-sectional view of the display device of FIG. 2.

Referring to FIG. 3, the display panel 100 may include a display layer DU and a color filter layer CFL. The display layer DU may include a substrate SUB, a thin-film transistor (TFT) layer TFTL, a light-emitting element layer EML, and a thin-film encapsulation layer TFEL.

The substrate SUB may be a base substrate or a base member. The substrate SUB may be a flexible substrate that is bendable, foldable, or rollable. For example, in an embodiment the substrate SUB may include a polymer resin such as polyimide (PI). However, embodiments of the present disclosure are not necessarily limited thereto. For example, in some embodiments the substrate SUB may include a glass material or a metal material.

The TFT layer TFTL may be disposed on the substrate SUB. The TFT layer TFTL may include a plurality of TFTs that form the pixel circuitry of pixels. The TFT layer TFTL may further include gate lines, data lines, power lines, gate control lines, and fan-out lines connecting the display driving unit 200 and the data lines, and lead lines connecting the display driving unit 200 and the pad unit. The TFTs may include semiconductor regions, source electrodes, drain electrodes, and gate electrodes. For example, in an embodiment in which the gate driving unit is formed on one side of the non-display area NDA of the display panel 100, the gate driving unit may include TFTs.

The TFT layer TFTL may be disposed in the display area DA, the non-display area NDA, and the sub-area SBA. The TFTs, the gate lines, the data lines, and the power lines of the TFT layer TFTL may be disposed in the display area DA. The gate control lines and the fan-out lines of the TFT layer TFTL may be disposed in the non-display area NDA. The lead lines of the TFT layer TFTL may be disposed in the sub-area SBA.

The light-emitting element layer EML may be disposed on the TFT layer TFTL. The light-emitting element layer EML may include a plurality of light-emitting elements, which include first electrodes, second electrodes, light-emitting layers that emit light, and a pixel-defining film, which defines the pixels. The light-emitting elements of the light-emitting element layer EML may be disposed in the display area DA.

In an embodiment, the light-emitting layers may be organic light-emitting layers including an organic material. The light-emitting layers may include hole transport layers, organic light-emitting layers, and electron transport layers. As the first electrodes receive a voltage through the TFTs of the TFT layer TFTL and the second electrodes receive a cathode voltage, holes and electrons may move to the organic emission layers through the hole transport layers and the electron transport layers, respectively, and may combine together in the organic light-emitting layers to emit light.

Alternatively, the light-emitting elements may be quantum-dot light-emitting diodes (LEDs) including quantum-dot light-emitting layers, inorganic LEDs including an inorganic semiconductor, or micro-LEDs.

In an embodiment, the thin film-encapsulation layer TFEL may cover the top surface and sides of the light-emitting element layer EML and may protect the light-emitting element layer EML. The thin film-encapsulation layer TFEL may include at least one inorganic film and at least one organic film for encapsulating the light-emitting element layer EML.

The color filter layer CFL may be disposed on the thin film-encapsulation layer TFEL. The color filter layer CFL may include a plurality of color filters, which correspond to a plurality of emission areas. Each of the color filters may selectively transmit light of a particular wavelength therethrough and may block or absorb light of other wavelengths. The color filter layer CFL may absorb some of the light introduced into the display device 10 from the outside and may thus reduce reflected light of external light. Accordingly, the color filter layer CFL can reduce or prevent color distortions that may be caused by the reflection of external light.

As the color filter layer CFL is disposed directly on the thin film-encapsulation layer TFEL (e.g., in the third direction DR3), the display device 10 may not need a separate substrate for the color filter layer CFL. Accordingly, the thickness of the display device 10 may be relatively small.

In some embodiments, the display device 10 may further include an optical device 500. The optical device 500 may be disposed in the second or third display area DA2 or DA3. In an embodiment, the optical device 500 may emit or receive infrared light, ultraviolet light, or visible light. For example, the optical device 500 may be an optical sensor capable of sensing light incident upon the display device 10, such as a proximity sensor, a light sensor, a camera sensor, or an image sensor. However, embodiments of the present disclosure are not necessarily limited thereto.

Figure 4:
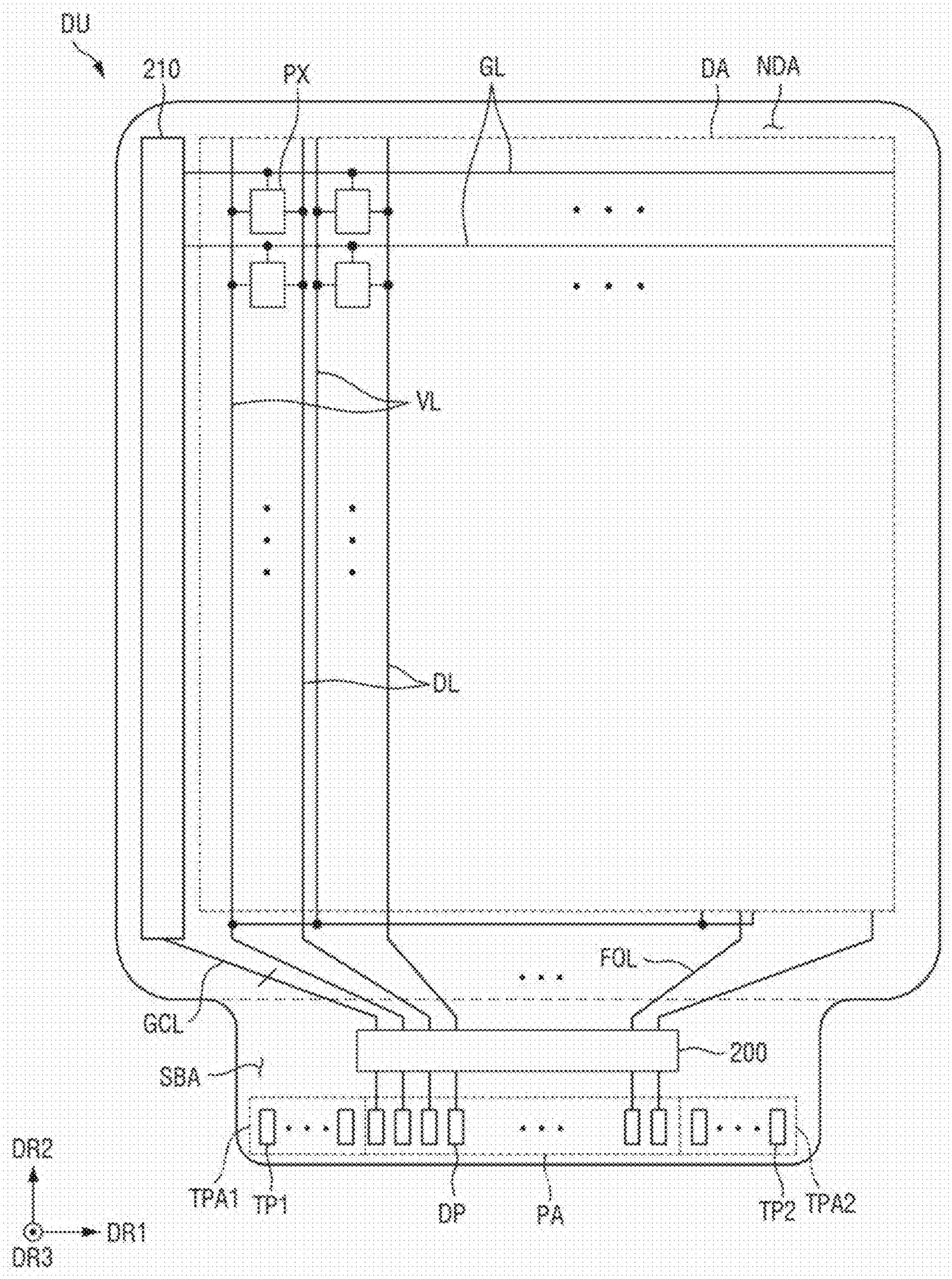
FIG. 4 is a plan view of a display layer of the display device of FIG. 2 according to an embodiment of the present disclosure.

FIG. 4 is a plan view of the display layer of the display device of FIG. 2.

Referring to FIG. 4, the display layer DU may include the display area DA and the non-display area NDA.

In an embodiment, the display area DA may be disposed in the middle of the display panel 100 (e.g., in the first and second directions DR1, DR2). A plurality of pixels PX, a plurality of gate lines GL, a plurality of data lines DL, and a plurality of power supply lines VL may be disposed in the display area DA. The pixels PX may be defined as minimal units for emitting light.

The gate lines GL may provide gate signals received from the gate driving unit 210 to the pixels PX. The gate lines GL may extend in the first direction DR1 and may be spaced apart from one another in the second direction DR2, which intersects the first direction DR1. For example, in an embodiment the first, second and third directions DR1, DR2, DR3 are perpendicular to each other. However, embodiments of the present disclosure are not necessarily limited thereto and the first to third directions DR1, DR2, DR3 may cross each other at various different angles.

The data lines DL may provide data voltages received from the display driving unit 200 to the pixels PX. The data lines DL may extend in the second direction DR2 and may be spaced apart from one another in the first direction DR1.

The power supply lines VL may provide the power supply voltages received from the display driving unit 200 to the pixels PX. In an embodiment, the power supply voltages include a driving voltage, an initialization voltage, a reference voltage, and/or a low-potential voltage. The power supply lines VL may extend in the second direction DR2 and may be spaced apart from one another in the first direction DR1.

The non-display area NDA may surround the display area DA. The gate driving unit 210, fan-out lines FOL, and gate control lines CGL may be disposed in the non-display area NDA. The gate driving unit 210 may generate a plurality of gate signals based on the gate control signals and may sequentially provide the gate signals to the gate lines GL in a predefined order.

The fan-out lines FOL may extend from the display driving unit 200 to the display area DA. The fan-out lines FOL may provide data voltages received from the display driving unit 200 to the data lines DL.

The gate control lines CGL may extend from the display driving unit 200 to the gate driving unit 210. The gate control lines GCL may provide gate control signals received from the display driving unit 200 to the gate driving unit 210.

In an embodiment, the sub-area SBA may include the display driving unit 200, a pad area PA, and a first touch area TPA1 and a second touch areas TPA2.

The display driving unit 200 may output signals and voltages for driving the display panel 100 to the fan-out lines FOL. The display driving unit 200 may provide data voltages to the data lines DL through the fan-out lines FOL. The data voltages may be provided to the pixels PX and may control the luminance of the pixels PX. The display driving unit 200 may provide gate control signals to the gate driving unit 210 through the gate control lines GCL.

The pad area PA, the first touch pad area TPA1 and the second touch pad area TPA2 may be disposed on an edge of the sub-area SBA. For example, in an embodiment shown in FIG. 4 the pad area PA, the first touch pad area TPA1 and the second touch pad area TPA2 are disposed on a lower edge of the sub-area SBA (e.g., in the second direction DR2). However, embodiments of the present disclosure are not necessarily limited thereto. In an embodiment, the pad area PA, the first touch pad area TPA1, and the second touch pad area TPA2 may be electrically connected to the circuit board 300 via an anisotropic conductive film (ACF) or a self-assembly anisotropic conductive paste (SAP).

The pad area PA may include a plurality of display pads DP. The display pads DP may be connected to a graphics system via the circuit board 300. The display pads DP may be connected to the circuit board 300 and may thus receive digital video data and provide the digital video data to the display driving unit 200.

Figure 5:
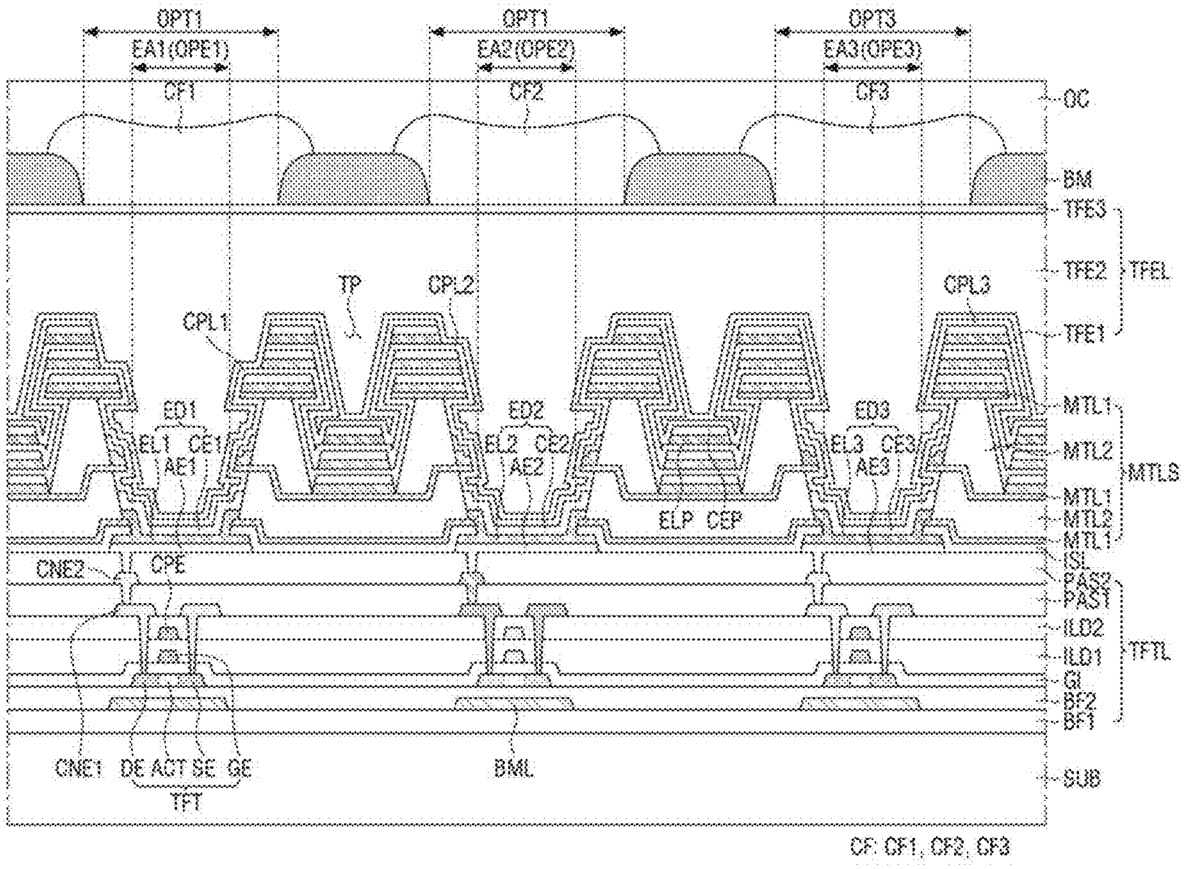
FIG. 5 is a cross-sectional view illustrating a portion of the display device of FIG. 2 according to an embodiment of the present disclosure.

FIG. 5 is a cross-sectional view of a portion of the display device of FIG. 2 and illustrates the substrate SUB, the TFT layer TFTL, the light-emitting element layer EML, the thin-film encapsulation layer TFEL, and the color filter layer CFL of the display layer DU.

Referring to FIG. 5, the display panel 100 of the display device 10 may include the display layer DU and the color filter layer CFL. The display layer DU may include the substrate SUB, the TFT layer TFTL, the light-emitting element layer EML, and the thin-film encapsulation layer TFEL. The display panel 100 may include a light-blocking layer BM, which is disposed on the thin-film encapsulation layer TFEL, and the color filters (CF1, CF2, and CF3) of the color filter layer CFL may be disposed on the light-blocking layer BM.

The substrate SUB may be a base substrate or a base member. In an embodiment, the substrate SUB may be a flexible substrate that is bendable, foldable, or rollable. For example, the substrate SUB may include a polymer resin such as PI. However, embodiments of the present disclosure are not necessarily limited thereto and the material of the substrate SUB may vary. For example, in some embodiments, the substrate SUB may include a glass or metal material.

In an embodiment, the TFT layer TFTL may include a first buffer layer BF1, a lower metal layer BML, a second buffer layer BF2, TFTs TFT, a gate insulating layer GI, a first interlayer insulating layer ILD1, capacitor electrodes CPE, a second interlayer insulating layer ILD2, first connecting electrodes CNE1, a first passivation layer PAS1, second connecting electrodes CNE2, and a second passivation layer PAS2.

The first buffer layer BF1 may be disposed on (e.g., disposed directly thereon) the substrate SUB. The first buffer layer BF1 may include an inorganic film capable of preventing the infiltration of the air or moisture. For example, in an embodiment the first buffer layer BF1 may include a plurality of inorganic films that are alternately stacked.

The lower metal layer BML may be disposed on the first buffer layer BF1 (e.g., disposed directly thereon).

The second buffer layer BF2 may cover the first buffer layer BF1 and the lower metal layer BML. The second buffer layer BF2 may include an inorganic film capable of preventing the infiltration of the air or moisture. For example, in an embodiment the second buffer layer BF2 may include a plurality of inorganic films that are alternately stacked.

The TFTs TFT may be disposed on the second buffer layer BF2 and may form the pixel circuitry of a plurality of pixels. For example, the TFTs TFT may be driving transistors or switching transistors. The TFTs TFT may include semiconductor layers ACT, source electrodes SE, drain electrodes DE, and gate electrodes GE.

The semiconductor layers ACT may be disposed on the second buffer layer BF2. The semiconductor layers ACT may overlap with the lower metal layer BML and the gate electrodes GE (e.g., in the third direction DR3) and may be insulated from the gate electrodes GE by the gate insulating layer GI. Portions of the semiconductor layers ACT may be transformed into conductors and may thus form the source electrodes SE and the drain electrodes DE.

The gate electrodes GE may be disposed on (e.g., disposed directly thereon) the gate insulating layer GI. The gate electrodes GE may overlap with the semiconductor layers ACT with the gate insulating layer GI interposed therebetween.

The gate insulating layer GI may be disposed on (e.g., disposed directly thereon) the semiconductor layers ACT. For example, the gate electrodes GE may cover the semiconductor layers ACT and the second buffer layer BF2 and may insulate the semiconductor layers ACT and the gate electrodes GE. The gate insulating layer GI may include contact holes that are penetrated by the first connecting electrodes CNE1.

A first interlayer insulating layer ILD1 may cover the gate electrodes GE and the gate insulating layer GI. The first interlayer insulating layer ILD1 may include contact holes that are penetrated by the first connecting electrodes CNE1. The contact holes of the first interlayer insulating layer ILD1 may be connected to the contact holes of the gate insulating layer GI and contact holes of a second interlayer insulating layer ILD2.

The capacitor electrodes CPE may be disposed on (e.g., disposed directly thereon) the first interlayer insulating layer ILD1. The capacitor electrodes CPE may overlap with the gate electrodes GE (e.g., in the third direction DR3). The capacitor electrodes CPE and the gate electrodes GE may form capacitors.

The second interlayer insulating layer ILD2 may cover the capacitor electrodes CPE and the first interlayer insulating layer ILD1. The second interlayer insulating layer ILD2 may include contact holes that are penetrated by the first connecting electrodes CNE1. The contact holes of the second interlayer insulating layer ILD2 may be connected to the contact holes of the first interlayer insulating layer ILD1 and the contact holes of the gate insulating layer GI.

The first connecting electrodes CNE1 may be disposed on (e.g., disposed directly thereon) the second interlayer insulating layer ILD2. The first connecting electrodes CNE1 may electrically connect the drain electrodes DE of the TFTs TFT and the second connecting electrodes CNE2. The first connecting electrodes CNE1 may be inserted in the contact holes of each of the second interlayer insulating layer ILD2, the first interlayer insulating layer ILD1, and the gate insulating layer GI and may thus be in direct contact with the drain electrodes DE of the TFTs TFT.

The first passivation layer PAS1 may cover the first connecting electrodes CNE1 and the second interlayer insulating layer ILD2. The first passivation layer PAS1 may protect the TFTs TFT. The first passivation layer PAS1 may include contact holes that are penetrated by the second connecting electrodes CNE2.

The second connecting electrodes CNE2 may be disposed on (e.g., disposed directly thereon) the first passivation layer PAS1. The second connecting electrodes CNE2 may electrically connect the first connecting electrodes CNE1 and pixel electrodes (e.g., AE1, AE2, and AE3) of light-emitting elements (e.g., ED1, ED2, and ED3). The second connecting electrodes CNE2 may be inserted in the contact holes of the first passivation layer PAS1 and may be in direct contact with the first connecting electrodes CNE1.

The second passivation layer PAS2 may cover the second connecting electrodes CNE2 and the first passivation layer PAS1. The second passivation layer PAS2 may include contact holes that are penetrated by the pixel electrodes (AE1, AE2, and AE3) of the light-emitting elements (ED1, ED2, and ED3).

The light-emitting element layer EML may be disposed on the TFT layer TFTL. The light-emitting element layer EML may include the light-emitting elements (e.g., ED1, ED2, and ED3) and a metal layer structure MTLS. The light-emitting elements (e.g., ED1, ED2, and ED3) may include the pixel electrodes (e.g., AE1, AE2, and AE3), light-emitting layers (e.g., EL1, EL2, and EL3), and common electrodes (e.g., CE1, CE2, and CE3).

Figure 6:
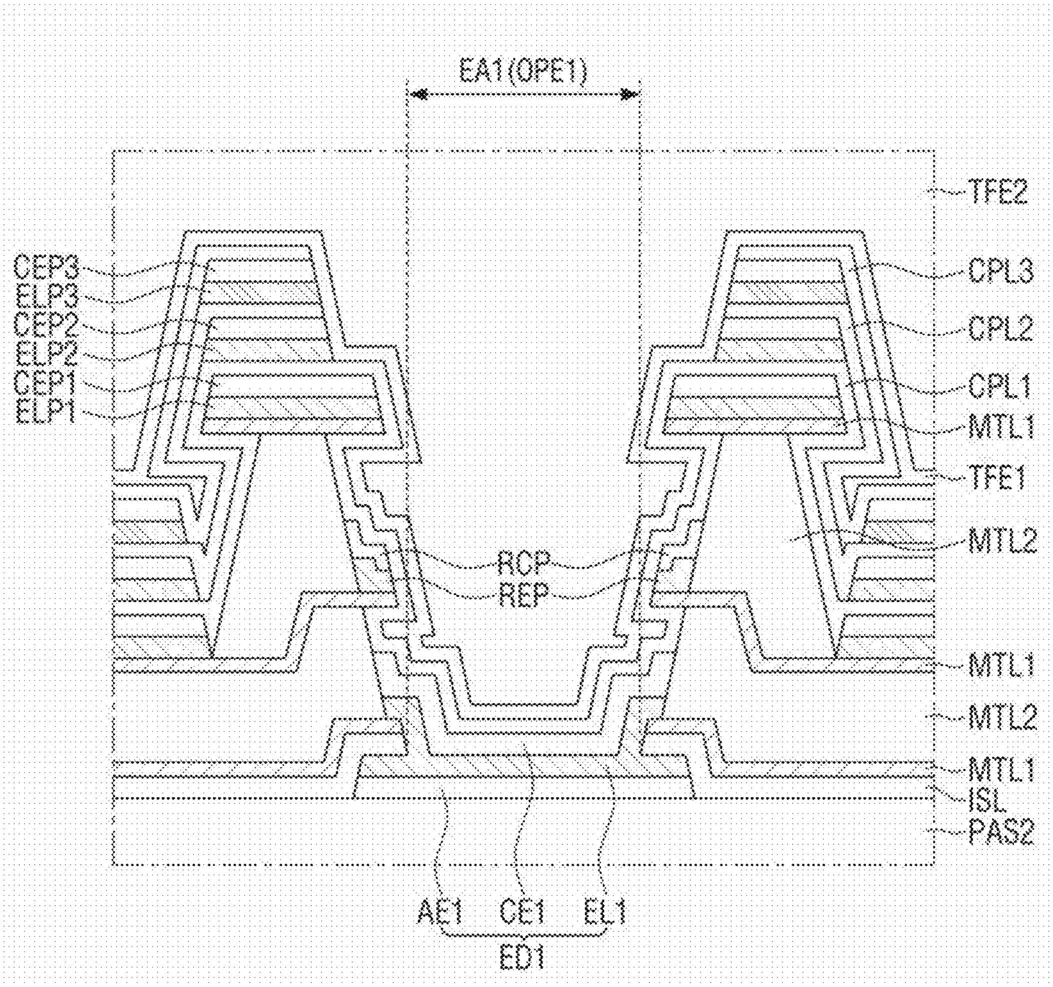
FIG. 6 is an enlarged cross-sectional view illustrating a first emission area of FIG. 5 according to an embodiment of the present disclosure.
Figure 7:
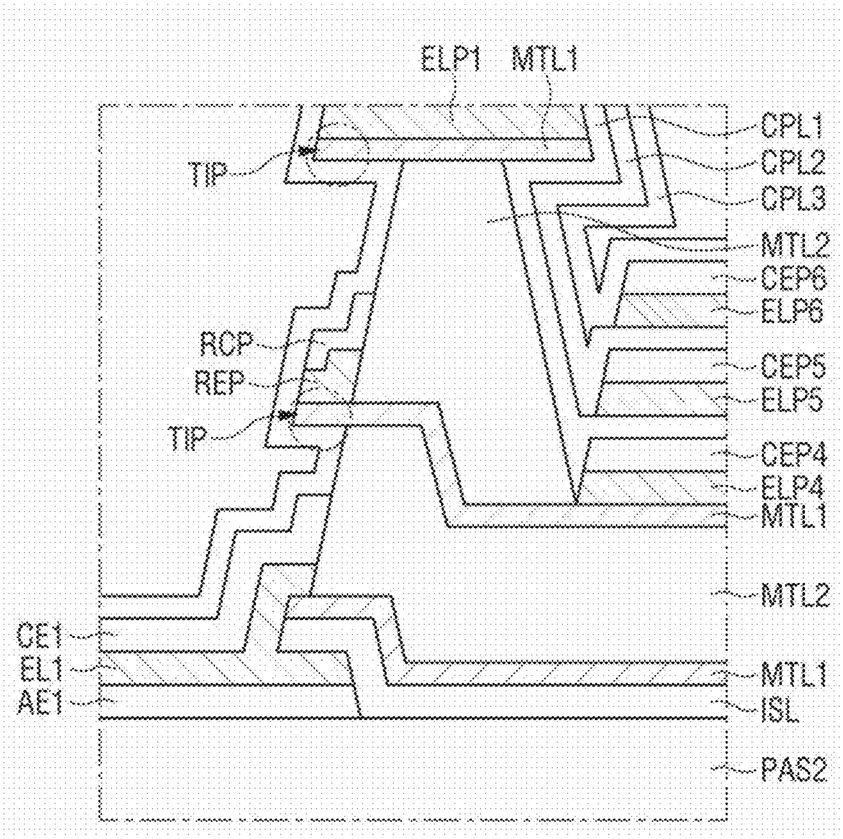
FIG. 7 is an enlarged cross-sectional view illustrating a portion of the first emission area of FIG. 6 where metal tips are formed according to an embodiment of the present disclosure.
Figure 8:
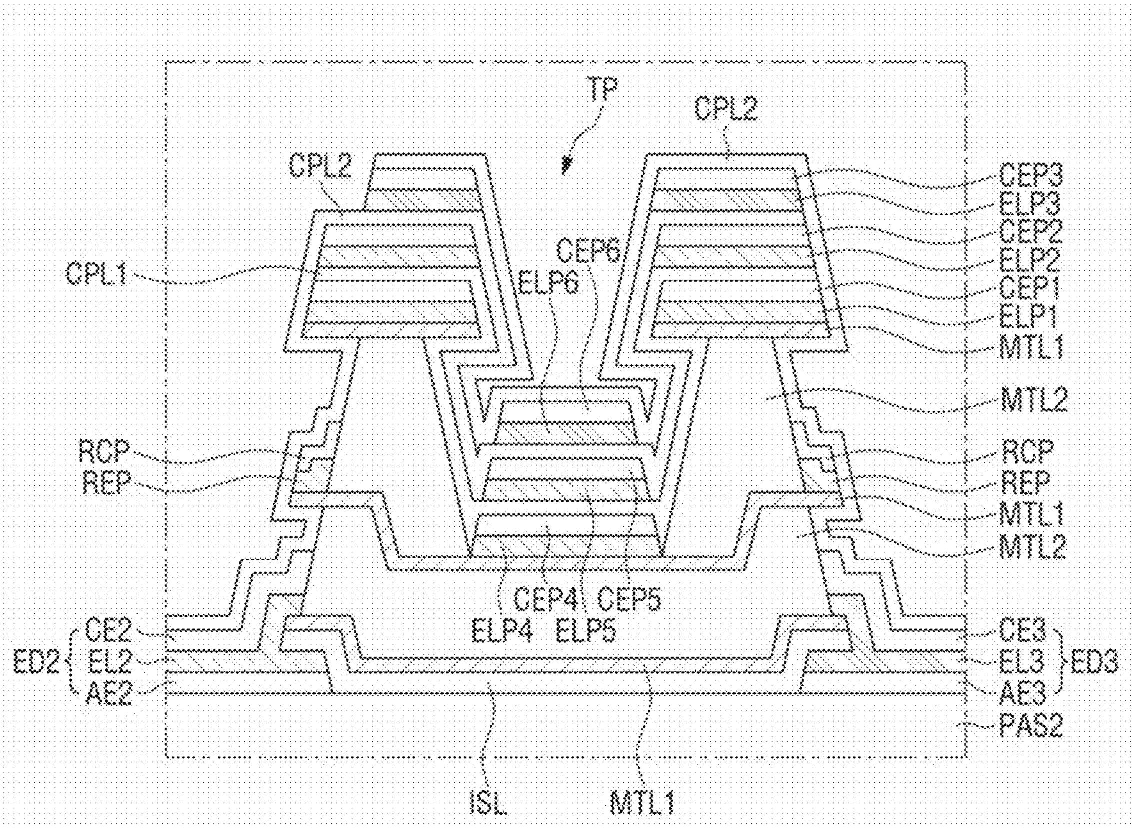
FIG. 8 is an enlarged cross-sectional view illustrating an area between second and third emission areas of FIG. 5 according to an embodiment of the present disclosure.

FIG. 6 is an enlarged cross-sectional view illustrating the first emission area EA1 of FIG. 5. FIG. 7 is an enlarged cross-sectional view illustrating a portion of the first emission area EA1 of FIG. 6 where metal tips are formed. FIG. 8 is an enlarged cross-sectional view illustrating an area between second and third emission areas of FIG. 5.

Referring to FIGS. 6 through 8 and further to FIG. 5, the display device 10 may include a plurality of emission areas, such as first to third emission areas EA1, EA2, and EA3, which are disposed in the display area DA. The emission areas may include first, second, and third emission areas EA1, EA2, and EA3, which emit different colors of light. However, embodiments of the present disclosure are not necessarily limited thereto and the numbers of the emission areas may vary. In an embodiment, the first, second, and third emission areas EA1, EA2, and EA3 may emit red light, green light, and blue light, respectively. However, embodiments of the present disclosure are not necessarily limited thereto and the color of light emitted by the emission areas may vary depending on the type of the light-emitting elements in the light-emitting element layer EML. For example, the first emission area EA1 may emit first-color light, which is red light, the second emission area EA2 may emit second-color light, which is green light, and the third emission area EA3 may emit third-color light, which is blue light. However, embodiments of the present disclosure are not necessarily limited thereto.

The first, second, and third emission areas EA1, EA2, and EA3 may be defined by a plurality of openings which are formed in the metal layer structure MTLS of the light-emitting element layer EML. For example, the first emission area EA1 may be defined by a first opening OPE1 of the metal layer structure MTLS, the second emission area EA2 may be defined by a second opening OPE2 of the metal layer structure MTLS, and the third emission area EA3 may be defined by a third opening OPE3 of the metal layer structure MTLS.

In an embodiment, the first, second, and third emission areas EA1, EA2, and EA3 may have the same size. For example, the first to third openings OPE1, OPE2, and OPE3 of the metal layer structure MTLS may have the same diameter, and the first, second, and third emission areas EA1, EA2, and EA3 may have the same size. However, embodiments of the present disclosure are not necessarily limited thereto. Alternatively, at least one of the first, second, and third emission areas EA1, EA2, and EA3 may have a different size than the other emission areas. For example, the second emission area EA2 may be larger in size than the first and third emission areas EA1 and EA3, and the third emission area EA3 may be larger in size than the first emission area EA1. The intensity of light emitted by the first to third emission areas EA1, EA2, and EA3 may vary depending on the size of the first to third emission areas EA1, EA2, and EA3, and screen colors displayed by the display device 10 or the electronic device 1 may be controlled by controlling the size of the first to third emission areas EA1, EA2, and EA3. FIG. 5 illustrates an embodiment in which the first, second, and third emission areas EA1, EA2, and EA3 have the same size. However, embodiments of the present disclosure are not necessarily limited thereto. The size of the first to third emission areas EA1, EA2, and EA3 may be freely controlled in accordance with the screen colors required by the display device 10 or the electronic device 1. Also, the size of the first to third emission areas EA1, EA2, and EA3 may be related to the efficiency and lifetime of the light-emitting elements ED and may have a trade-off relation with the reflection of external light. The size of the first to third emission areas EA1, EA2, and EA3 may be controlled in consideration of all the above.

In an embodiment of the display device 10, one first emission area EA1, one second emission area EA2, and one third emission area EA3, which are disposed adjacent to one another, may form a single pixel group. One pixel group may include emission areas, such as the first to third emission areas EA1, EA2, and EA3 emitting different colors of light and may thus be able to display white gradation. However, embodiments of the present disclosure are not necessarily limited thereto. For example, the combination of the emission areas, such as the first to third emission areas EA1, EA2, and EA3 forming each pixel group may vary depending on the layout of the emission areas and the colors of light emitted from the emission areas.

The display device 10 may include a plurality of light-emitting elements which are disposed in different emission areas. The light-emitting elements may include first, second, and third light-emitting elements ED1, ED2, and ED3, which are disposed in the first, second, and third emission areas ED1, ED2, and ED3, respectively. The light-emitting elements, such as the first to third light-emitting elements ED1, ED2, and ED3 may include the pixel electrodes, such as first to third pixel electrodes AE1, AE2, and AE3, the light-emitting layers, such as first to third light-emitting layers EL1, EL2, and EL3, and the common electrodes, such as the first to third common electrodes CE1, CE2, and CE3 and may emit different colors of light depending on the material of the light-emitting layers. For example, the first light-emitting element ED1, which is disposed in the first emission area EA1, may emit the first-color light, such as red light, the second light-emitting element ED2, which is disposed in the second emission area EA2, may emit the second-color light, such as green light, and the third light-emitting element ED3, which is disposed in the third emission area EA3, may emit the third-color light, such as blue light. The first, second, and third emission areas EA1, EA2, and EA3, which form one pixel together, may include the first, second, and third light-emitting elements ED1, ED2, and ED3, respectively, which emit different colors of light, and may thus be able to display white gradation.

The pixel electrodes, such as the first to third pixel electrodes AE1, AE2, and AE3 may be disposed on (e.g., disposed directly thereon) the second passivation layer PAS2. The pixel electrodes, such as the first to third pixel electrodes AE1, AE2, and AE3 may be disposed to overlap with first, second, and third openings OPE1, OPE2 and OPE3 of a pixel-defining film PDL. The first to third pixel electrodes AE1, AE2, and AE3 may be electrically connected to the drain electrodes DE of the TFTs TFT via the first connecting electrodes CNE1 and the second connecting electrodes CNE2.

In an embodiment, the display device 10 may include the first to third pixel electrodes AE1, AE2, and AE3, which are disposed in the first to third emission areas EA1, EA2, and EA3. The pixel electrodes may include a first pixel electrode AE1, which is disposed in the first emission area EA1, a second pixel electrode AE2, which is disposed in the second emission area EA2, and a third pixel electrode AE3, which is disposed in the third emission area EA3. The first, second, and third pixel electrodes AE1, AE2, and AE3 may be spaced apart from one another on the second passivation layer PAS2. The pixel electrodes, such as the first to third pixel electrodes AE1, AE2, and AE3, may be disposed in different emission areas, such as the first to third emission areas EA1, EA2, and EA3, and may thus form light-emitting elements, such as the first to third light-emitting elements ED1, ED2, and ED3 emitting different colors of light.

An inorganic insulating layer ISL may be disposed on (e.g., disposed directly thereon) the second passivation layer PAS2 and the first to third pixel electrodes AE1, AE2, and AE3. The inorganic insulating layer ISL may be disposed on the entire second passivation layer PAS2 and may partially overlap with the first to third pixel electrodes AE1, AE2, and AE3 to expose portions of the top surfaces of the first to third pixel electrodes AE1, AE2, and AE3. The inorganic insulating layer ISL may expose the first to third pixel electrodes AE1, AE2, and AE3 in areas that overlap with the first to third openings OPE1, OPE2, and OPE3 of the metal layer structure MTLS, and the first to third light-emitting layers EL1, EL2, and EL3 may be disposed directly on the first to third pixel electrodes AE1, AE2, and AE3, respectively. The inorganic insulating layer ISL may include an inorganic insulating material. For example, in an embodiment the inorganic insulating layer ISL may include aluminum oxide, titanium oxide, tantalum oxide, hafnium oxide, zinc oxide, silicon oxide, silicon nitride, and/or silicon oxynitride.

The inorganic insulating layer ISL may be disposed on the first to third pixel electrodes AE1, AE2, and AE3, but may be spaced apart from the top surfaces of the first to third pixel electrodes AE1, AE2, and AE3. The inorganic insulating layer ISL may partially overlap with the first to third pixel electrodes AE1, AE2, and AE3, but may not be in direct contact with the top surfaces of the first to third pixel electrodes AE1, AE2, and AE3, and portions of the first to third light-emitting layers EL1, EL2, and EL3 of the first to third light-emitting elements ED1, ED2, and ED3 may be disposed between the inorganic insulating layer ISL and the first to third pixel electrodes AE1, AE2, and AE3. During the fabrication of the display device 10, a sacrificial layer ("SFL" of FIG. 9) may be disposed on the pixel electrodes (AE1, AE2, and AE3) before the formation of the inorganic insulating layer ISL. The inorganic insulating layer ISL may originally be disposed to cover a portion of the sacrificial layer SFL. Then, as the sacrificial layer SFL is removed, the inorganic insulating layer ISL may be spaced apart from the top surfaces of the first to third pixel electrodes AE1, AE2, and AE3. Thereafter, as the material for forming the first to third light-emitting layers EL1, EL2, and EL3 fills the gaps between the inorganic insulating layer ISL and the first to third pixel electrodes AE1, AE2, and AE3 during the deposition of the first to third light-emitting layers EL1, EL2, and EL3, the inorganic insulating layer ISL may be disposed in part on the first to third light-emitting layers EL1, EL2, and EL3. However, the inorganic insulating layer ISL may be in direct contact with the side surfaces of each of the first to third pixel electrodes AE1, AE2, and AE3.

The display device 10 may include the metal layer structure MTLS, which is disposed on the TFT layer TFTL or the substrate SUB and includes the first to third openings OPE1, OPE2, and OPE3. The metal layer structure MTLS may have a structure in which a plurality of metal layers, such as first and second metal layers MTL1 and MTL2, including different materials are sequentially stacked, and may include the first to third openings OPE1, OPE2, and OPE3, which form the first to third emission areas EA1, EA2, and EA3. The first to third light-emitting elements ED1, ED2, and ED3 of the display device 10 may be disposed to overlap with the first to third openings OPE1, OPE2, and OPE3 of the metal layer structure MTLS.

The metal layer structure MTLS may include a plurality of first metal layers MTL1 and a plurality of second metal layers MTL2, and the first metal layers MTL1 and the second metal layers MTL2 may be alternately stacked on the inorganic insulating layer ISL. However, embodiments of the present disclosure are not necessarily limited thereto and the number of the plurality of metal layers of the metal layer structure MTLS may vary. The first metal layers MTL1 and the second metal layers MTL2 may include different metal materials. The metal layer structure MTLS may have a structure in which the first metal layers MTL1 and the second metal layers MTL2 are alternately stacked with metal layers (e.g., the first metal layers MTL1) including the same material disposed as uppermost and lowermost layers of the metal layer structure MTLS. A second metal layer MTL2 may be disposed between each pair of adjacent metal layers including the same material, for example, between each pair of adjacent first metal layers MTL1. The metal layer structure MTLS in an embodiment shown in FIG. 5 is illustrated as including a total of five metal layers, such as three first metal layers MTL1 and two second metal layers MTL2. However, embodiments of the present disclosure are not necessarily limited thereto. For example, the metal layer structure MTLS may have a structure in which more than five metal layers are alternately stacked. However, the lowermost and uppermost layers of the metal layer structure MTLS may always be the first metal layers MTL1.

The metal layer structure MTLS may include metal tips TIP, which protrude from the first metal layers MTL1 beyond the second metal layers MTL2, in each of the first to third openings OPE1, OPE2, and OPE3. The side surfaces of each of the second metal layers MTL2 may be more inwardly recessed than the side surfaces of each of the first metal layers MTL1, in each of the first to third openings OPE1, OPE2, and OPE3. As the first metal layers MTL1 protrude beyond the second metal layers MTL2, in each of the first to third openings OPE1, OPE2, and OPE3, the inner sidewalls of each of the first to third openings OPE1, OPE2, and OPE3 of the metal layer structure MTLS may be uneven or rugged. Undercuts may be formed below the metal tips TIP.

The sidewall structure of the metal layer structure MTLS may be due to the first metal layers MTL1 and the second metal layers MTL2 including different materials that are etched at different rates during the etching of the first and second metal layers MTL1 and MTL2. In an embodiment, the first metal layers MTL1 may include a material that is etched slower than the second metal layers MTL2, and the second metal layers MTL2 may be more etched than the first metal layers MTL1 during the etching of the first and second metal layers MTL1 and MTL2 so that undercuts may be formed. The first metal layers MTL1 may include a metal material with low reflectance, and the second metal layers MTL2 may include a metal material with high electric conductivity. For example, in an embodiment the first metal layers MTL1 may include Ti, and the second metal layers MTL2 may include Al. The metal layer structure MTLS may have a Ti/Al/Ti/Al/Ti stack structure, and the metal tips TIP may be formed in Ti layers of the metal layer structure MTLS. The metal layer structure MTLS may include the first to third openings OPE1, OPE2, and OPE3, which form the first to third emission areas EA1, EA2, and EA3, and may be disposed to overlap with the light-blocking layer BM. The uppermost layer of the metal layer structure MTLS may include a material with low reflectance and may thus be able to reduce the reflection of external light. Also, the second metal layers MTL2 of the metal layer structure MTLS may be electrically connected to the first to third common electrodes CE1, CE2, and CE3 of the first to third light-emitting elements ED1, ED2, and ED3. The first to third light-emitting elements ED1, ED2, and ED3, which are disposed in the first to third emission areas EA1, EA2, and EA3, may not be directly connected to the first to third common electrodes CE1, CE2, and CE3, but may be electrically connected to the first to third common electrodes CE1, CE2, and CE3 through the second metal layers MTL2.

During the fabrication of the display device 10, mask processes may be needed to form a pixel-defining film, which forms the first to third emission areas EA1, EA2, and EA3, of an organic material and to form the first to third light-emitting layers EL1, EL2, and EL3 in the first to third emission areas EA1, EA2, and EA3. To perform the mask processes, the display device 10 may require a structure for mounting masks or an unnecessarily large-size non-display area NDA to control dispersion in accordance with the mask processes. If the mask processes are reduced, unnecessary components such as, for example, the structure for mounting masks, may not be provided in the display device 10, and the size of the non-display area NDA for the control of dispersion control can be minimized.

The display device 10 may include the metal layer structure MTLS, which forms the first to third light emitting areas EA1, EA2, and EA3, and the metal layer structure MTLS may be formed by deposition and etching processes, instead of a mask process. Also, as the metal layer structure MTLS includes the first metal layers MTL1 and the second metal layers MTL2, which include a different metal material from the first metal layers MTL1, the inner sidewalls of each of the first to third openings OPE1, OPE2, and OPE3 are rugged, and different layers can be formed separately in different emission areas of the first to third emission areas EA1, EA2, and EA3 through deposition. For example, even if the first to third light-emitting layers EL1, EL2, and EL3 and the first to third common electrodes CE1, CE2, and CE3 of the first to third light-emitting elements ED1, ED2, and ED3 are formed by a deposition process without the use of a mask, materials deposited may not be properly connected, but disconnected by the metal tips TIP of the first metal layers MTL1, which are formed on the inner sidewalls of each of the first to third openings OPE1, OPE2, and OPE3. After a material for forming a particular layer is formed on the entire surface of the display device 10, layers formed in undesignated areas may be etched away, and as a result, different layers can be formed separately in different emission areas of the first to third emission areas EA1, EA2, and EA3. Different light emitting devices of the first to third light emitting devices ED1, ED2, and ED3 can be formed in different emission areas of the first to third emission areas EA1, EA2, and EA3 through deposition and etching, without a requirement of a mask process. Accordingly, unnecessary components can be omitted from the display device, and the size of the non-display area NDA can be minimized.

The display device 10 may include trenches TP, which are formed in the metal layer structure MTLS and penetrate an uppermost first metal layer MTL1 and at least one second metal layer MTL2 of the metal layer structure MTLS. The trenches TP may be disposed in an area other than the first to third emission areas EA1, EA2, and EA3, such as in a non-emission area, and may not overlap with the first to third light-emitting elements ED1, ED2, and ED3. The trenches TP may penetrate the uppermost first metal layer MTL1 and at least one second metal layer MTL2 and may have a similar sidewall shape to the first to third openings OPE1, OPE2, and OPE3. For example, metal tips TIP may be formed from the first metal layers MTL1, on the sidewalls of each of the trenches TP, to protrude toward the inside of the trenches TP. Sidewalls of the second metal layers MTL2 that form the trenches TP may be more inwardly recessed than sidewalls of the first metal layers MTL1 that form the trenches TP. Undercuts may also be formed in each of the trenches TP of the metal layer structure MTLS, below metal tips TIP of the uppermost first metal layer MTL1.

As the first to third light-emitting layers EL1, EL2, and EL3 and the first to third common electrodes CE1, CE2, and CE3 of the first to third light-emitting elements ED1, ED2, and ED3 are formed by a deposition process that does not involve the use of a mask, the materials of the first to third light-emitting layers EL1, EL2, and EL3 and the first to third common electrodes CE1, CE2, and CE3 may be deposited in the first to third openings OPE1, OPE2, and OPE3 and the trenches TP of the metal layer structure MTLS. The materials deposited in the first to third openings OPE1, OPE2, and OPE3 may form the first to third light-emitting layers EL1, EL2, and EL3 and the first to third common electrodes CE1, CE2, and CE3, and the materials deposited in the trenches TP or on the metal layer structure MTLS may form organic patterns ELP or electrode patterns CEP. The organic patterns ELP or the electrode patterns CEP may be formed as traces from deposition and etching processes as performed during the fabrication of the display device 10. If the organic patterns ELP or the electrode patterns CEP are peeled off during the fabrication of the display device 10, the organic patterns ELP or the electrode patterns CEP may remain in the display device 10 as foreign materials.

To prevent this, the display device 10 may include the trenches TP, which penetrate portions of the metal layer structure MTLS, and patterns disposed in each of the trenches TP may be prevented from being peeled off due to the shape of the trenches TP. As the trenches TP have a rugged sidewall structure and each of the first metal layers MTL1 includes metal tips projected therefrom, the patterns disposed in each of the trenches TP may not be able to be peeled off during etching due to the shape of the trenches TP. For example, a plurality of capping layers, such as first to third capping layers CPL1, CPL2, and CPL3, which are disposed on the first to third light-emitting layers EL1, EL2, and EL3 and the first to third common electrodes CE1, CE2, and CE3, respectively, may be formed through chemical vapor deposition (CVD) to completely cover the metal layer structure MTLS and the outer surfaces of each of the light-emitting elements (ED1, ED2, and ED3), regardless of the presence of the undercuts formed by the first metal layers MTL1. As the first to third capping layers CPL1, CPL2, and CPL3 are formed below the metal tips TIP of each of the first metal layers MTL1 to cover the undercuts in the metal layer structure MTLS, the patterns disposed in each of the trenches TP can be prevented from being peeled off due to the structure of the metal tips TIP and the presence of the first to third capping layers CPL1, CPL2, and CPL3.

The display device 10 may include patterns that are traces formed from a deposition process or due to the shape of the metal layer structure MTLS. These patterns may be formed at the same time on the first to third light-emitting layers EL1, EL2, and EL3 and the first to third common electrodes CE1, CE2, and CE3 of the first to third light-emitting elements ED1, ED2, and ED3 and may remain on the metal layer structure MTLS. These patterns and the structures of the first to third light-emitting layers EL1, EL2, and EL3 and the first to third common electrodes CE1, CE2, and CE3 will hereinafter be described.

The first to third light-emitting layers EL1, EL2, and EL3 may be disposed on the first to third pixel electrodes AE1, AE2, and AE3, respectively. The first to third light-emitting layers EL1, EL2, and EL3 may be organic light-emitting layers formed of an organic material and may be formed on the first to third pixel electrodes AE1, AE2, and AE3 through deposition. The first to third light-emitting layers EL1, EL2, and EL3 may apply a predetermined voltage to the first to third pixel electrodes AE1, AE2, and AE3 of the first to third light-emitting elements ED1, ED2, and ED3, and when the first to third common electrodes CE1, CE2, and CE3 of the first to third light-emitting elements ED1, ED2, and ED3 receive a common voltage or a cathode voltage, holes and electrons may move to the first to third light-emitting elements ED1, ED2, and ED3 through a hole transport layer and an electron transport layer and may combine together in the first to third light-emitting layers EL1, EL2, and EL3 to emit light.

The first to third light-emitting layers EL1, EL2, and EL3 are disposed in different emission areas, such as the first to third emission areas EA1, EA2, and EA3, respectively. The first light-emitting layer EL1 may be disposed on the first pixel electrode AE1, in the first emission area EA1, the second light-emitting layer EL2 may be disposed on the second pixel electrode AE1, in the second emission area EA2, and the third light-emitting layer EL3 may be disposed on the third pixel electrode AE3, in the third emission area EA3. The first, second, and third light-emitting layers EL1, EL2, and EL3 may be the light-emitting layers of the first, second, and third light-emitting elements ED1, ED2, and ED3. The first light-emitting layer EL1 may be a light-emitting layer emitting the first-color light, such as red light, the second light-emitting layer EL2 may be a light-emitting layer emitting the second-color light, such as green light, and the third light-emitting layer EL3 may be a light-emitting layer emitting the third-color light, such as blue light.

Portions of the first to third light-emitting layers EL1, EL2, and EL3 of the first to third light-emitting elements ED1, ED2, and ED3 may be disposed between the first to third pixel electrodes AE1, AE2, and AE3 and the inorganic insulating layer ISL (e.g., in the third direction DR3). The inorganic insulating layer ISL may be disposed on the first to third pixel electrodes AE1, AE2, and AE3 and may be spaced apart from the top surfaces of the first to third pixel electrodes AE1, AE2, and AE3. In an embodiment, the first to third light-emitting layers EL1, EL2, and EL3 may be formed by depositing the material of the first to third light-emitting layers EL1, EL2, and EL3 diagonally, rather than perpendicularly, with respect to the top surface of the substrate SUB. As a result, the first to third light-emitting layers EL1, EL2, and EL3 may be disposed on portions of the top surfaces of the first to third pixel electrodes AE1, AE2, and AE3, exposed by the first to third openings OPE1, OPE2, and OPE3 of the metal layer structure MTLS to fill the gaps between the inorganic insulating layer ISL and the top surfaces of the first to third pixel electrodes AE1, AE2, and AE3.

Also, parts of the first to third light-emitting layers EL1, EL2, and EL3 may be disposed on (e.g., directly disposed thereon) the top surface and side surface of a lowermost first metal layer MTL1 and the side surfaces of a lowermost second metal layer MTL2 directly above the lowermost first metal layer MTL1. As the first to third light-emitting layers EL1, EL2, and EL3 are formed by a deposition process, the first to third light-emitting layers EL1, EL2, and EL3 may be disposed on the metal tips TIP of the lowermost first metal layer MTL1 and the side surfaces of the lowermost second metal layer MTL2, where undercuts are formed. The first to third light-emitting layers EL1, EL2, and EL3 may be in direct contact with the top surface and side surface of the lowermost first metal layer MTL1 and at least a portion of the side surfaces of the lowermost second metal layer MTL2.

The display device 10 may include residual organic patterns REP, which include the same material as the first to third light-emitting layers EL1, EL2, and EL3 and are disposed on the metal layer structure MTLS, and a plurality of organic patterns ELP. The first to third light-emitting layers EL1, EL2, and EL3 may be formed by depositing a material for forming the first to third light-emitting layers EL1, EL2, and EL3 on the entire surface of the display device 10. For example, the material for forming the first to third light-emitting layers EL1, EL2, and EL3 may be deposited not only in the first to third openings OPE1, OPE2, and OPE3 of the metal layer structure MTLS, but also on the metal layer structure MTLS.

For example, the display device 10 may include the residual organic patterns REP, which are disposed on (e.g., disposed directly thereon) the metal tips TIP of the metal layer structure MTLS. The residual organic patterns REP may be disposed below undercuts formed by the metal tips TIP of the uppermost first metal layer MTL1 and on the metal tips TIP of a middle first metal layer MTL1 between two adjacent second metal layers MTL2. Portions of the residual organic patterns REP may be disposed directly on the metal tips TIP of the middle first metal layers MTL1, and portions of the residual organic patterns REP may be in direct contact with the side surfaces of the lowermost second metal layer MTL2. Residual organic patterns REP in the first emission area EA1 or the first opening OPE1 may include the same material as the first light-emitting layer EL1 of the first light-emitting element ED1. Residual organic patterns REP in the second emission area EA2 or the second opening OPE2 may include the same material as the second light-emitting layer EL2 of the second light-emitting element ED2. Residual organic patterns REP in the third emission area EA3 or the third opening OPE3 may include the same material as the third light-emitting layer EL3 of the third light-emitting element ED3.

The display device 10 may include the organic patterns ELP, which are disposed on the metal layer structure MTLS or in each of the trenches TP of the metal layer structure MTLS. The organic patterns ELP may include first organic patterns ELP1, second organic patterns ELP2, and third organic patterns ELP3, which are disposed on the uppermost first metal layer MTL1 of the metal layer structure MTLS, and fourth organic patterns ELP4, fifth organic patterns ELP5, and sixth organic patterns ELP6, which are formed in the trenches TP. The first organic patterns ELP1, the second organic patterns ELP2, and the third organic patterns ELP3 may be sequentially stacked on the uppermost first metal layer MTL1 of the metal layer structure MTLS, and the fourth organic patterns ELP4, the fifth organic patterns ELP5, and the sixth organic patterns ELP6 may be sequentially stacked in each of the trenches TP of the metal layer structure MTLS. The organic patterns ELP may not be in direct contact with each other, and other layers may be further disposed between the organic patterns ELP (e.g., in the third direction DR3).

In an embodiment, the first organic patterns ELP1 and the fourth organic patterns ELP4 may include the same material as the first light-emitting layer EL1 of the first light-emitting element ED1. The second organic patterns ELP2 and the fifth organic patterns ELP5 may include the same material as the second light-emitting layer EL2 of the second light-emitting element ED2. The third organic patterns ELP3 and the sixth organic patterns ELP6 may include the same material as the third light-emitting layer EL3 of the third light-emitting element ED3. The organic patterns ELP may include the same material as, and may thus be formed by the same processes as, their respective light-emitting layers.

The second organic patterns ELP2 and the third organic patterns ELP3 are illustrated as being sequentially disposed on the first organic patterns ELP1, and the fifth organic patterns ELP5 and the sixth organic patterns ELP6 are illustrated as being sequentially disposed on the fourth organic patterns ELP4. The order in which the organic patterns ELP are stacked may be the same as the order in which the first to third light-emitting layers EL1, EL2, and EL3 of the first to third light-emitting elements ED1, ED2, and ED3 are formed. For example, if the first, second, and third light-emitting layers EL1, EL2, and EL3 are sequentially formed, the second organic patterns ELP2 and the third organic patterns ELP3 may be sequentially disposed on the first organic patterns ELP1, and the fifth organic patterns ELP5 and the sixth organic patterns ELP6 may be sequentially disposed on the fourth organic patterns ELP4. However, embodiments of the present disclosure are not necessarily limited thereto. For example, the order in which the first to third light-emitting layers EL1, EL2, and EL3 of the first to third light-emitting elements ED1, ED2, and ED3 are formed may vary, and as a result, the order in which in which the organic patterns ELP are stacked may vary accordingly.

The residual organic patterns REP and the organic patterns ELP may be traces of deposited materials that are disconnected between different areas since the metal layer structure MTLS includes the metal tips TIP. The first to third light-emitting layers EL1, EL2, and EL3 and the residual organic patterns REP may be disconnected due to the presence of the metal tips TIP on the sidewalls of each of the first to third openings OPE1, OPE2, and OPE3. The organic patterns ELP may also be disconnected due to the presence of the trenches TP and the metal tips TIP on the sidewalls of each of the trenches TP. The first to third light-emitting layers EL1, EL2, and EL3 can be formed in different areas separately by a deposition process that does not involve the use of a mask, due to the presence of the metal tips TIP of the metal layer structure MTLS.

The first to third common electrodes CE1, CE2, and CE3 may be disposed on the first to third light-emitting layers EL1, EL2, and EL3. The first to third common electrodes CE1, CE2, and CE3 may include a transparent conductive material and may thus output light generated by the first to third light-emitting layers EL1, EL2, and EL3. The first to third common electrodes CE1, CE2, and CE3 may receive a common voltage or a low-potential voltage. As the first to third pixel electrodes AE1, AE2, and AE3 receive a voltage corresponding to a data voltage and the first to third common electrodes CE1, CE2, and CE3 receive a low-potential voltage, the difference in electric potential is formed between the first to third pixel electrodes AE1, AE2, and AE3 and the first to third common electrodes CE1, CE2, and CE3, and as a result, the first to third light-emitting layers EL1, EL2, and EL3 may emit light.

In an embodiment, the common electrode may include first, second, and third common electrodes CE1, CE2, and CE3, which are disposed in different emission areas, such as the first to third emission areas EA1, EA2, and EA3. The first common electrode CE1 may be disposed on the first light-emitting layer EL1, in the first emission area EA1, the second common electrode CE2 may be disposed on the second light-emitting layer EL2, in the second emission area EA2, and the third common electrode CE3 may be disposed on the third light-emitting layer EL3, in the third emission area EA3.

Portions of the first to third common electrodes CE1, CE2, and CE3 of the first to third light-emitting elements ED1, ED2, and ED3 may be disposed on the top surface and side surface of the lowermost first metal layer MTL1 and at least a portion of the side surfaces of the lowermost second metal layer MTL2. In an embodiment, the first to third common electrodes CE1, CE2, and CE3, like the first to third light-emitting layers EL1, EL2, and EL3, may be formed by a deposition process. The first to third common electrodes CE1, CE2, and CE3 may be formed by depositing an electrode material diagonally, rather than perpendicularly, with respect to the top surface of the substrate SUB. As a result, the first to third common electrodes CE1, CE2, and CE3 may be disposed on the metal tips TIP of the lowermost first metal layer MTL1 and the side surfaces of the lowermost second metal layer MTL2 where undercuts are formed. The first to third common electrodes CE1, CE2, and CE3 may be in direct contact with the top surface of the lowermost first metal layer MTL1 and the side surfaces of the lowermost second metal layer MTL2. In an embodiment, the first to third common electrodes CE1, CE2, and CE3, which are of different light-emitting elements, may be in direct contact with the second metal layers MTL2 of the metal layer structure MTLS, and may be electrically connected to one another thereby. The first to third common electrodes CE1, CE2, and CE3, unlike the first to third pixel electrodes AE1, AE2, and AE3, may not be separate between a plurality of pixels, but may be implemented as an electrode electrically in common for all the pixels.

The contact areas of the first to third common electrodes CE1, CE2, and CE3 and the side surfaces of the lower second metal layer MTL2 may be greater than the contact areas of the first to third light-emitting layers EL1, EL2, and EL3 and the side surfaces of the lowermost second metal layer MTL2. The deposition of the first to third common electrodes CE1, CE2, and CE3 (or the light-emitting layers) may be performed diagonally, rather than perpendicularly, with respect to the top surface of the substrate SUB, and the contact areas of the first to third common electrodes (CE1, CE2, and CE3) (or the light-emitting layers) and the side surfaces of the lowermost second metal layer MTL2 may vary depending on the angle at which the deposition of the first to third common electrodes CE1, CE2, and CE3 (or the light-emitting layers) is performed. In an embodiment, the deposition of the first to third common electrodes CE1, CE2, and CE3 may be performed at a greater inclination than the deposition of the first to third light-emitting layers EL1, EL2, and EL3. The first to third common electrodes CE1, CE2, and CE3 may have a larger area and may be positioned at a higher position than the first to third light-emitting layers EL1, EL2, and EL3, on the sidewalls of each of the first to third openings OPEL, OPE2, and OPE3. As the first to third common electrodes CE1, CE2, and CE3, which are of different light-emitting elements, are electrically connected to one another via the lowermost second metal layer MTL2, the first to third common electrodes CE1, CE2, and CE3 may preferably be in direct contact with a relatively large area of the lowermost second metal layer MTL2.

The display device 10 may include residual electrode patterns RCP, which include the same material as the first to third common electrodes CE1, CE2, and CE3 and are disposed on the metal layer structure MTLS, and the electrode patterns CEP. As the first to third common electrodes CE1, CE2, and CE3 are formed by depositing an electrode material on the entire surface of the display device 10, the electrode material may be deposited not only in the first to third openings OPE1, OPE2, and OPE3 of the metal layer structure MTLS, but also on the metal layer structure MTLS.

For example, the display device 10 may include the residual electrode patterns RCP, which are disposed on the metal tips TIP of the metal layer structure MTLS, in each of the first to third openings OPE1, OPE2, and OPE3. The residual electrode patterns RCP may be disposed below the undercuts formed by the metal tips TIP of the uppermost first metal layer MTL1 and on the residual organic patterns REP and the metal tips TIP of the middle first metal layer MTL1. Portions of the residual electrode patterns RCP may be disposed directly on the residual organic patterns REP and may be in direct contact with the side surfaces of the second metal layer MTL2.

The display device 10 may include the electrode patterns CEP, which are disposed on the metal layer structure MTLS or in the trenches TP of the metal layer structure MTLS. The electrode patterns CEP may include first electrode patterns CEP1, second electrode patterns CEP2, and third electrode patterns CEP3, which are disposed on the uppermost first metal layer MTL1 of the metal layer structure MTLS, and fourth electrode patterns CEP4, fifth electrode patterns CEP5, and sixth electrode patterns CEP6, which are disposed in each of the trenches TP. The first electrode patterns CEP1, the second electrode patterns CEP2, and the third electrode patterns CEP3 may be sequentially stacked on the uppermost first metal layer MTL1, and the fourth electrode patterns CEP4, the fifth electrode patterns CEP5, and the sixth electrode patterns CEP6 may be sequentially stacked in the trenches TP of the metal layer structure MTLS. The electrode patterns CEP may not be in direct contact with one another, and other layers may be further disposed between the electrode patterns CEP.

For example, the first electrode patterns CEP1, the second electrode patterns CEP2, and the third electrode patterns CEP3 may be disposed on the first organic patterns ELP1, the second organic patterns ELP2, and the third organic patterns ELP3, respectively, and the fourth electrode patterns CEP4, the fifth electrode patterns CEP5, and the sixth electrode patterns CEP6 may be disposed on the fourth organic patterns ELP4, the fifth organic patterns ELP5, and the sixth organic patterns ELP6, respectively. The layout of the electrode patterns CEP and the organic patterns ELP may be similar to the layout of the first to third light-emitting layers EL1, EL2, and EL3 and the first to third common electrodes CE1, CE2, and CE3. The residual electrode patterns RCP and the electrode patterns CEP may be traces of deposited materials that are disconnected between different areas, because the metal layer structure MTLS includes the metal tips TIP. The first to third common electrodes CE1, CE2, and CE3 can be formed in different areas separately by a deposition process that does not involve the use of a mask, due to the presence of the metal tips TIP of the metal layer structure MTLS.

The organic patterns ELP and the electrode patterns CEP may be disposed on the metal layer structure MTLS to surround the first to third emission areas EA1, EA2, and EA3 or the first to third openings OPE1, OPE2, and OPE3. In an embodiment, the organic patterns ELP and the electrode patterns CEP may be partially etched during the fabrication of the display device 10, and as a result, the shape of the structure in which the organic patterns ELP and the electrode patterns CEP are stacked around each of the first to third emission areas EA1, EA2, and EA3 may change.

For example, side surfaces of a second organic pattern ELP2, a second electrode pattern CEP2, a third organic pattern ELP3, and a third electrode pattern CEP3 that are disposed around the first emission area EA1 may be more recessed than side surfaces of a first organic pattern ELP1 and a first electrode pattern CEP1 that are disposed around the first emission area EA1, in a direction toward the first opening OPE1. The width of the second organic pattern ELP2, the second electrode pattern CEP2, the third organic pattern ELP3, and the third electrode pattern CEP3 that are disposed around the first emission area EA1 may be less than the width of the first organic pattern ELP1 and the first electrode pattern CEP1 that are disposed around the first emission area EA1. However, embodiments of the present disclosure are not necessarily limited thereto. For example, in an embodiment, the width of the second organic pattern ELP2, the second electrode pattern CEP2, the third organic pattern ELP3, and the third electrode pattern CEP3 that are disposed around the first emission area EA1 may be less than the width of a second organic pattern ELP2, a second electrode pattern CEP2, a third organic pattern ELP3, and a third electrode pattern CEP3 that are disposed around the second or third emission area EA2 or EA3.

Side surfaces of the third organic pattern ELP3 and the third electrode pattern CEP3 that are disposed around the second emission area EA2 may be more recessed than side surfaces of a first organic pattern ELP1, a first electrode pattern CEP1, the second organic pattern ELP2, and the second electrode pattern CEP2 that are disposed around the second emission area EA2, in a direction toward the second opening OPE2. The width of the third organic pattern ELP3 and the third electrode pattern CEP3 that are disposed around the second emission area EA2 may be less than the width of the first organic pattern ELP1, the first electrode pattern CEP1, the second organic pattern ELP2, and the second electrode pattern CEP2 that are disposed around the second emission area EA2. However, embodiments of the present disclosure are not necessarily limited thereto. For example, in an embodiment the width of the third organic pattern ELP3 and the third electrode pattern CEP3 that are disposed around the second emission area EA2 may be less than the width of the third organic pattern ELP3 and the third electrode pattern Cep3 that are disposed around the third emission area EA3.

The side surfaces of the first, second, and third organic patterns ELP1, ELP2, and ELP3 that are disposed around the third emission area EA3 and the side surfaces of the first, second, and third electrode patterns CEP1, CEP2, and CEP3 that are disposed around the third emission area EA3 may be parallel to one another. The first, second, and third organic patterns ELP1, ELP2, and ELP3 that are disposed around the third emission area EA3 may have substantially the same width, and the first, second, and third electrode patterns CEP1, CEP2, and CEP3 that are disposed around the third emission area EA3 may have substantially the same width.

The shape of the first, second, and third organic patterns ELP1, ELP2, and ELP3 that are disposed around each of the first to third emission areas EA1, EA2, and EA3 and the shape of the first, second, and third electrode patterns CEP1, CEP2, and CEP3 that are disposed around each of the first to third emission areas EA1, EA2, and EA3 may vary depending on how etching processes are performed during the fabrication of the display device 10. The order in which the first organic patterns ELP1, the second organic patterns ELP2, the third organic patterns ELP3, the first electrode patterns CEP1, the second electrode patterns CEP2, and the third electrode patterns CEP3 are stacked may vary depending on the order in which the first to third light-emitting elements ED1, ED2, and ED3 are formed, and the first organic patterns ELP1, the second organic patterns ELP2, the third organic patterns ELP3, the first electrode patterns CEP1, the second electrode patterns CEP2, and the third electrode patterns CEP3 may be partially removed during the removal of patterns formed in undesignated areas. For example, the second and third light-emitting elements ED2 and ED3 may be formed after the formation of the first light-emitting element ED1, and the material of the second and third light-emitting elements ED2 and ED3 may remain in the first emission area EA1. The portions of the second organic pattern ELP2, the second organic pattern CEP2, the third organic pattern ELP3, and the third electrode pattern CEP3 may then be removed in the process of etching away the second and third light-emitting elements ED2 and ED3 from the first emission area EA1. Similarly, portions of the third organic pattern ELP3 and the third electrode pattern CEP3 that are disposed around the second emission area EA2 may also be removed. In an embodiment in which the third light-emitting element ED3 is formed after the formation of the first and second light-emitting elements ED1 and ED2, the shapes of the patterns formed around the third emission area EA3 may coincide with the shapes of their respective original counterparts and may be traces of deposition and etching processes for forming the first to third light-emitting elements ED1, ED2, and ED3 that do not involve the use of a mask. A deposition process of depositing the material for forming the first to third light-emitting elements ED1, ED2, and ED3 on the entire surface of the display device 10 and then an etching process of partially removing the deposited material may be performed, and the metal layer structure MTLS and a plurality of patterns may remain as traces of the deposition and etching processes.

The first, second, and third capping layers CPL1, CPL2, and CPL3 may be disposed on the first to third light-emitting elements ED1, ED2, and ED3, the plurality of patterns, and the metal layer structure MTLS. In an embodiment, the first, second, and third capping layers CPL1, CPL2, and CPL3 may include an inorganic insulating material and may cover the first to third light-emitting elements ED1, ED2, and ED3. The first, second, and third capping layers CPL1, CPL2, and CPL3 may prevent the first to third light-emitting elements ED1, ED2, and ED3 from being damaged by the air from the outside and may also prevent the patterns disposed on the metal layer structure MTLS from being peeled off during the fabrication of the display device 10. In an embodiment, the first, second, and third capping layers CPL1, CPL2, and CPL3 may include aluminum oxide, titanium oxide, tantalum oxide, hafnium oxide, zinc oxide, silicon oxide, silicon nitride, and/or silicon oxynitride. However, embodiments of the present disclosure are not necessarily limited thereto.

The first, second, and third capping layers CPL1, CPL2, and CPL3 may be disposed to cover the first to third light-emitting elements ED1, ED2, and ED3, the electrode patterns CEP, the organic patterns ELP, the residual organic patterns REP, and the residual electrode patterns RCP. As the first, second, and third capping layers CPL1, CPL2, and CPL3 may be formed by a CVD process, the first, second, and third capping layers CPL1, CPL2, and CPL3 may be formed to a uniform thickness along step differences therebelow. For example, the first, second, and third capping layers CPL1, CPL2, and CPL3 may be thinly formed below the undercuts formed by the metal tips TIP of the metal layer structure MTLS.

The first capping layer CPL1 may be disposed on the first light-emitting element ED1, the first electrode patterns CEP1, and the fourth electrode patterns CEP4. The first capping layer CPL1 may be disposed along the first light-emitting element ED1 and the inner sidewalls of the first opening OPE1 to cover the first light-emitting element ED1 and the inner sidewalls of the first opening OPE1 and may also cover the first electrode patterns CEP1 and the fourth electrode patterns CEP4. The second organic patterns ELP2 and the fifth organic patterns ELP5 may be disposed directly on the first capping layer CPL1. The first capping layer CPL1 may be disposed to cover the inner sidewalls of each of the trenches TP of the metal layer structure MTLS. The first capping layer CPL1 may be disposed on the entire metal layer structure MTLS except for the inner sidewalls of each of the second and third openings OPE2 and OPE3.

The second capping layer CPL2 may be disposed on the second light-emitting element ED2, the second electrode patterns CEP2, and the fifth electrode patterns CEP5. The second capping layer CPL2 may be disposed along the second light-emitting element ED2 and the inner sidewalls of the second opening OPE2 to cover the second light-emitting element ED2 and the inner sidewalls of the second opening OPE2 and may also cover the second electrode patterns CEP2 and the fifth electrode patterns CEP5. The third organic patterns ELP3 and the sixth organic patterns ELP6 may be disposed directly on the second capping layer CPL2. The second capping layer CPL2 may be disposed to cover the inner sidewalls of each of the trenches TP of the metal layer structure MTLS. Portions of the second capping layer CPL2 may be disposed directly on the first capping layer CPL1, in each of the trenches TP. The second capping layer CPL2 may be disposed on the entire metal layer structure MTLS except for the inner sidewalls of each of the first and third openings OPE1 and OPE3.

The third capping layer CPL3 may be disposed on the third light-emitting element ED3, the third electrode patterns CEP3, and the sixth electrode patterns CEP6. The third capping layer CPL3 may be disposed along the third light-emitting element ED3 and the inner sidewalls of the third opening OPE3 to cover the third light-emitting element ED3 and the inner sidewalls of the third opening OPE3 and may also cover the third electrode patterns CEP3 and the sixth electrode patterns CEP6. The third capping layer CPL3 may be disposed on the inner sidewalls of each of the trenches TP of the metal layer structure MTLS. Portions of the third capping layer CPL3 may be disposed directly on the second capping layer CPL2, in each of the trenches TP. The third capping layer CPL3 may be disposed on the entire metal layer structure MTLS except for the inner sidewalls of each of the first and second openings OPE1 and OPE2.

In an embodiment, the first capping layer CPL1 may be formed after the formation of the first common electrode CE1, the second capping layer CPL2 may be formed after the formation of the second common electrode CE2, and the third capping layer CPL3 may be formed after the formation of the third common electrode CE3. Accordingly, each of the first, second, and third capping layers CPL1, CPL2, and CPL3 may be disposed between different electrode patterns CEP and between different organic patterns ELP. The first, second, and third capping layers CPL1, CPL2, and CPL3 may be sequentially stacked, partially being in direct contact with one another in each of the trenches TP.

The thin-film encapsulation layer TFEL may be disposed on the first, second, and third capping layers CPL1, CPL2, and CPL3 to cover the first to third light-emitting elements ED1, ED2, and ED3 and the metal layer structure MTLS. In an embodiment, the thin-film encapsulation layer TFEL may include at least one inorganic film and may prevent the infiltration of oxygen or moisture into the light-emitting element layer EML. The thin film-encapsulation layer TFEL may also include at least one organic film and may protect the light-emitting element layer EML from a foreign material such as dust.

In an embodiment, the thin film-encapsulation layer TFEL may include first, second, and third encapsulation layers TFE1, TFE2, and TFE3. The first and third encapsulation layers TFE1 and TFE3 may be inorganic encapsulation layers, and the second encapsulation layer TFE2, which is disposed between the first and third encapsulation layers TFE1 and TFE3, may be an organic encapsulation layer.

The first and third encapsulation layers TFE1 and TFE3 may include an inorganic insulating material. In an embodiment, the inorganic insulating material may include aluminum oxide, titanium oxide, tantalum oxide, hafnium oxide, zinc oxide, silicon oxide, silicon nitride, and/or silicon oxynitride. However, embodiments of the present disclosure are not necessarily limited thereto.

The second encapsulation layer TFE2 may include a polymer material. In an embodiment, the polymer material may include an acrylic resin, an epoxy resin, polyimide, or polyethylene. The second encapsulation layer TFE2 may include an acrylic resin, for example, polymethyl methacrylate or polyacrylic acid. The second encapsulation layer TFE2 may be formed by curing a monomer or applying a polymer. However, embodiments of the present disclosure are not necessarily limited thereto.

The light-blocking layer BM may be disposed on the thin film-encapsulation layer TFEL. The light-blocking layer BM may include a plurality of holes, such as first to third holes OPT1, OPT2, and OPT3, which are disposed to overlap with the first to third emission areas EA1, EA2, and EA3, respectively. For example, a first hole OPT1 may be disposed to overlap with the first emission area EA1, a second hole OPT2 may be disposed to overlap with the second emission area EA2, and a third hole OPT3 may be disposed to overlap with the third emission area EA3. Each of the first to third holes OPT1, OPT2, and OPT3 may have a larger area or size than each of the first to third emission areas EA1, EA2, and EA3, which are defined by the metal layer structure MTLS. As the first to third holes OPT1, OPT2, and OPT3 of the light-blocking layer BM are formed to be larger in size than the first to third emission areas EA1, EA2, and EA3, light emitted from the first to third emission areas EA1, EA2, and EA3 can be visible to the user not only at the front, but also at the sides of the display device 10.

The light-blocking layer BM may include a light-absorbing material. For example, the light-blocking layer BM may include an inorganic black pigment or an organic black pigment. In an embodiment, the inorganic black pigment may be, but is not necessarily limited to, carbon black, and the organic black pigment may include, but is not necessarily limited to, at least one of lactam black, perylene black, and aniline black. The light-blocking layer BM can prevent visible light from infiltrating between the first, second, and third emission areas EA1, EA2, and EA3 to cause color mixing and can thus increase the color reproducibility of the display device 10.

The display device may include a plurality of color filters, such as first to third color filters CF1, CF2, and CF3, which are disposed on the first to third emission areas EA1, EA2, and EA3, respectively. The first to third color filters CF1, CF2, and CF3 may be disposed to correspond to the first to third emission areas EA1, EA2, and EA3. For example, the first to third color filters CF1, CF2, and CF3 may be disposed on the light-blocking layer BM, which includes the first to third holes OPT1, OPT2, and OPT3 that are disposed to correspond to the first to third emission areas EA1, EA2, and EA3. The first to third holes OPT1, OPT2, and OPT3 may be formed to overlap with the first to third emission areas EA1, EA2, and EA3 and the first to third openings OPE1, OPE2, and OPE3 of the metal layer structure MTLS and may form light-output areas that output light emitted by the first to third emission areas EA1, EA2, and EA3. The first to third color filters CF1, CF2, and CF3 may have a larger area than the first to third holes OPT1, OPT2, and OPT3 of the metal layer structure MTLS and may completely cover the light-output areas formed by the first to third holes OPT1, OPT2, and OPT3.

The color filters may include first, second, and third color filters CF1, CF2, and CF3. However, embodiments of the present disclosure are not necessarily limited thereto. The first to third color filters CF1, CF2, and CF3 may include a colorant such as a pigment or dye capable of absorbing all wavelengths of light except for a particular wavelength range and may be disposed to correspond to the colors of light emitted from the first to third emission areas EA1, EA2, and EA3. For example, the first color filter CF1 may be disposed to overlap with the first emission area EA1 and may be a red color filter capable of transmitting only red light therethrough, the second color filter CF2 may be disposed to overlap with the second emission area EA2 and may be a green color filter capable of transmitting only green light therethrough, and the third color filter CF3 may be disposed to overlap with the third emission area EA3 and may be a blue color filter capable of transmitting only blue light therethrough.

The first to third color filters CF1, CF2, and CF3 may be spaced apart from one another on the light-blocking layer BM. The first to third color filters CF1, CF2, and CF3 may have a larger area than the first to third holes OPT1, OPT2, and OPT3 of the light-blocking layer BM to cover the first to third holes OPT1, OPT2, and OPT3 of the light-blocking layer BM and to be spaced apart from one another on the light-blocking layer BM. However, embodiments of the present disclosure are not necessarily limited thereto. In an embodiment, the first to third color filters CF1, CF2, and CF3 may partially overlap with one another. Different first to third color filters CF1, CF2, and CF3 may overlap with one another on the light-blocking layer BM, which corresponds to an area not overlapping with the first to third emission areas EA1, EA2, and EA3. As the first to third color filters CF1, CF2, and CF3 are disposed to overlap with one another, the intensity of reflected light of external light can be reduced. Also, the color of reflected light of external light can be controlled by controlling the layout, the shape, and size of the first to third color filters CF1, CF2, and CF3.

The first to third color filters CF1, CF2, and CF3 of the color filter layer CFL may be disposed on (e.g., disposed directly thereon) the light-blocking layer BM. The first to third color filters CF1, CF2, and CF3 may be disposed to correspond to the first to third emission areas EA1, EA2, and EA3, the first to third openings OPE1, OPE2, and OPE3, and the first to third holes OPT1, OPT2, and OPT3. For example, the first color filter CF1 may be disposed to correspond to the first emission area EA1, the second color filter CF2 may be disposed to correspond to the second emission area EA2, and the third color filter CF3 may be disposed to correspond to the third emission area EA3. The first color filter CF1 may be disposed in the first hole OPT1 of the light-blocking layer BM, the second color filter CF2 may be disposed in the second hole OPT2 of the light-blocking layer BM, and the third color filter CF3 may be disposed in the third hole OPT3 of the light-blocking layer BM. The first to third color filters CF1, CF2, and CF3 may have a larger area than the first to third holes OPT1, OPT2, and OPT3 of the light-blocking layer BM, and portions of the first to third color filters CF1, CF2, and CF3 may be disposed directly on the light-blocking layer BM.

An overcoat layer OC may be disposed on (e.g., disposed directly thereon) the first to third color filters CF1, CF2, and CF3 may be disposed on the first to third color filters CF1, CF2, and CF3 and may planarize the tops of the first to third color filters CF1, CF2, and CF3. The overcoat layer OC may be a colorless light-transmitting layer not having a color in a visible wavelength range. For example, in an embodiment the overcoat layer OC may include a colorless light-transmitting organic material such as an acrylic resin. However, embodiments of the present disclosure are not necessarily limited thereto.

The fabrication of the display device 10 will hereinafter be described.

FIGS. 9 through 32 are cross-sectional views illustrating a method of fabricating a display device according to embodiments of the present disclosure. FIGS. 9 through 32 illustrate how to form the metal layer structure MTLS and the first to third light-emitting elements ED1, ED2, and ED3 of the light-emitting element layer EML, the thin-film encapsulation layer TFEL, and the color filter layer CFL. A detailed description of how to form each layer of the display device 10 may be omitted for economy of description, and instead, the order in which layers of the display device 10 are formed will hereinafter be described.

Figure 9:
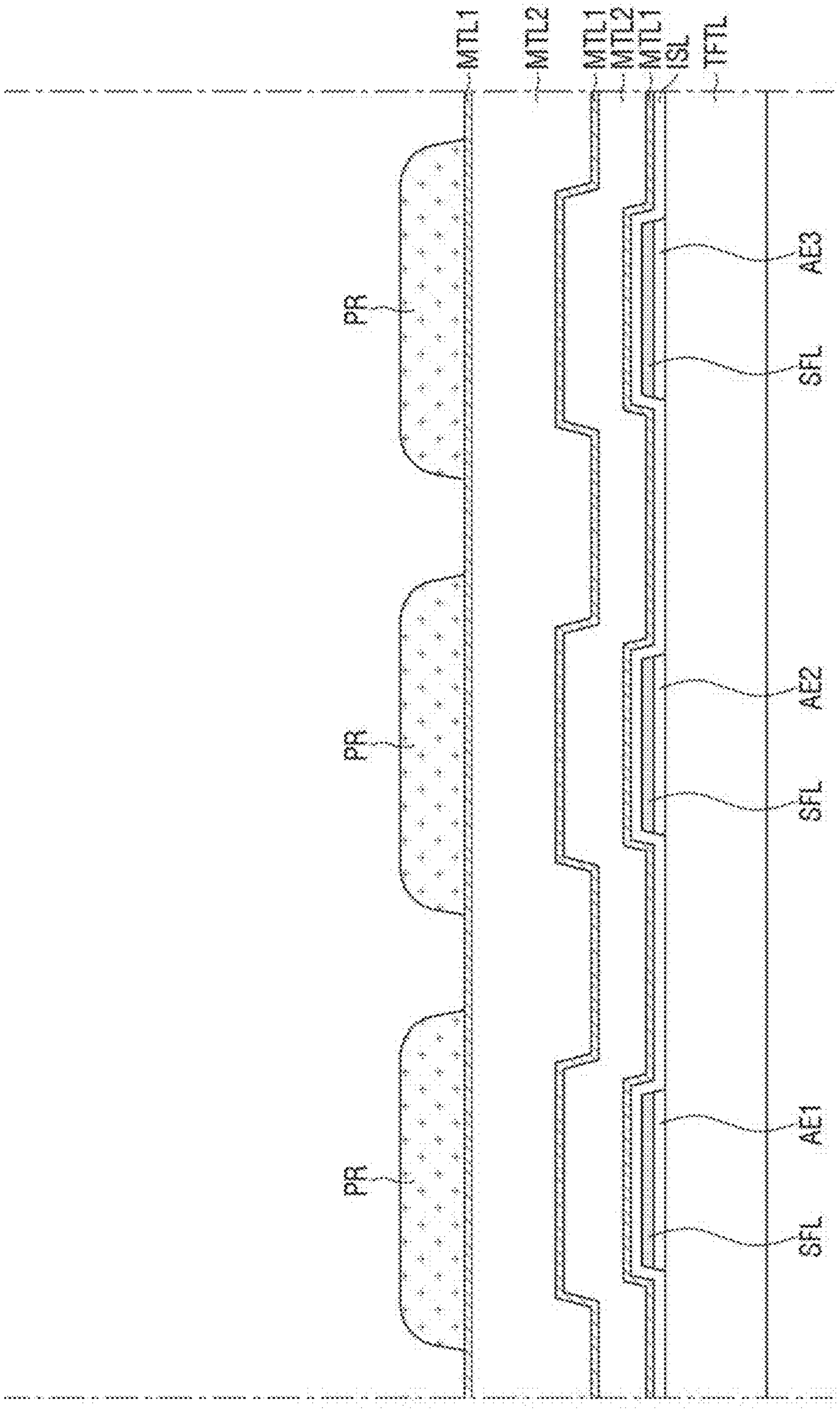
FIGS. 9 through 32 are cross-sectional views illustrating a method of fabricating a display device according to embodiments of the present disclosure.

Referring to FIG. 9, a plurality of pixel electrodes, such as first to third pixel electrodes AE1, AE2, and AE3, a sacrificial layer SFL, an inorganic insulating layer ISL, and a plurality of metal layers, such as first and second metal layers MTL1 and MTL2 are formed on a TFT layer TFTL, and photoresist PR is formed on the first and second metal layers MTL1 and MTL2.

In an embodiment, the TFT layer TFTL may be disposed on a substrate SUB. The structure of the TFT layer TFTL is as described above with reference to FIG. 5, and thus, a detailed description thereof will be omitted for economy of description.

The first to third pixel electrodes AE1, AE2, and AE3 may be spaced apart from one another on the TFT layer TFTL. The pixel electrodes may include first, second, and third pixel electrodes AE1, AE2, and AE3, which are of different light-emitting elements, such as the first to third light-emitting elements ED1, ED2, and ED3. The first, second, and third pixel electrodes AE1, AE2, and AE3 may be spaced apart from one another on the TFT layer TFTL.

The sacrificial layer SFL may be disposed on the first to third pixel electrodes AE1, AE2, and AE3. The sacrificial layer SFL may be initially disposed on (e.g., disposed directly thereon) the first to third pixel electrodes AE1, AE2, and AE3 and may be removed later to form spaces in which first to third light-emitting layers EL1, EL2, and EL3 are disposed. The sacrificial layer SFL may prevent the top surfaces of the first to third pixel electrodes AE1, AE2, and AE3 and the inorganic insulating layer ISL from being in direct contact with one another, and as the sacrificial layer SFL is removed, spaces may be formed between the inorganic insulating layer ISL and the first to third pixel electrodes AE1, AE2, and AE3. In an embodiment, the sacrificial layer SFL may include an oxide semiconductor. For example, the sacrificial layer SFL may include at least one of indium gallium zinc oxide (IGZO), zinc tin oxide (ZTO), and indium tin oxide (ITO). However, embodiments of the present disclosure are not necessarily limited thereto.

The inorganic insulating layer ISL and the first and second metal layers MTL1 and MTL2 may be disposed on the sacrificial layer SFL. The inorganic insulating layer ISL may be disposed to cover the entire sacrificial layer SFL and the entire TFT layer TFTL, and the first and second metal layers MTL1 and MTL2 may be disposed to cover the entire inorganic insulating layer ISL. In an embodiment, the first and second metal layers MTL1 and MTL2 may include a plurality of first metal layers and a plurality of second metal layers MTL2, which are disposed between the first metal layers MTL1 (e.g., in the third direction DR3). One of the first metal layers MTL1 may be disposed directly on the inorganic insulating layer ISL, and the first metal layers MTL1 and the second metal layers MTL2 may be alternately stacked on the inorganic insulating layer ISL with a first metal layer MTL1 disposed at the top of the stack of the first and second metal layers MTL1 and MTL2. The first and second metal layers MTL1 and MTL2 are illustrated in FIG. 9 as including three first metal layers MTL1 and two second metal layers MTL2, which are disposed between the three first metal layers MTL1. However, embodiments of the present disclosure are not necessarily limited thereto.

The photoresist PR may be disposed on the first and second metal layers MTL1 and MTL2 such that portions of the photoresist PR may be spaced apart from one another. The photoresist PR may be used to form trenches TP in the metal layer structure MTLS.

Figure 10:
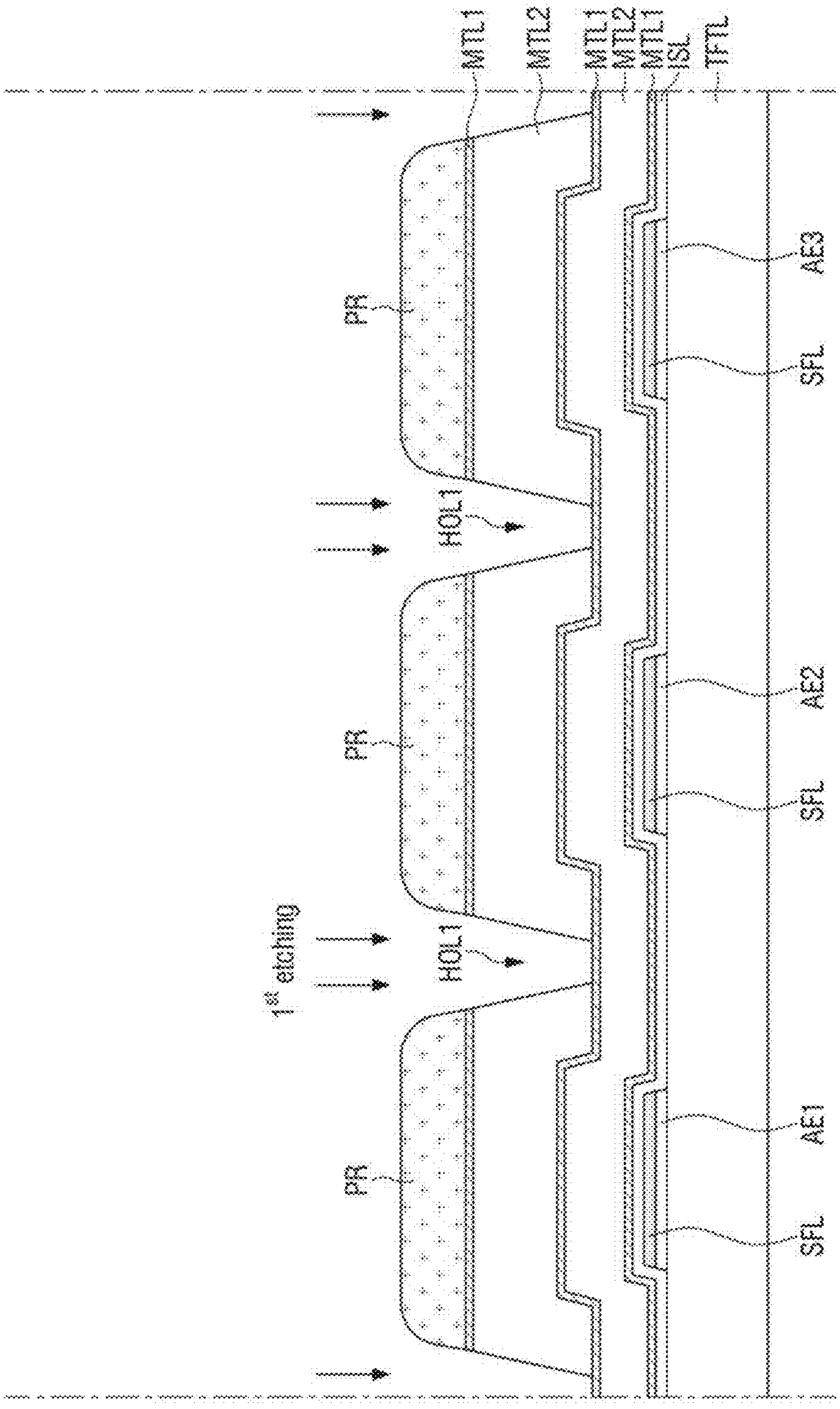

Thereafter, referring to FIG. 10, first holes HOL1 are formed by performing a first etching process ("1$^{st}$ etching"), which etches parts of the metal layers MTL, using the photoresist PR as a mask. In an embodiment, the first etching process may be performed as a dry etching process. As the first etching process is performed as a dry etching process, the first metal layers MTL1 and the second metal layers MTL2, which include a different material from the first metal layers MTL1, may be anisotropically etched. In this process, the uppermost first metal layer MTL1 and the second metal layer MTL2 directly below the uppermost first metal layer MTL1 may be partially etched. The first holes HOL1 may be formed in areas that do not overlap with the first to third pixel electrodes AE1, AE2, and AE3 and may be used for forming trenches TP in a subsequent process.

Figure 11:
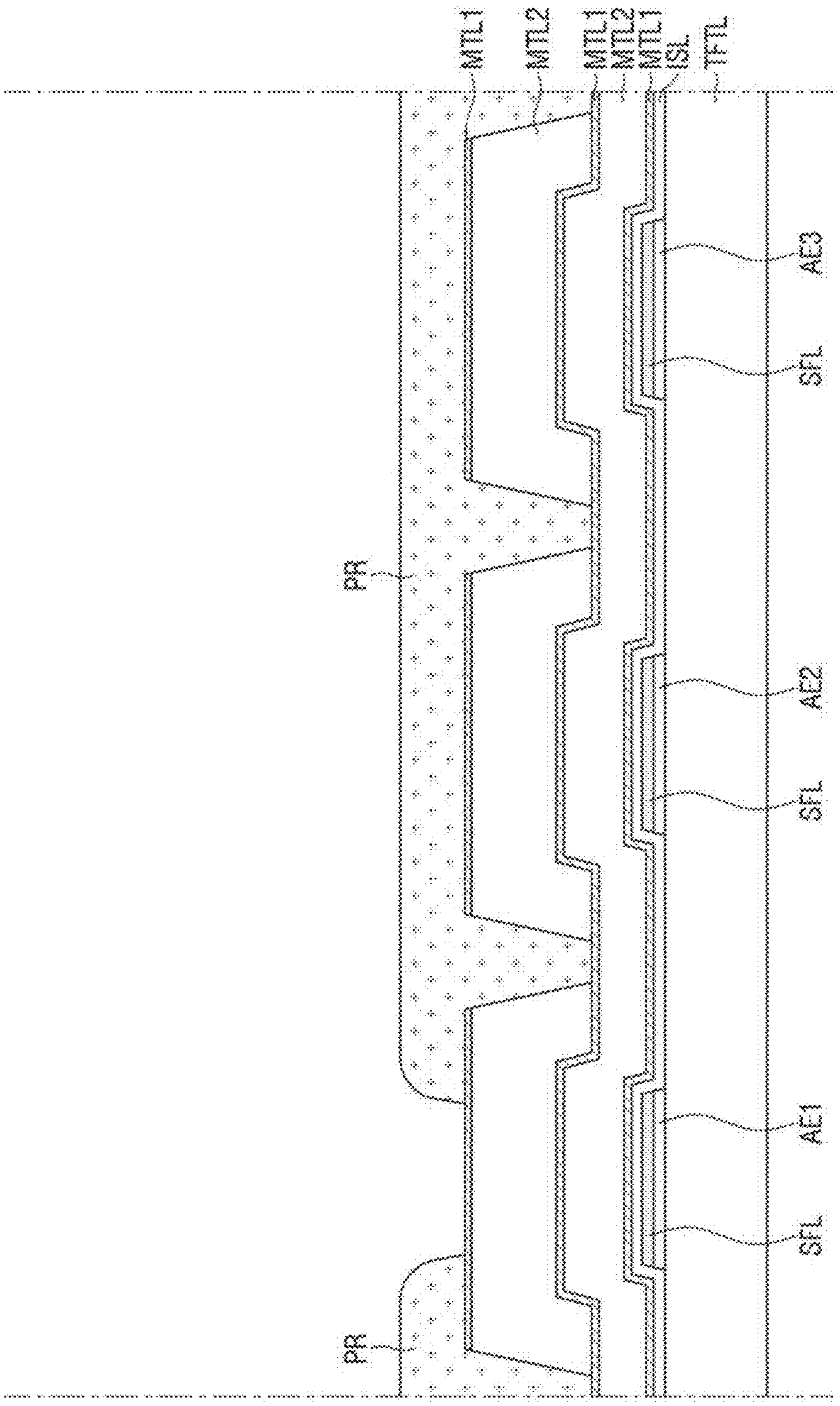
Figure 12:
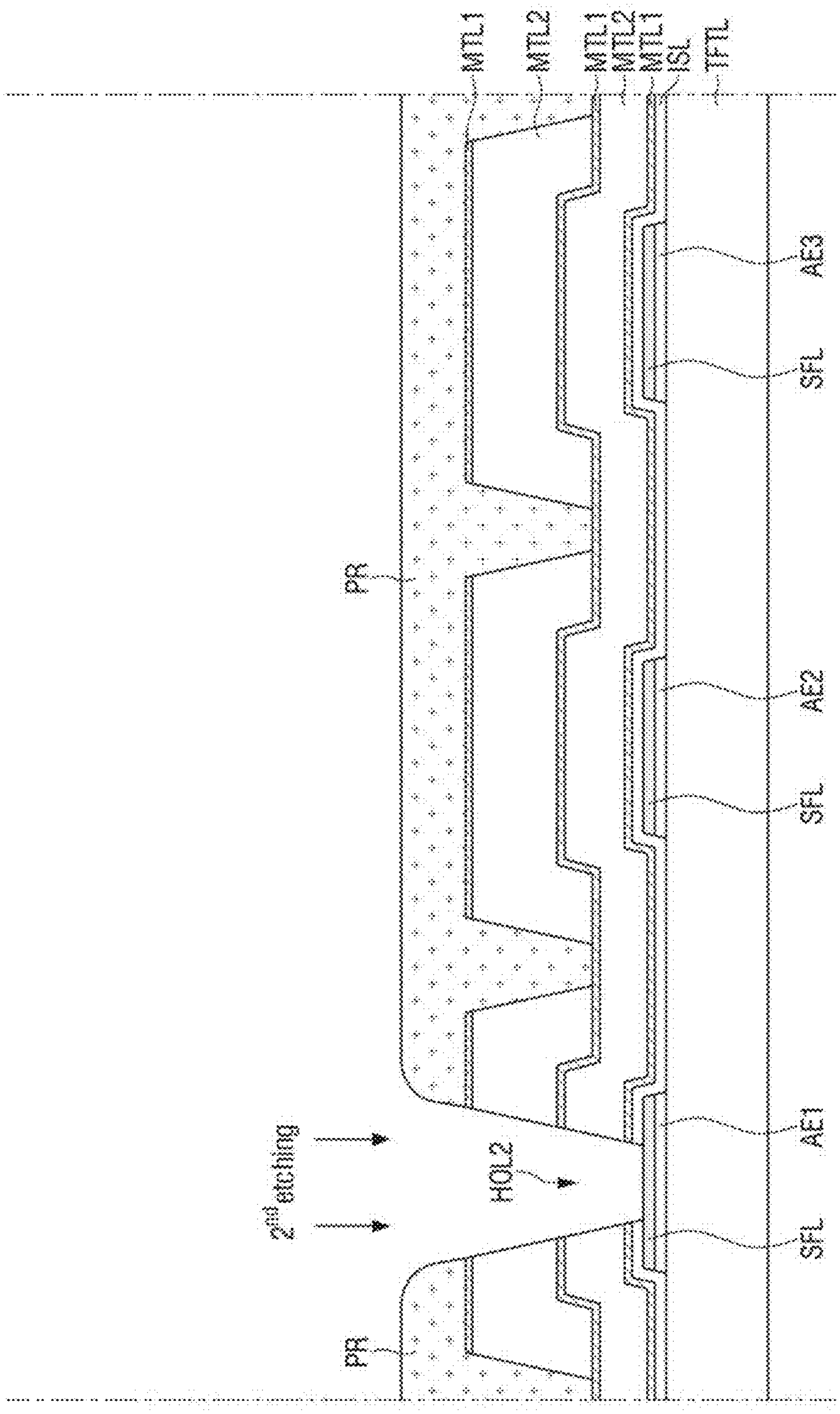

Thereafter, referring to FIGS. 11 and 12, a photoresist PR is formed on the first and second metal layers MTL1 and MTL2, and a second hole HOL2 is formed by performing a second etching process ("2$^{nd}$ etching"), which etches the first and second metal layers MTL1 and MTL2 to expose a portion of the sacrificial layer SFL overlapping with the first pixel electrode AE1. In an embodiment, the second etching process may be performed as a dry etching process. The photoresist PR may be disposed to expose a portion of the uppermost first metal layer MTL1 overlapping with the first pixel electrode AE1. The second hole HOL2 may be formed in an area where the photoresist PR is not disposed and may overlap with the first pixel electrode AE1.

The second hole HOL2 may be formed to penetrate all the first metal layers MTL1 and all the second metal layers MTL2. The second hole HOL2 may be formed to overlap with the first pixel electrode AE1 and may expose a portion of the sacrificial layer SFL on the first pixel electrode AE1. The second hole HOL2 may be used for forming a first opening OPE1 in a subsequent process.

Figure 13:
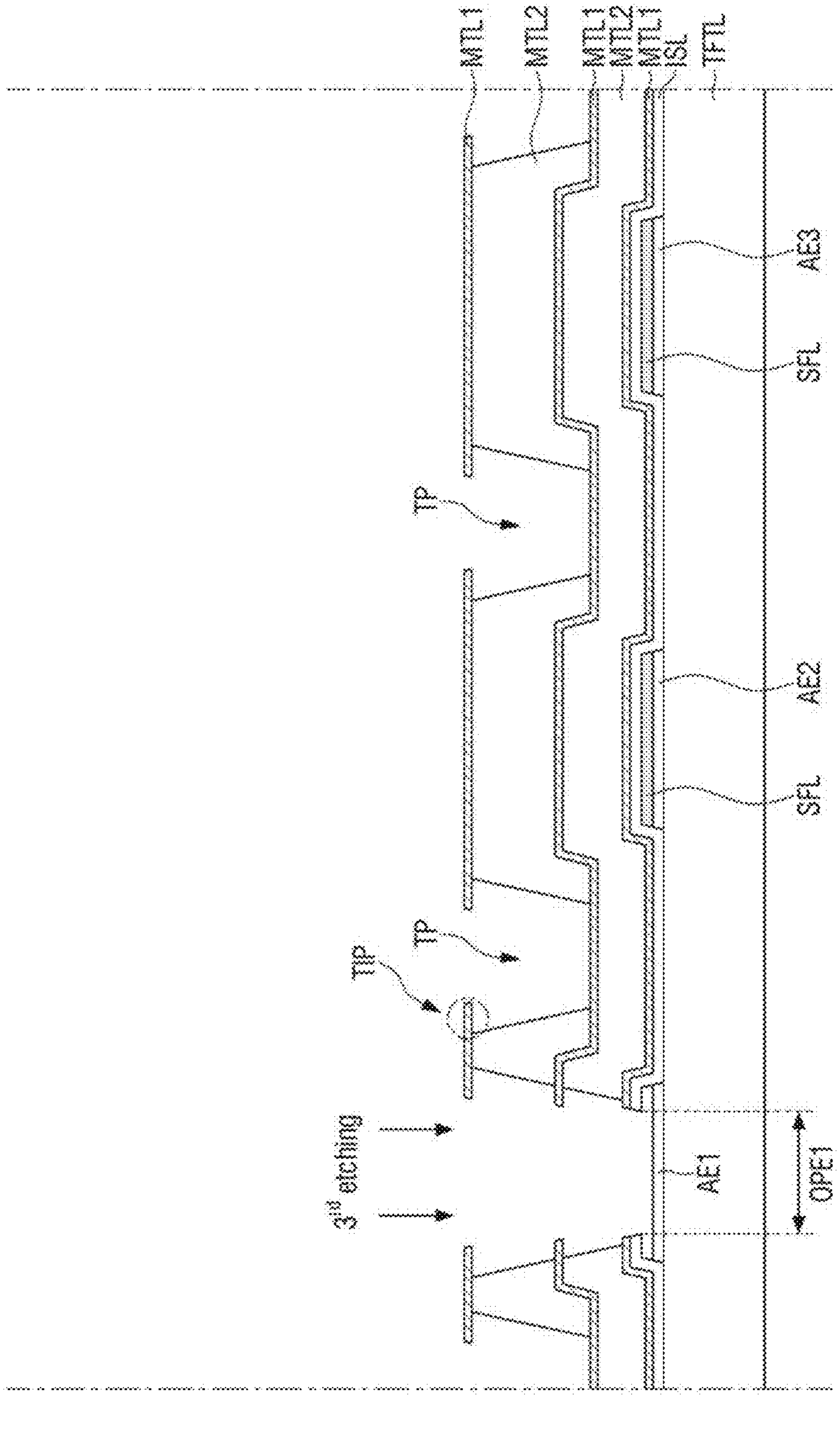

Thereafter, referring to FIG. 13, a third etching process ("3$^{rd}$ etching"), which removes the sacrificial layer SFL from above the first pixel electrode AE1, is performed. In an embodiment, the sacrificial layer SFL may include an oxide semiconductor layer, and the third etching process may be performed as a wet etching process. In this process, the sacrificial layer SFL may be removed, and as a result, the first and second metal layers MTL1 and MTL2 may be isotropically etched in the first holes HOL1 and the second hole HOL2. The second metal layers MTL2 may be etched faster than the first metal layers MTL1, and metal tips TIP may be formed in each of the first metal layers MTL1 to protrude beyond side surfaces of each of the second metal layers MTL2. Undercuts may be formed on the side surfaces of each of the second metal layers MTL2, below the metal tips TIP. As a result of the third etching process, the first holes HOL1 may form trenches TP of the metal layer structure MTLS, and the second hole HOL2 may form the first opening OPE1 or a first emission area EA1.

As the sacrificial layer SFL is removed, space may be formed between the first pixel electrode AE1 and the inorganic insulating layer ISL. A first light-emitting layer EL1 may be formed later on the first pixel electrode AE1 to fill the space between the first pixel electrode AE1 and the inorganic insulating layer ISL.

Figure 14:
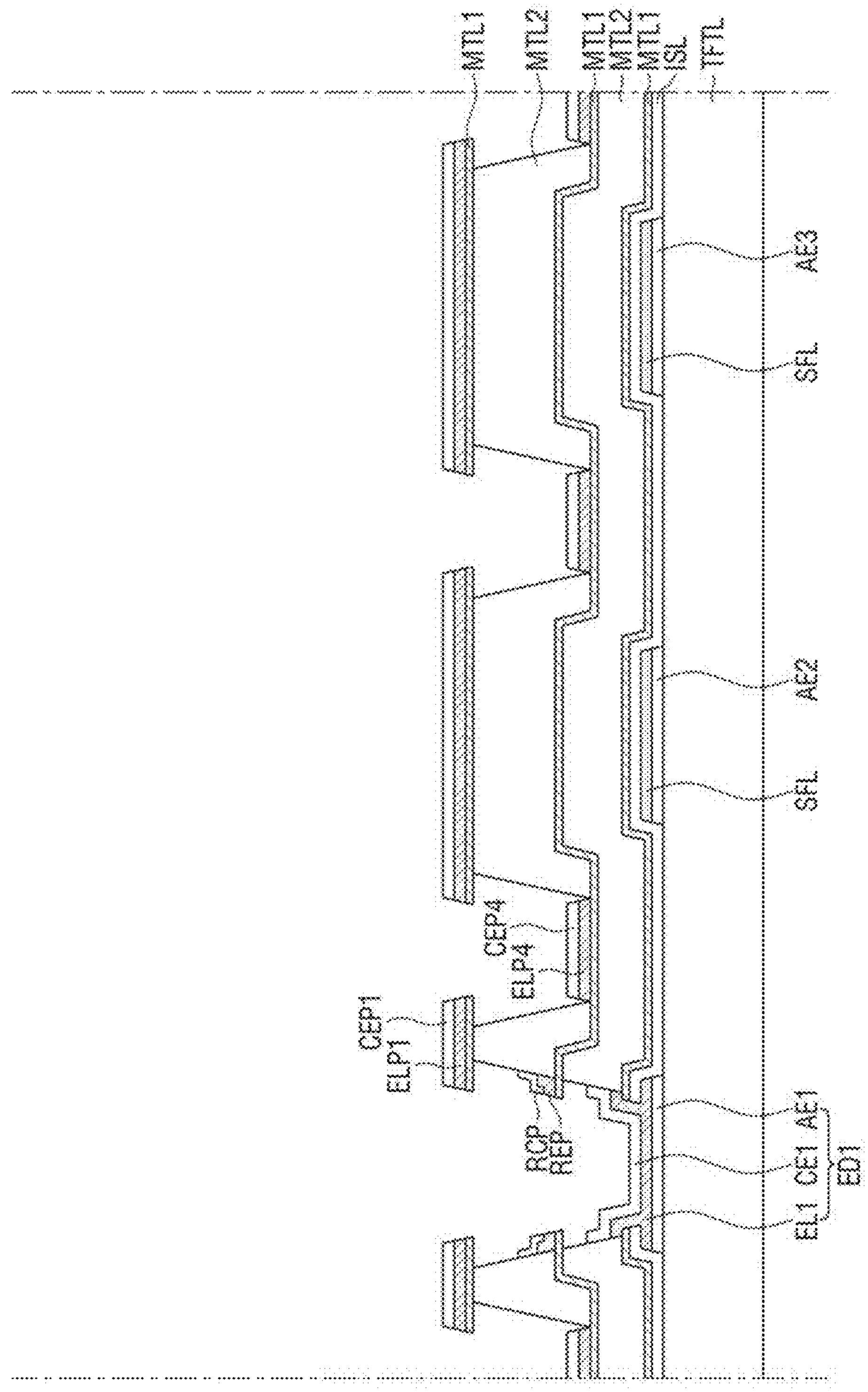

Thereafter, referring to FIG. 14, a first light-emitting element ED1 is formed by depositing the first light-emitting layer EL1 and a first common electrode CE1 on the first pixel electrode AE1. The first light-emitting layer EL1 and the first common electrode CE1 may be formed in the first opening OPE1, and the materials for forming the first light-emitting layer EL1 and the first common electrode CE1 may also be deposited on the first and second metal layers MTL1 and MTL2 to form a plurality of patterns. For example, some of the materials for forming the first light-emitting layer EL1 and the first common electrode CE1 may be deposited on a middle first metal layer MTL1, in the first opening OPE1, thereby forming residual organic patterns REP and residual electrode patterns RCP, some of the materials for forming the first light-emitting layer EL1 and the first common electrode CE1 may be deposited on the uppermost first metal layer MTL1, thereby forming first organic patterns ELP1 and first electrode patterns CEP1, and some of the materials for forming the first light-emitting layer EL1 and the first common electrode CE1 may be deposited in each of the trenches TP, thereby forming fourth organic patterns ELP4 and fourth electrode patterns CEP4. The first light-emitting layer EL1, the first common electrode CE1, the first organic patterns ELP1, the fourth organic patterns ELP4, the first electrode patterns CEP1, and the fourth electrode patterns CEP4 are as already described above.

The first light-emitting layer EL1 and the first common electrode CE1 may be formed by a deposition process. The materials for forming the first light-emitting layer EL1 and the first common electrode CE1 may not be properly deposited in the first opening OPE1 and the trenches TP because of the presence of the metal tips TIP. However, as the materials for forming the first light-emitting layer EL1 and the first common electrode CE1 are deposited diagonally, rather than perpendicularly, with respect to the top surface of a substrate SUB, the materials for forming the first light-emitting layer EL1 and the first common electrode CE1 may also be deposited in areas hidden by the metal tips TIP.

Figure 15:
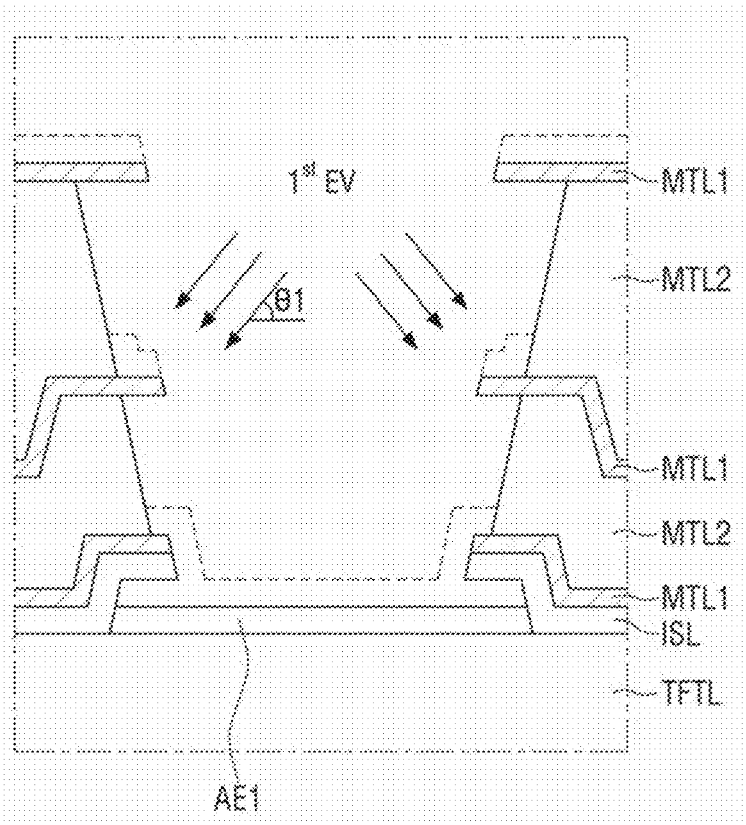
Figure 16:
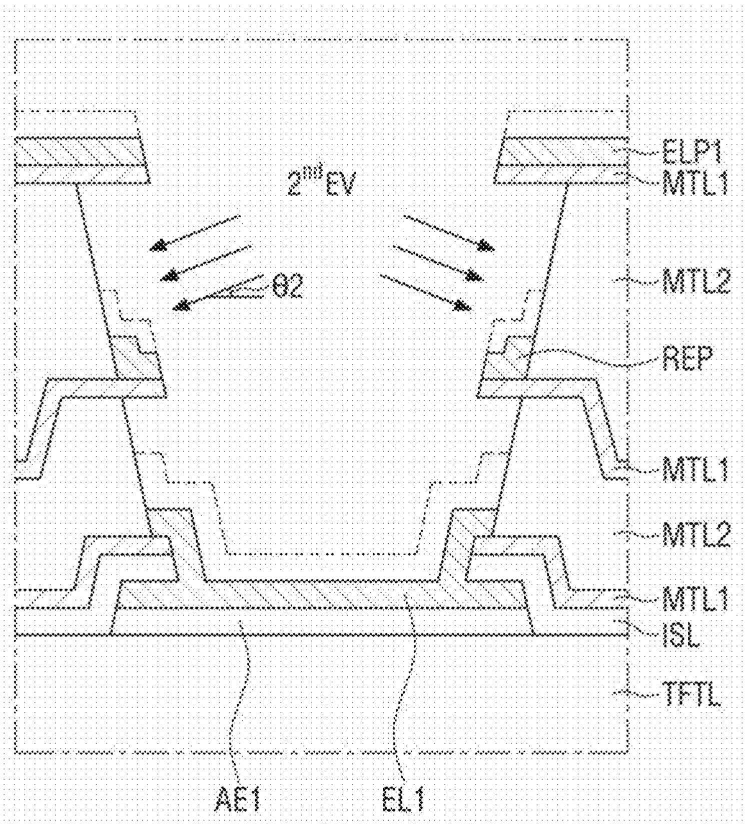

FIG. 15 illustrates a deposition process performed during the formation of the first light-emitting layer EL1, and FIG. 16 illustrates a deposition process performed during the formation of common electrodes, such as the first to third common electrodes CE1, CE2, and CE3.

Referring to FIG. 15, a first deposition process ("1$^{st}$ EV"), which forms the first light-emitting layer EL1, may be performed such that the material for forming the first light-emitting layer EL1 may be deposited in a direction that is not perpendicular to the top surface of the first pixel electrode AE1, for example, at a first angle θ1. In an embodiment, the material for forming the first to third light-emitting layers EL1, EL2, and EL3 may be deposited at an angle in a range of about 45° to about 50° with respect to the top surfaces of the first to third pixel electrodes AE1, AE2, and AE3. The first light-emitting layer EL1 may be formed to fill the space between the first pixel electrode AE1 and the inorganic insulating layer ISL and may also be formed in the areas hidden by the metal tips TIP. For example, the first light-emitting layer EL1 may be disposed in areas hidden by the metal tips TIP of the middle first metal layer MTL1, such as on the side surfaces of the lowermost second metal layer MTL2 and on a portion of the lowermost first metal layer MTL1. The material for forming the first light-emitting layer EL1 may be disposed in areas hidden by the metal tips TIP of the uppermost first metal layer MTL1, such as on portions of the middle first metal layer MTL1, thereby forming the residual organic patterns REP.

Referring to FIG. 16, a second deposition process ("2$^{nd}$ EV"), which forms the first common electrode CE1, may be performed in a direction that is not perpendicular to the top surface of the first pixel electrode AE1, for example, at a second angle θ2. In an embodiment, the material for forming the first to third common electrodes CE1, CE2, and CE3 may be deposited at an angle of about 30° or less with respect to the top surfaces of the first to third pixel electrodes AE1, AE2, and AE3. The first common electrode CE1 may be disposed on the first light-emitting layer EL1 and may also be formed in the areas hidden by the metal tips TIP. For example, the first common electrode CE1 may be disposed in the areas hidden by the metal tips TIP of the middle first metal layer MTL1, such as on the side surfaces of the lowermost second metal layer MTL2 and on portions of the lowermost first metal layer MTL1. Also, the material for forming the first common electrode CE1 may be disposed in the areas hidden by the uppermost first metal layer MTL1, such as on portions of the middle first metal layer MTL1, and may form the residual electrode patterns RCP.

The deposition process for forming the first to third common electrodes CE1, CE2, and CE3 may be performed in a more horizontal direction than the deposition process for forming the first to third light-emitting layers EL1, EL2, and EL3. As a result, the contact areas of the first to third common electrodes CE1, CE2, and CE3 and the side surfaces of each of the second metal layers MTL2 may be greater than the contact areas of the first to third light-emitting layers EL1, EL2, and EL3 and the side surfaces of the lowermost second metal layer MTL2. Alternatively, the first to third common electrodes CE1, CE2, and CE3 may be deposited up to a higher position than the first to third light-emitting layers EL1, EL2, and EL3 on the sides of the lowermost second metal layer MTL2. Different common electrodes of the first to third common electrodes CE1, CE2, and CE3 may be in direct contact with the second metal layers MTL2, which have high conductivity, and thus the first to third common electrodes CE1, CE2 and CE3 may be electrically connected to each other.

Figure 17:
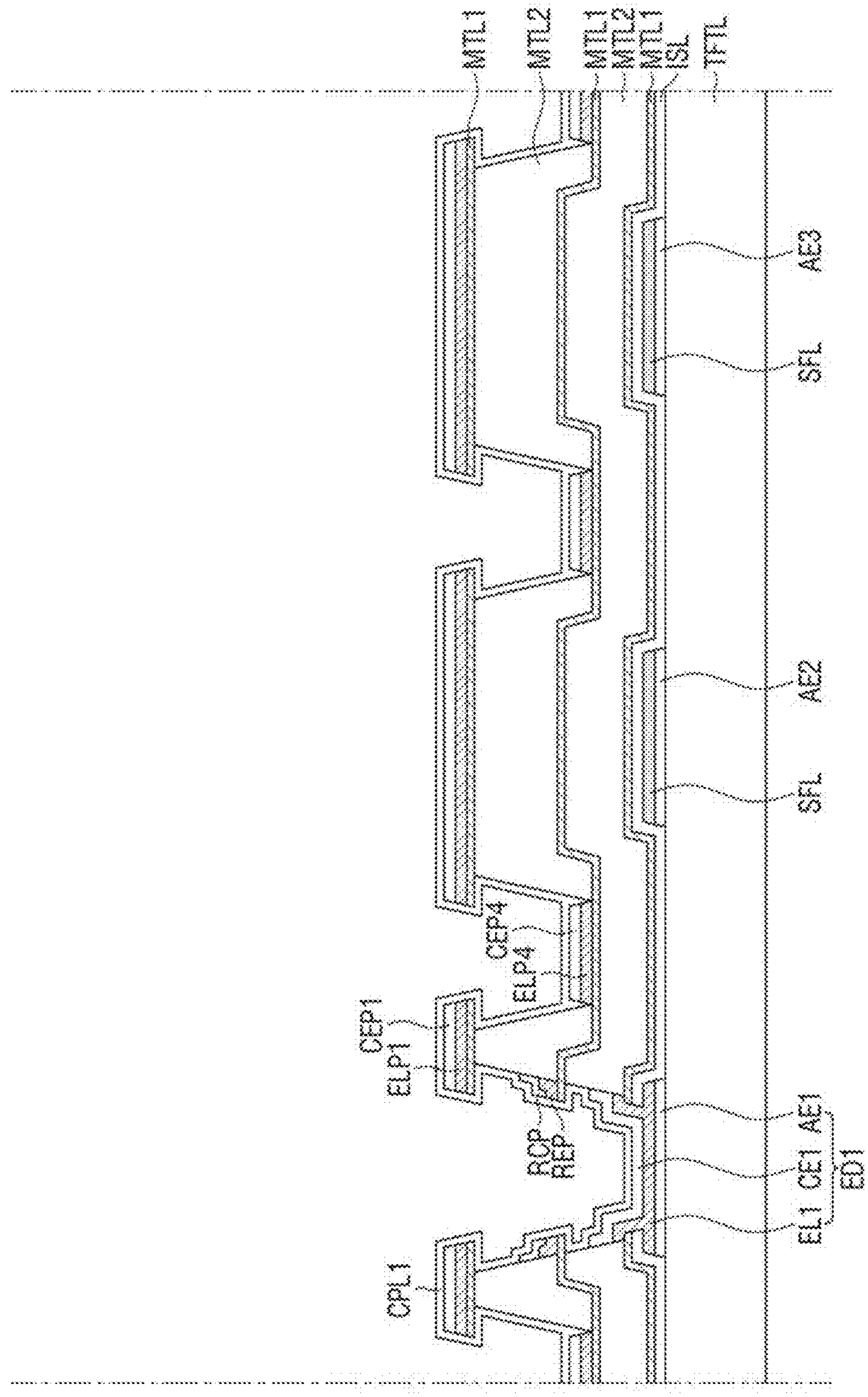

Thereafter, referring to FIG. 17, a first capping layer CPL1, which covers the first light-emitting element ED1, and the first and second metal layers MTL1 and MTL2 is formed. In an embodiment, the first capping layer CPL1, unlike the first to third light-emitting elements EL1, EL2, and EL3 and the first to third common electrodes CE1, CE2, and CE3, may be formed by a CVD process and may be uniformly formed regardless of step differences therebelow. The first capping layer CPL1 may be formed to completely cover the outer surfaces of the first light-emitting element ED1 and the outer surfaces of the stack of the first and second metal layers MTL1 and MTL2. The first capping layer CPL1 may also be deposited below the metal tips TIP.

In this manner, the first light-emitting element ED1 and the first capping layer CPL1 may be formed. Second and third light-emitting elements ED2 and ED3 may be formed in a similar manner to the first light-emitting element ED1, and second and third capping layers CPL2 and CPL3 may be formed in a similar manner to the first capping layer CPL1.

Figure 18:
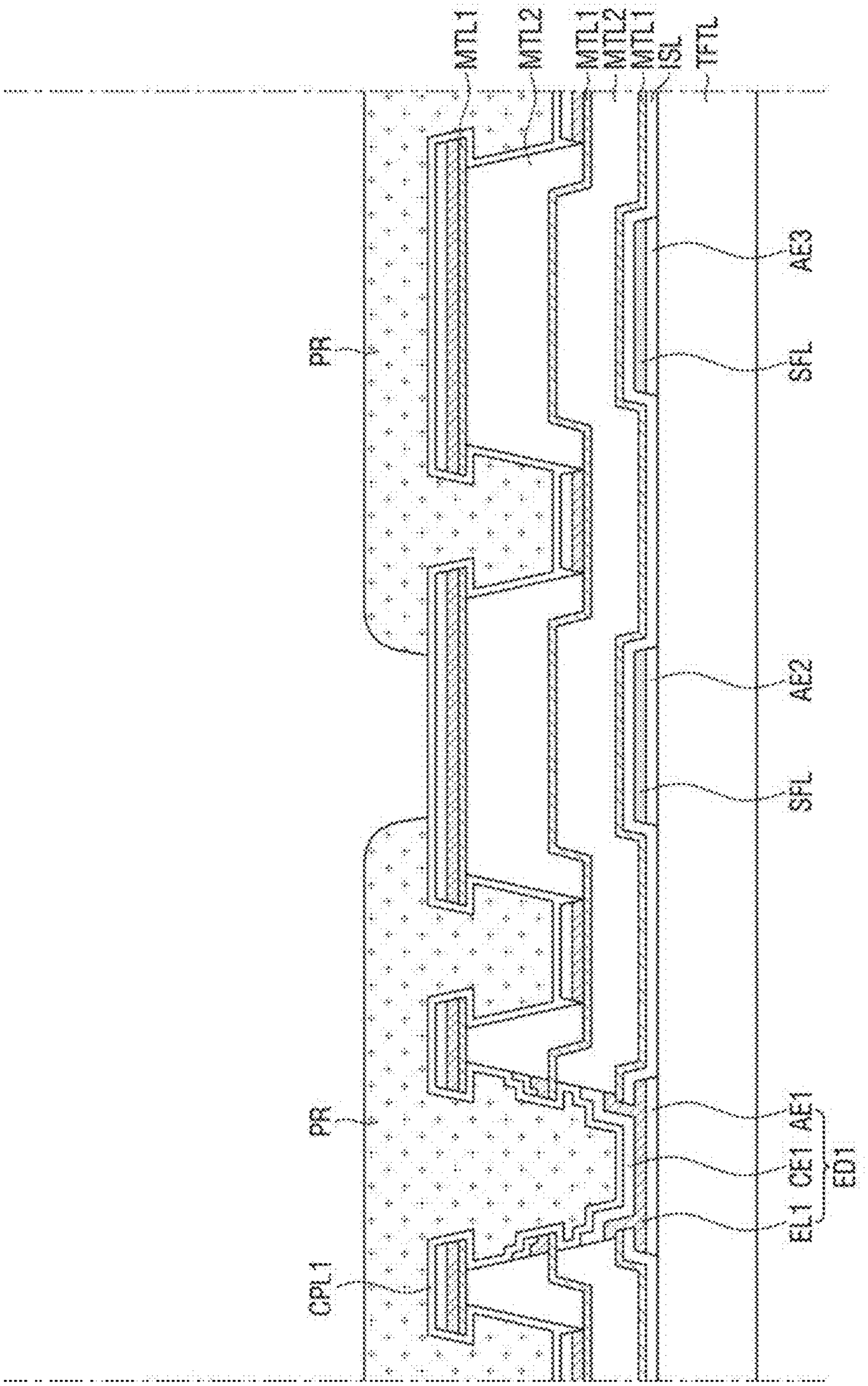
Figure 19:
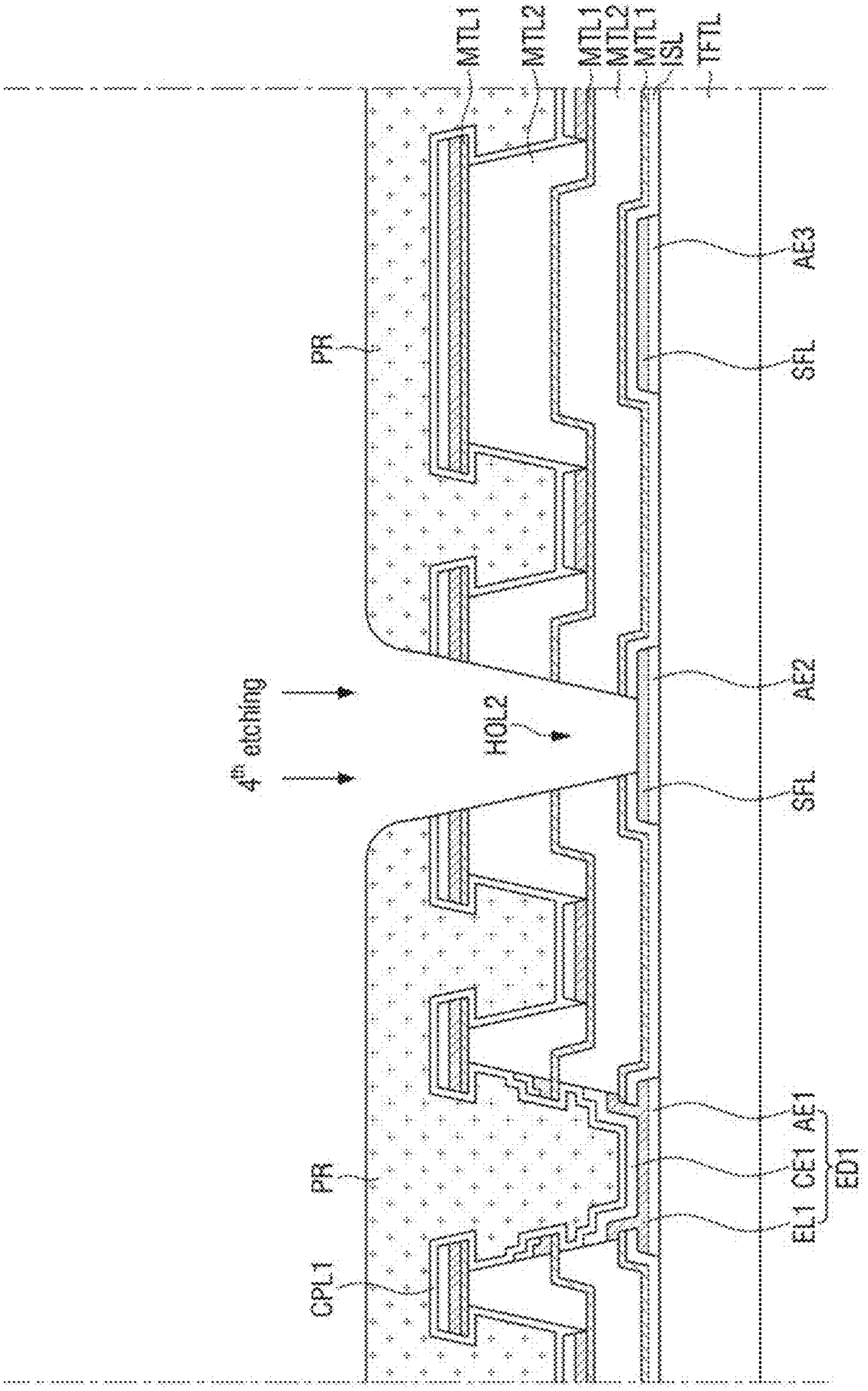

Referring to FIGS. 18 and 19, a photoresist PR is formed on the first and second metal layers MTL1 and MTL2, and a second hole HOL2 is formed by performing a fourth etching process ("4$^{th}$ etching"), which etches the first and second metal layers MTL1 and MTL2 to expose the top surface of a portion of the sacrificial layer SFL overlapping with the second pixel electrode AE2. The fourth etching process may be performed as a dry etching process. The second hole HOL2 may overlap with the second pixel electrode AE2 and may be formed to penetrate all the first metal layers MTL1 and all the second metal layers MTL2. The second hole HOL2 may be used to form a second opening OPE2 in a subsequent process. During the fourth etching process, a first organic pattern ELP1, a first electrode pattern CEP1, and a portion of the first capping layer CPL1 that are disposed on the uppermost first metal layer MTL1, in an area overlapping with the second pixel electrode AE2, may also be etched.

Figure 20:
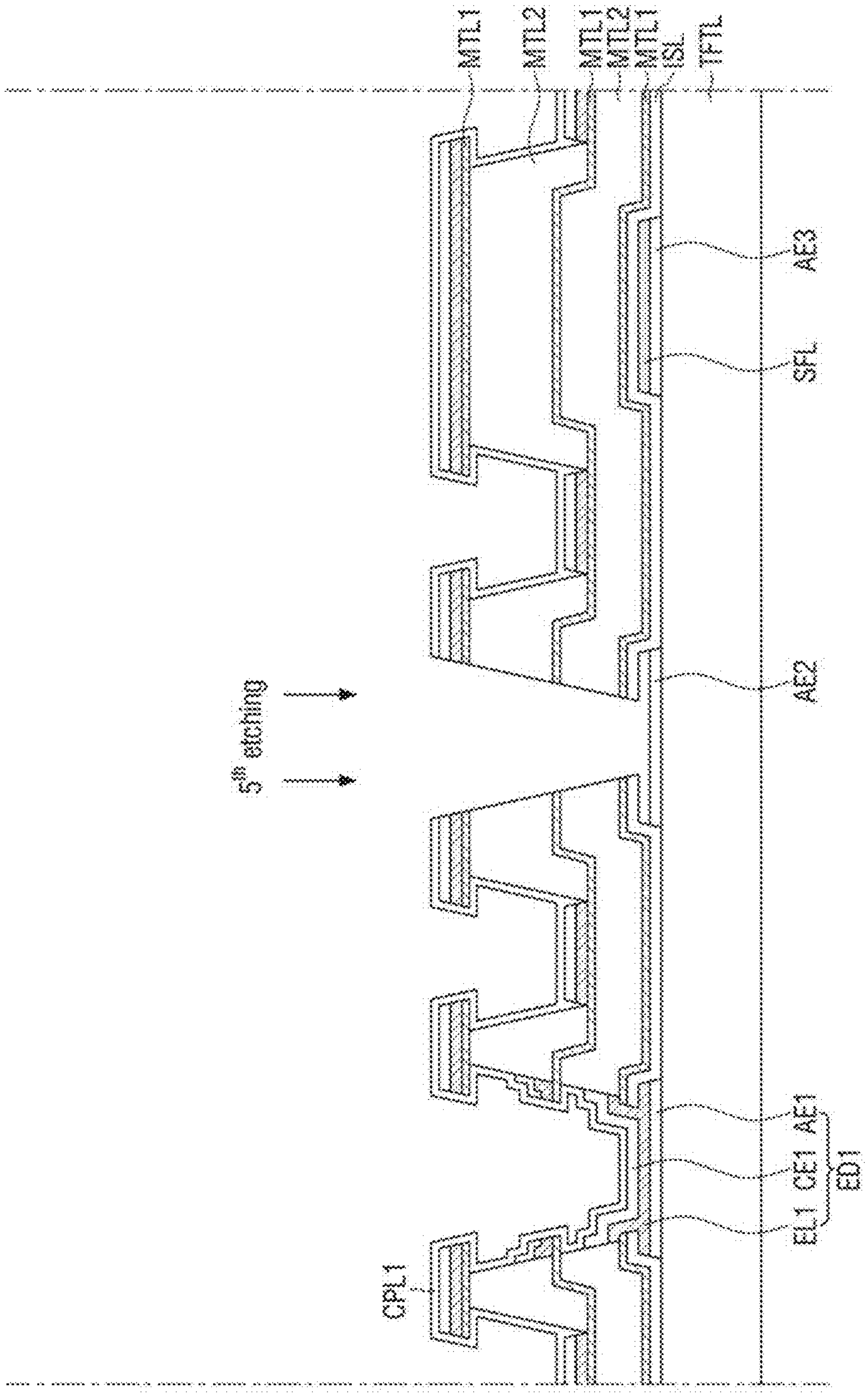
Figure 21:
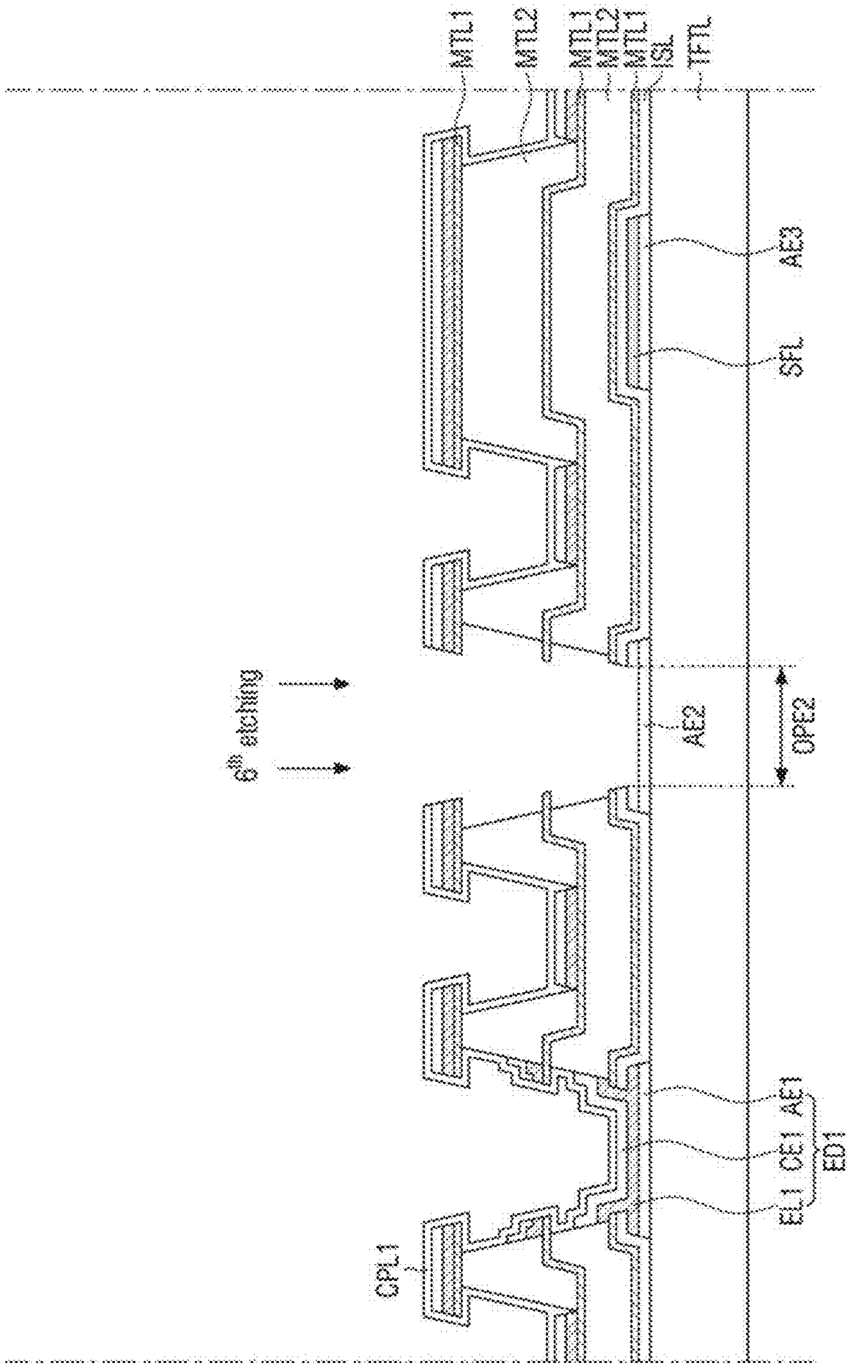

Thereafter, referring to FIGS. 20 and 21, a fifth etching process ("5$^{th}$ etching"), which removes the sacrificial layer SFL from above the second pixel electrode AE2, and a sixth etching process ("6$^{th}$ etching"), which etches parts of the first and second metal layers MTL1 and MTL2 that are exposed on the sidewalls of the second hole HOL2, are performed. In an embodiment, the fifth and sixth etching processes may be performed as wet etching processes. As the sacrificial layer SFL is removed, portions of the first and second metal layers MTL1 and MTL2 in the second hole HOL2 may be isotropically etched. As the sacrificial layer SFL is removed, the second pixel electrode AE2 having a top surface that is spaced apart from the inorganic insulating layer ISL may be exposed, and metal tips TIP may be formed in each of the first metal layers MTL1, on the second pixel electrode AE2, to protrude beyond the side surfaces of each of the second metal layers MTL2. The second hole HOL2 may form the second opening OPE2 or a second emission area EA2.

The first opening OPE1 and the trenches TP may be exposed during the fifth and sixth etching processes. However, the sidewalls of each of the first opening OPE1 and the trenches TP are uneven or rugged due to the presence of the metal tips TIP of each of the first metal layers MTL1, and the first capping layer CPL1 is disposed to cover the sidewalls of each of the first opening OPE1 and the trenches TP. Accordingly, the first light-emitting element ED1, which is disposed in the first opening OPE1, or the fourth organic patterns ELP4 and the fourth electrode patterns CPE4, which are disposed in each of the trenches TP, can be prevented from being peeled off during the fifth and sixth etching processes.

Figure 22:
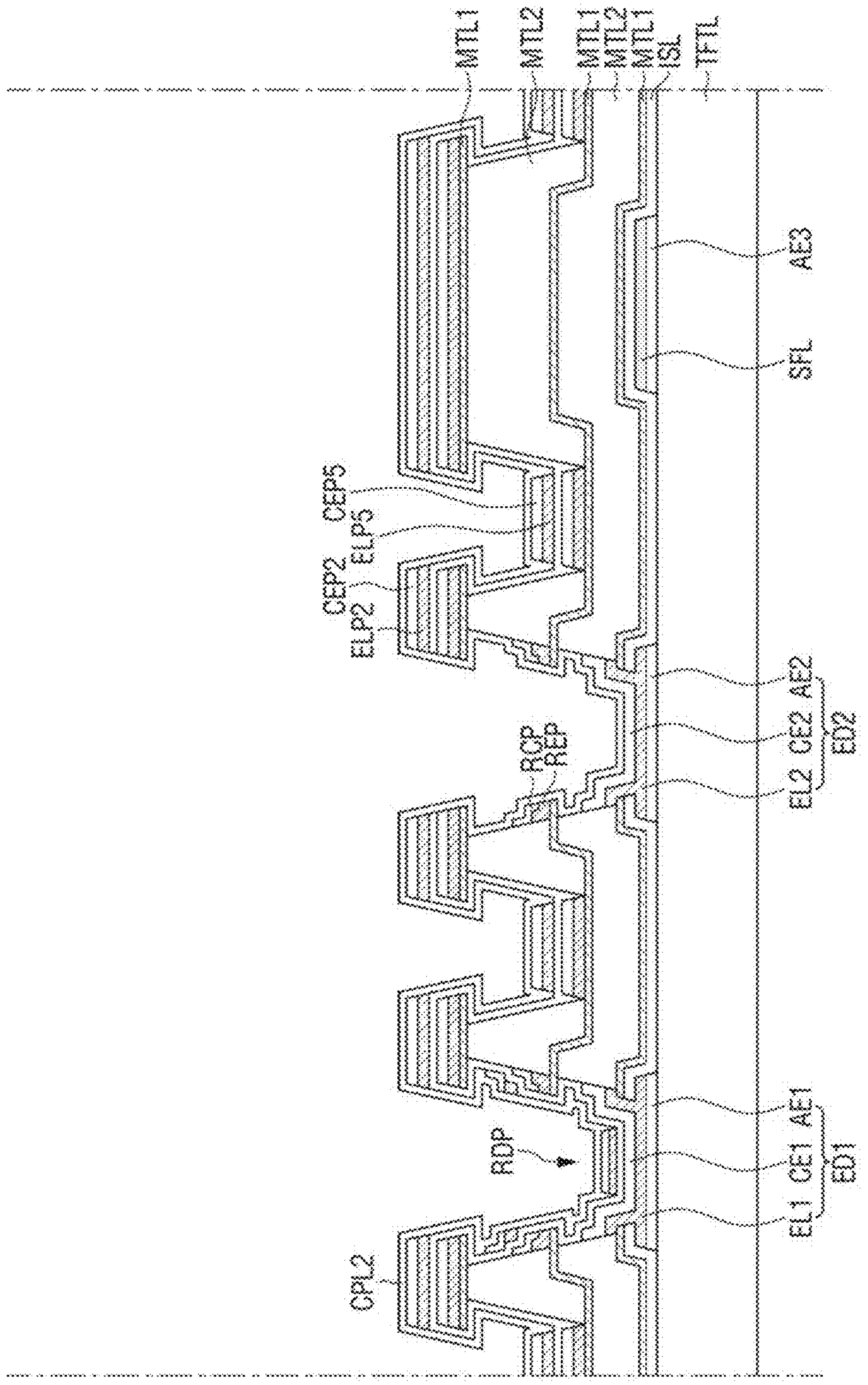
Figure 23:
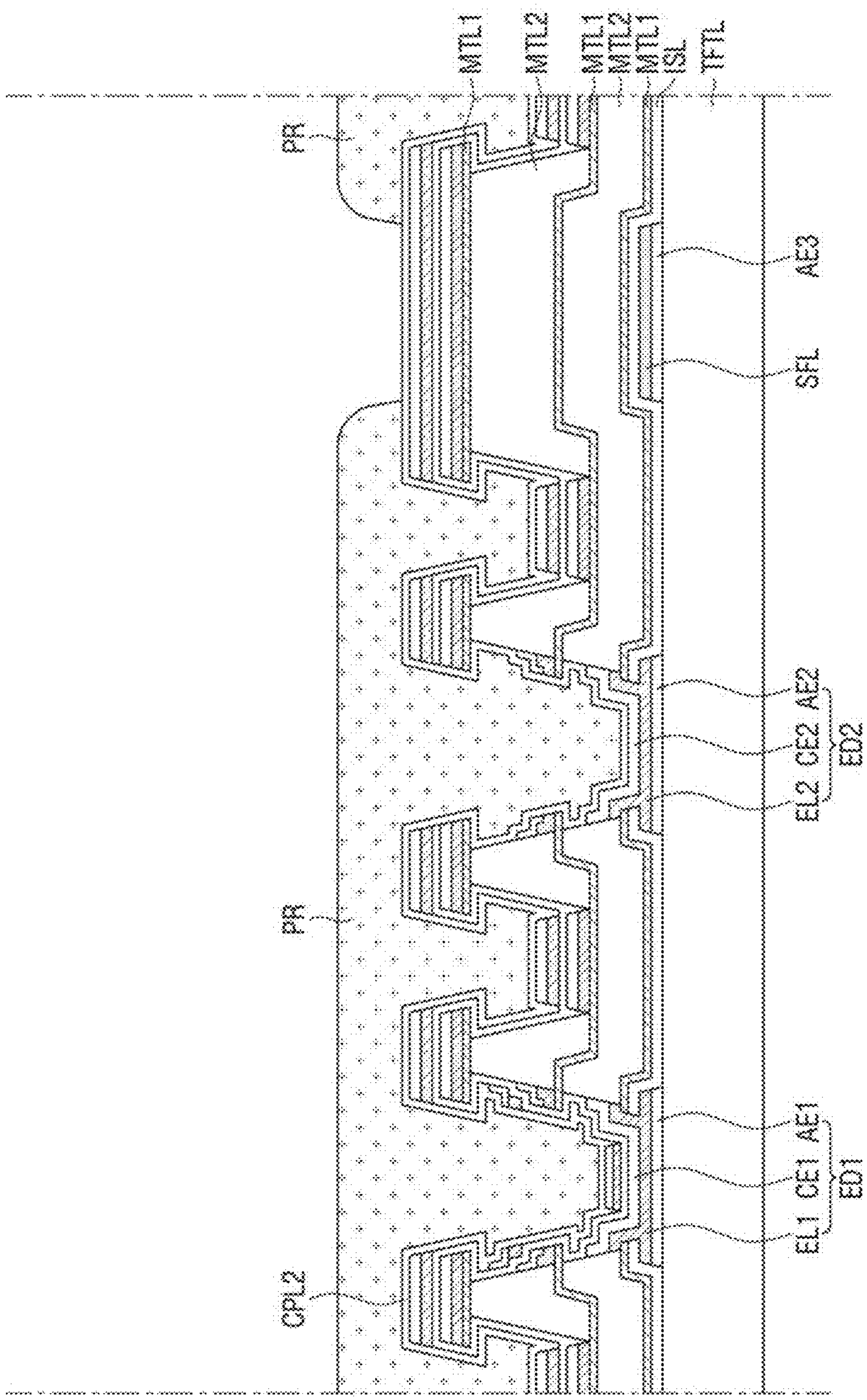
Figure 24:
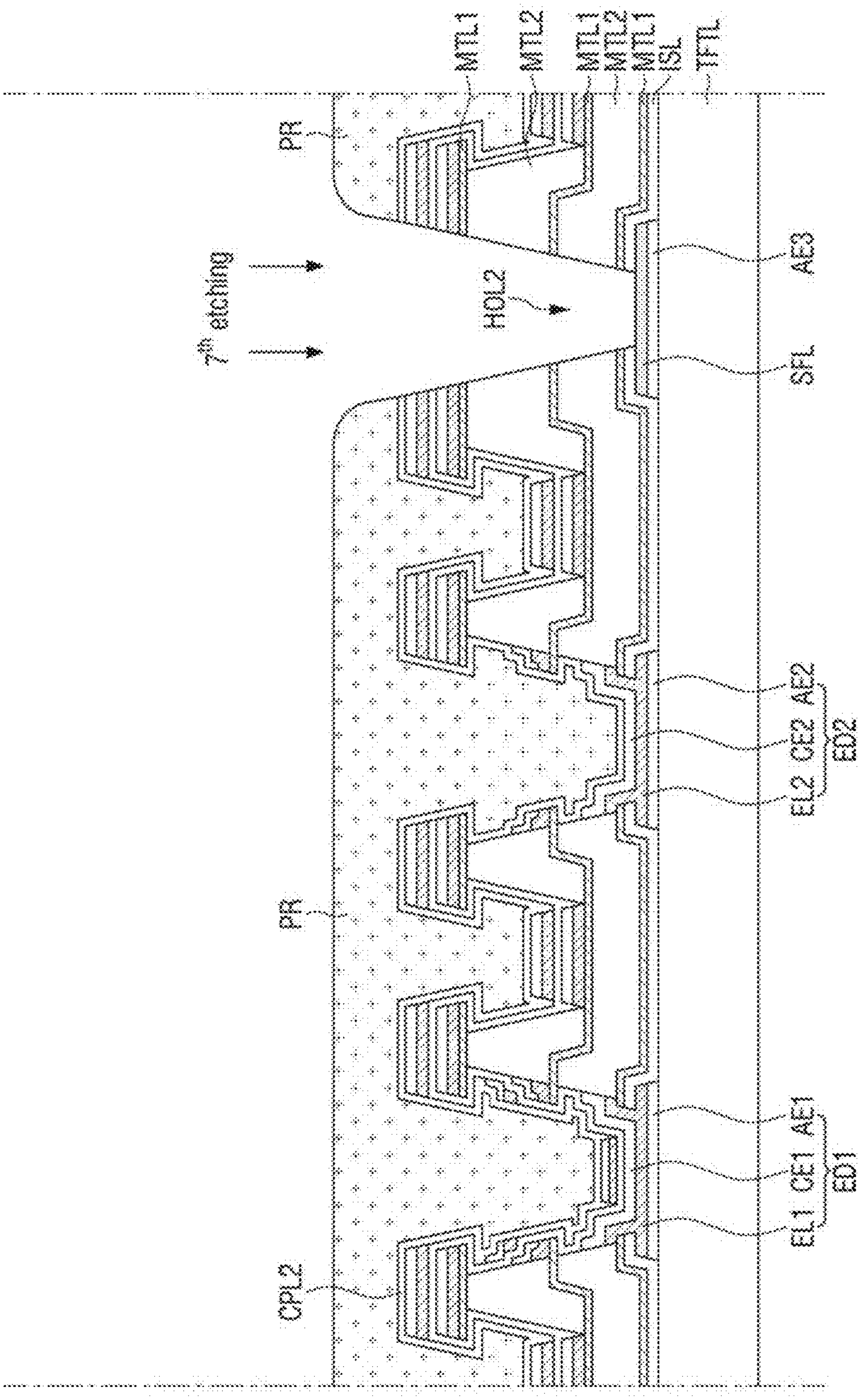
Figure 25:
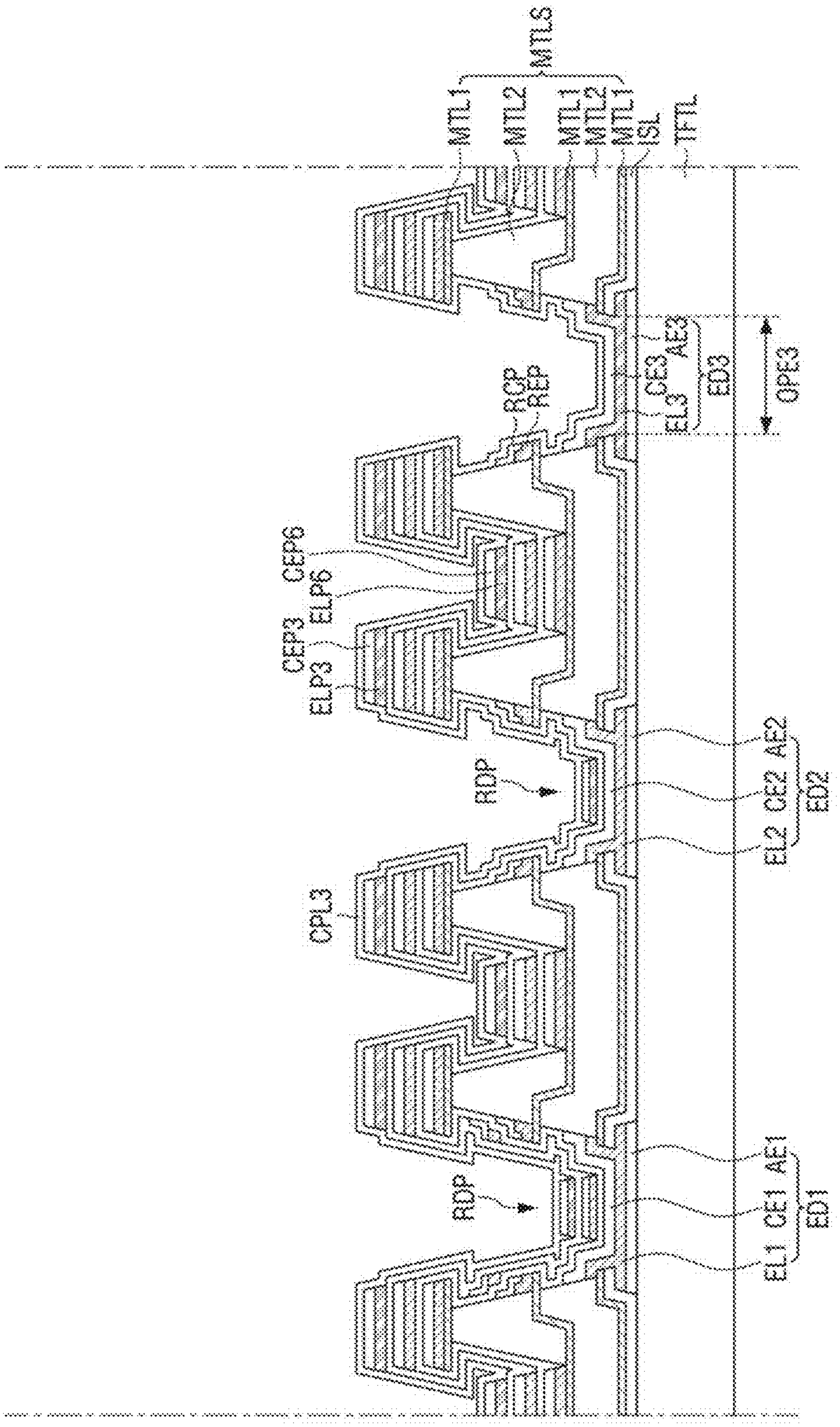

Thereafter, referring to FIG. 22, a second light-emitting element ED2 is formed by depositing a second light-emitting layer EL2 and a second common electrode CE2 on the second pixel electrode AE2, and a second capping layer CPL2 is formed on the second light-emitting element ED2 and the first and second metal layers MTL1 and MTL2.

The second light-emitting layer EL2 and the second common electrode CE2 may be formed in the second opening OPE2, and residual organic patterns REP, residual electrode patterns RCP, second organic patterns ELP2, fifth organic patterns ELP5, second electrode patterns CEP2, and fifth electrode patterns CEP5 may be formed. The second capping layer CPL2 may be formed to cover the second light-emitting element ED2, the second common electrode CE2, the residual organic patterns REP, the residual electrode patterns RCP, the second organic patterns ELP2, the fifth organic patterns ELP5, the second electrode patterns CEP2, and the fifth electrode patterns CEP5. The second light-emitting layer EL2, the second common electrode CE2, and the second capping layer CPL2 are as already described above and a repeated description may be omitted for economy of description.

Dummy patterns RDP, which include the same materials as the second light-emitting layer EL2 and the second common electrode CE2, may be disposed in the first opening OPE1 or on the first light-emitting element ED1. The dummy patterns RDP, which are layers sequentially disposed on the first light-emitting element ED1, may include the second capping layer CPL2 and patterns that include the same materials as the second light-emitting layer EL2 and the second common electrode CE2. The dummy patterns RDP may be disposed on the residual organic patterns REP and the residual electrode patterns RCP, in the first opening OPE1. The dummy patterns RDP may be removed later so that only the first light-emitting element ED1 may be disposed in the first opening OPE1. During the removal of the dummy patterns RDP, the organic patterns ELP and the electrode patterns CEP may be partially removed from around the first to third openings OPE1, OPE2, and OPE3.

Thereafter, a third light-emitting element ED3 is formed in a third opening OPE3, and a third capping layer CPL3 is formed on the third light-emitting element ED3. For example, a seventh etching process ("7$^{th}$ etching"), which is for exposing a portion of the sacrificial layer SFL on the third pixel electrode AE3, and an etching process of removing the sacrificial layer SFL and isotropically etching the first and second metal layers MTL1 and MTL2 are performed. During the seventh etching process, a first organic pattern ELP1, a first electrode pattern CEP1, a portion of the first capping layer CPL1, a second organic pattern ELP2, a second electrode pattern CEP2, and a portion of the second capping layer CPL2 that are disposed on the uppermost first metal layer MTL1, in an area overlapping with the third pixel electrode AE3, may also be etched. A third light-emitting layer EL3 and a third common electrode CE3 of the third light-emitting element ED3 may be formed in a third opening OPE3, which is obtained by the seventh etching process, and at the same time, residual organic patterns REP, residual electrode patterns RCP, third organic patterns ELP3, sixth organic patterns ELP6, third electrode patterns CEP3, and sixth electrode patterns CEP may be formed.

Thereafter, an etching process for removing the dummy patterns RDP from undesignated areas is performed.

Figure 26:
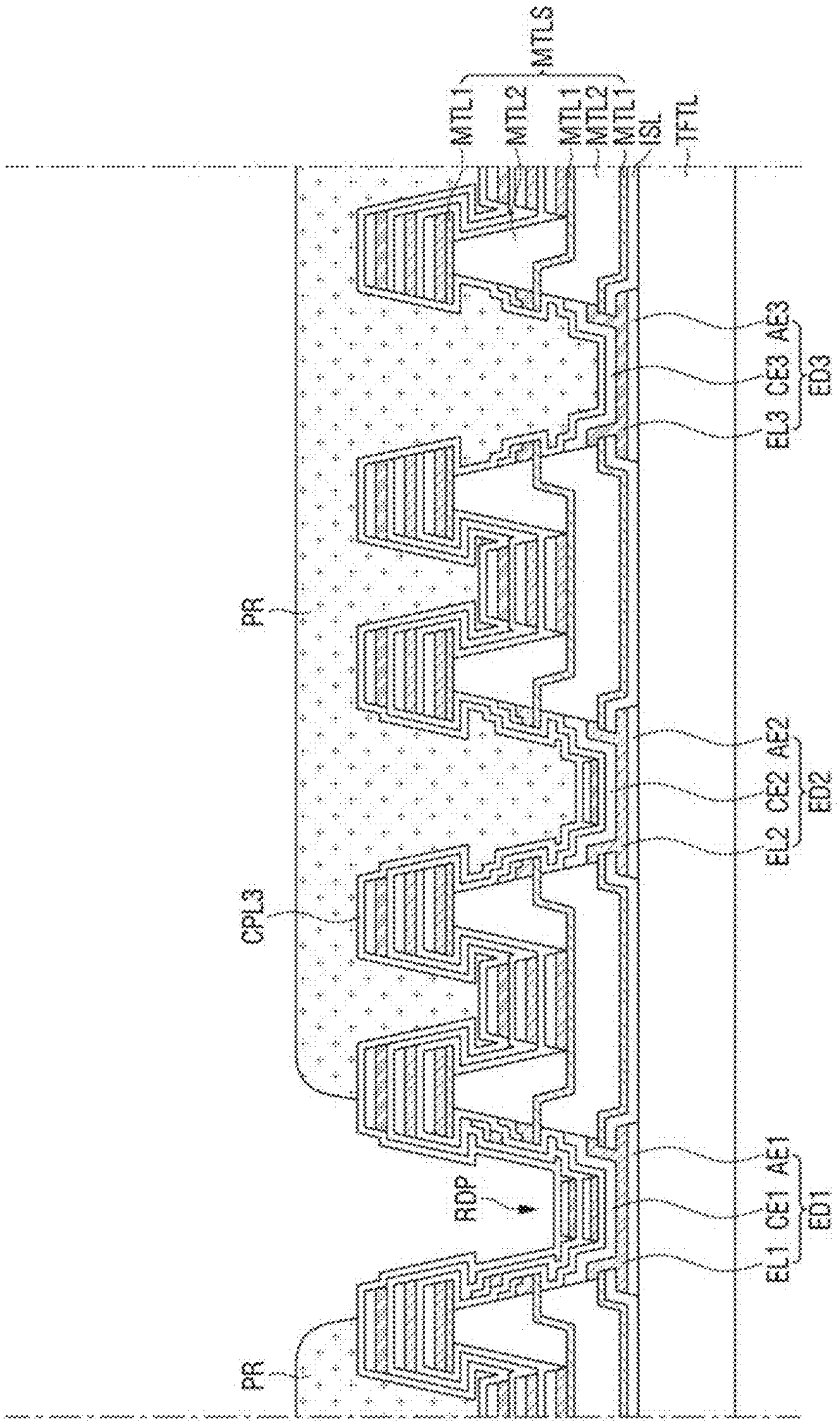
Figure 27:
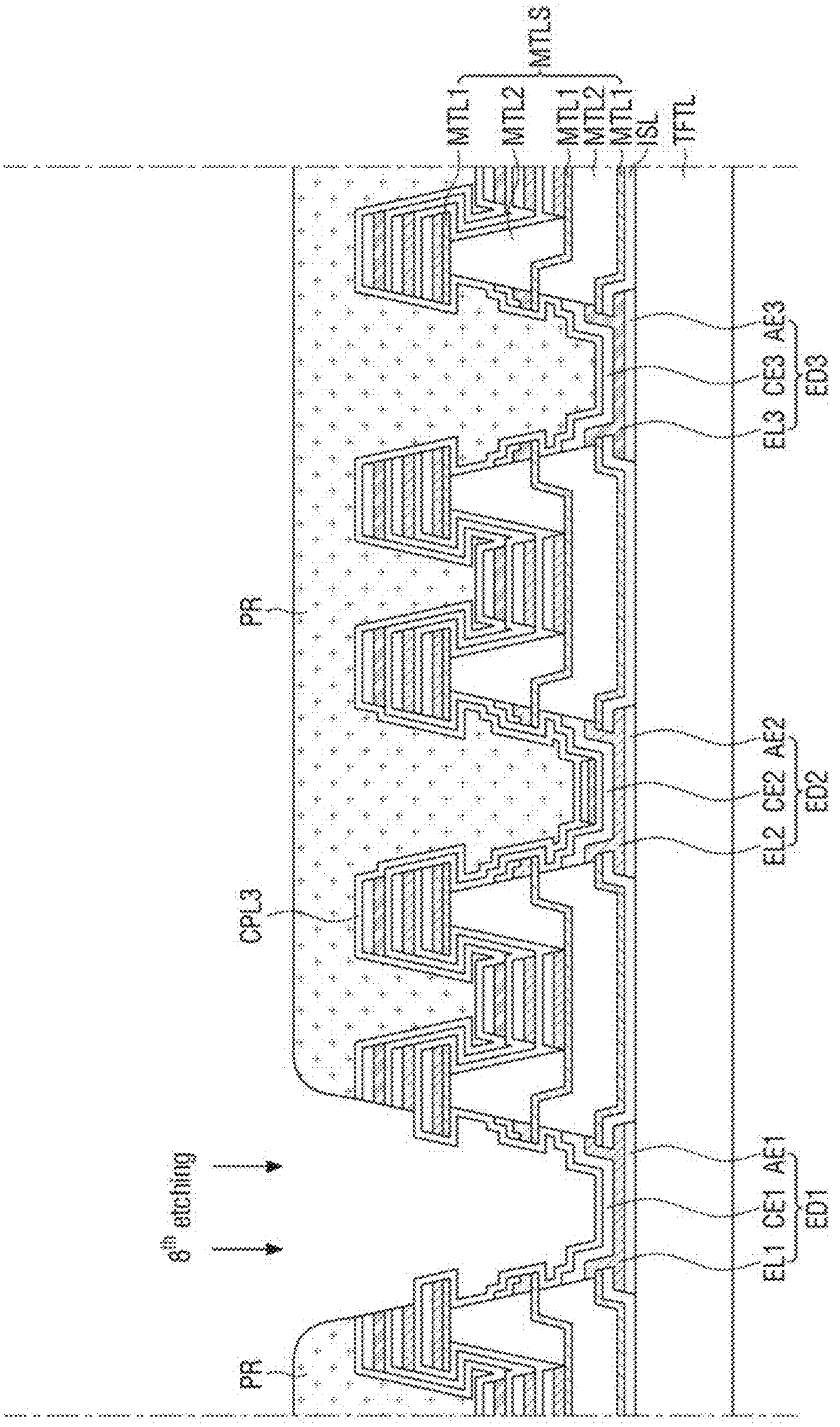
Figure 28:
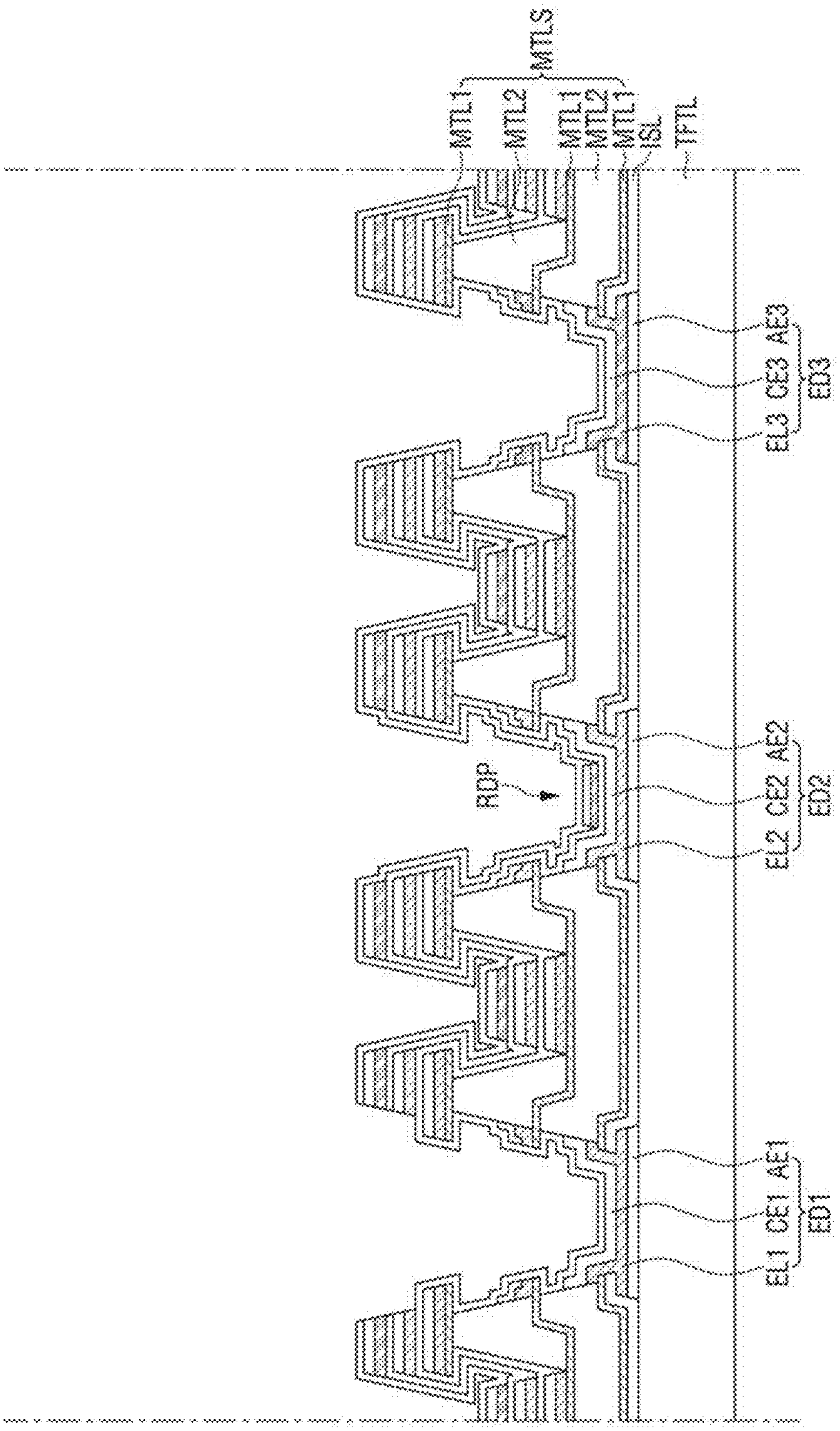

Referring to FIGS. 26 through 28, the dummy patterns RDP in the first opening OPE1 are removed. In an embodiment, a photoresist PR is formed to cover areas other than the first opening OPE1, and an eighth etching process ("8$^{th}$ etching") is performed which removes the dummy patterns RDP from the first opening OPE1 exposed by the photoresist PR. During the eighth etching process, the dummy patterns RDP in the first opening OPE1, which include the same materials as the second light-emitting layer EL2, the second common electrode CE2, the third light-emitting layer EL3, and the third common electrode CE3 that are disposed on the first capping layer CPL1, and the second and third capping layers CPL2 and CPL3 may be removed from the first opening OPE1. As a result, the first capping layer CPL1 may be disposed in the first opening OPE1 as an uppermost layer.

In this process, the second and third capping layers CPL2 and CPL3 may be removed, and the second organic patterns ELP2, the second electrode patterns CEP2, the third organic patterns ELP3, and the third electrode patterns CEP3 may be partially removed from around the first opening OPE1. The first organic patterns ELP1 and the first electrode patterns CEP1 may have a larger width than the organic patterns ELP and the electrode patterns CEP disposed thereon, around the first opening OPE1.

Figure 29:
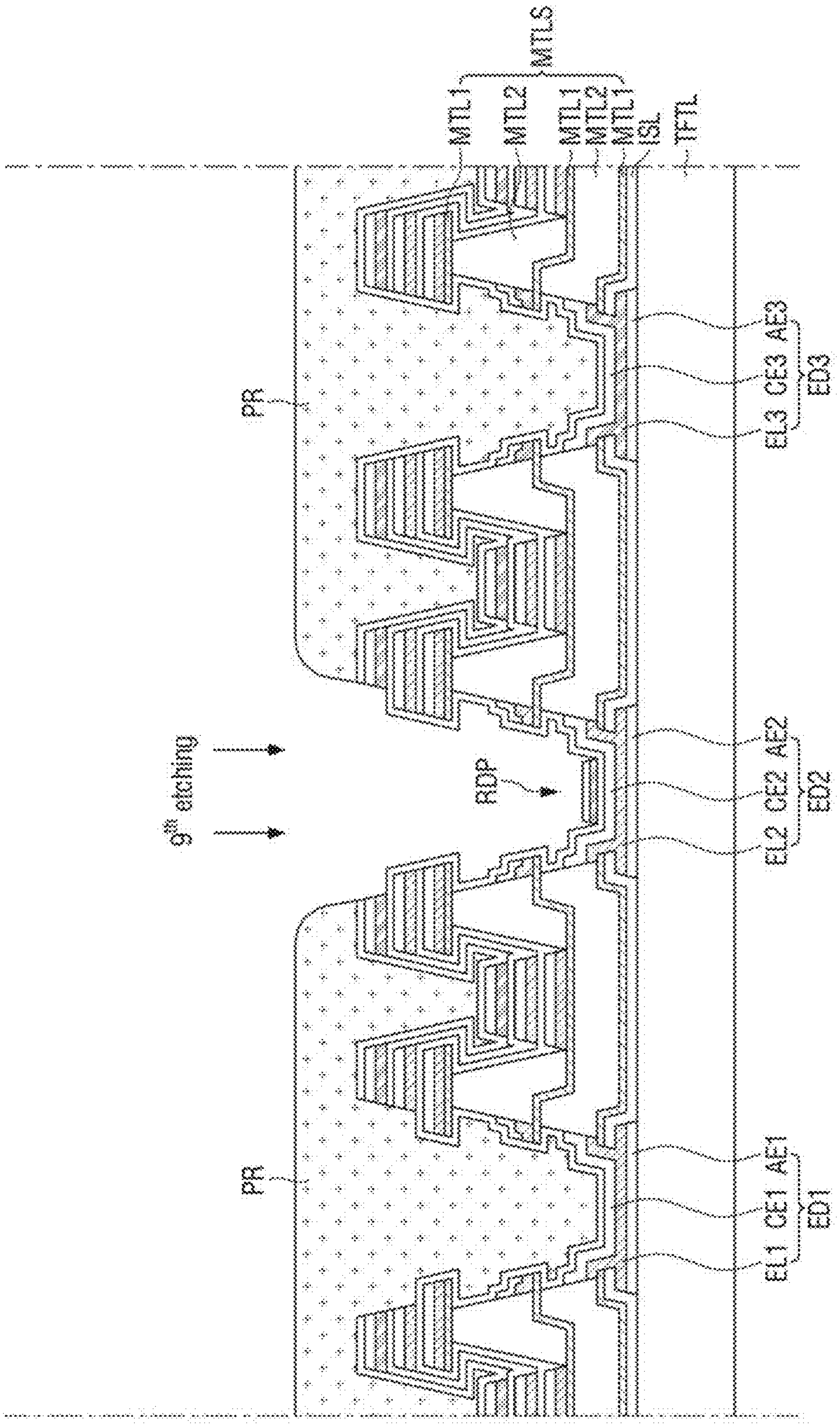
Figure 30:
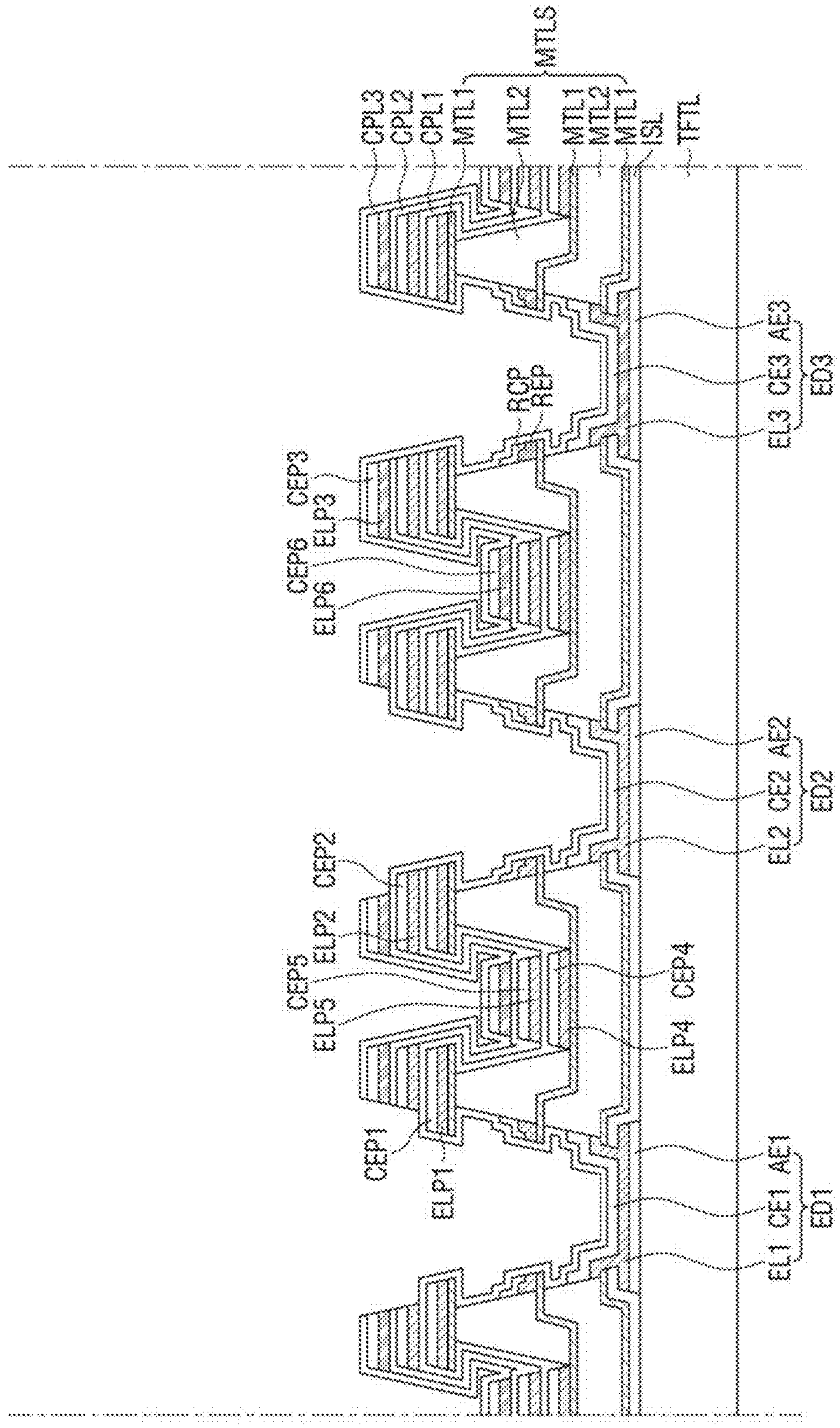

Thereafter, referring to FIGS. 29 and 30, the dummy patterns RDP in the second opening OPE2 are removed. In an embodiment, a photoresist PR is formed to cover areas other than the second opening OPE2, and a ninth etching process ("9$^{th}$ etching") is performed which removes the dummy patterns RDP from the second opening OPE2 exposed by the photoresist PR. During the ninth etching process, the dummy patterns RDP in the second opening OPE2, which include the same materials as the third light-emitting layer EL3 and the third common electrode CE3 that are disposed on the second capping layer CPL2, and the third capping layer CPL3 may be removed. As a result, the second capping layer CPL2 may be disposed in the second opening OPE2 as an uppermost layer.

In this process, the third capping layer CPL3 may be removed, and the third organic patterns ELP3 and the third electrode patterns CEP3 may be partially removed from around the second opening OPE2. The second organic patterns ELP2 and the second electrode patterns CEP2 may have a larger width than the organic patterns ELP and the electrode patterns CEP disposed thereon, around the second opening OPE2.

As no dummy patterns RDP are disposed in the third opening OPE3 and the third capping layer CPL3 is disposed in the third opening OPE3 as an uppermost layer, the above-described etching processes may not be performed on the third opening OPE3. As a result, the organic patterns ELP and the electrode patterns CEP may not be removed from around the third opening OPE3. The organic patterns ELP and the electrode patterns CEP disposed around the third opening OPE3 may have substantially the same width as the organic patterns and the electrode patterns CEP disposed thereon.

Figure 31:
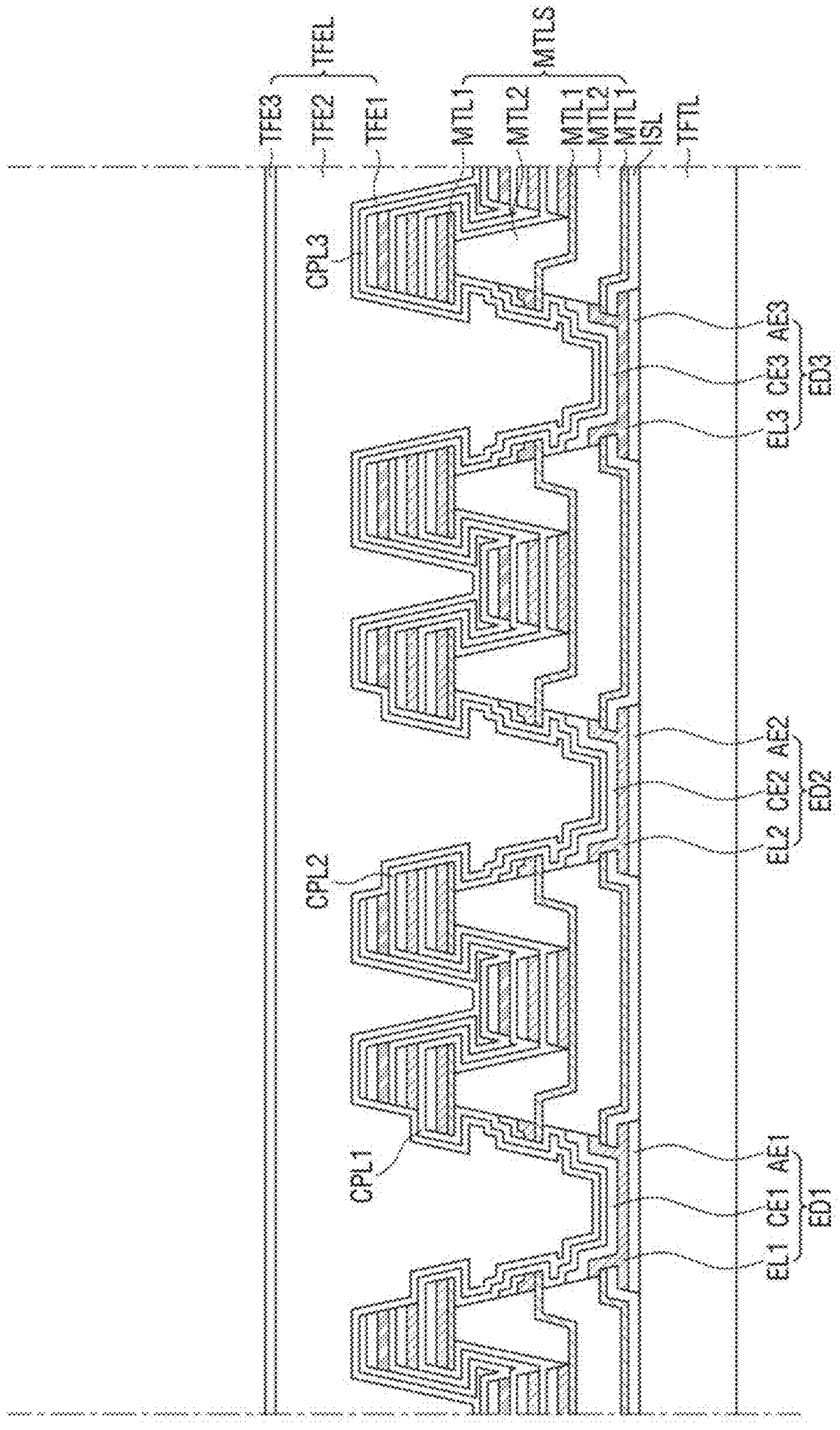
Figure 32:
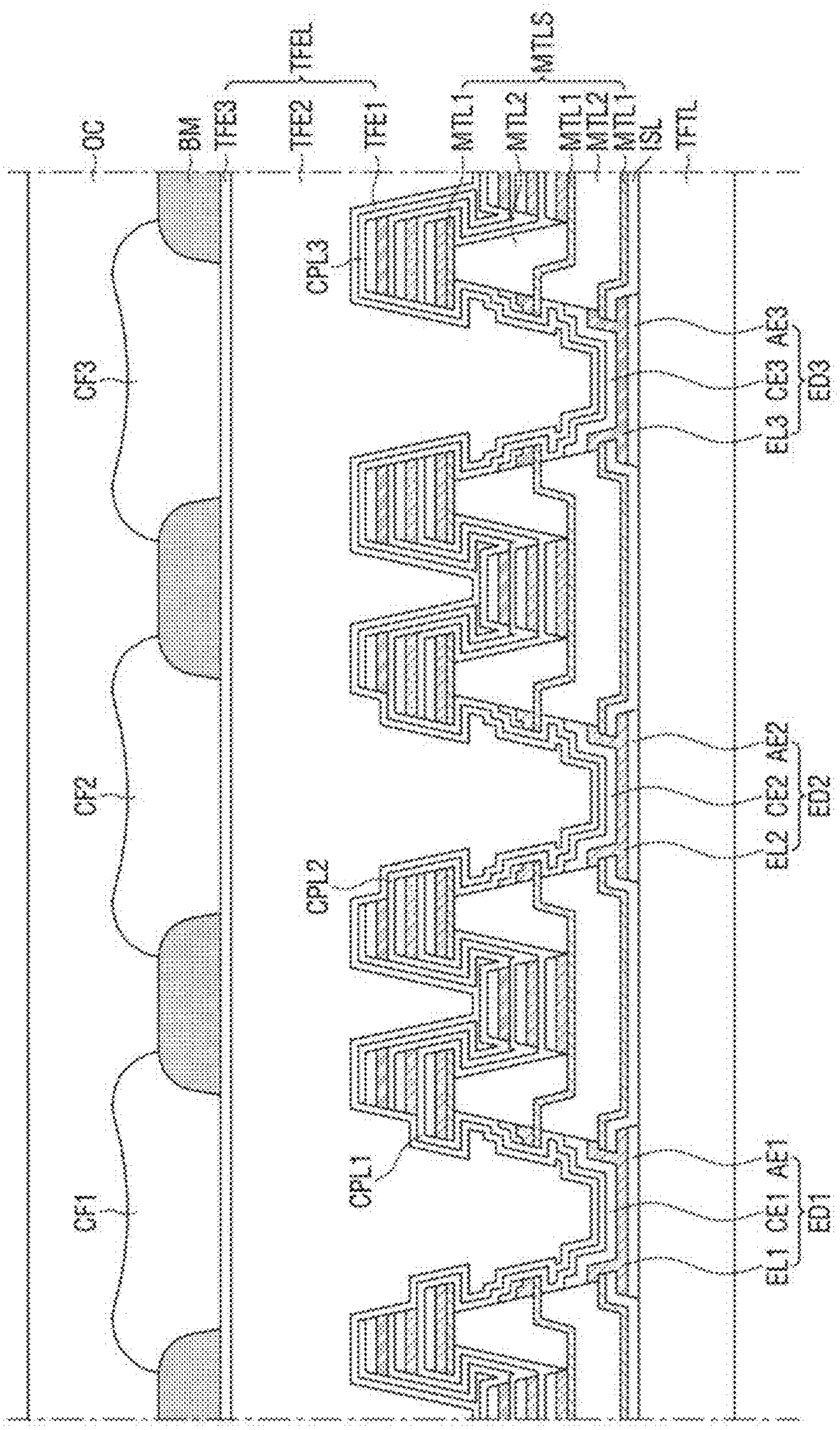

Thereafter, referring to FIGS. 31 and 32, a thin-film encapsulation layer TFEL, a light-blocking layer BM, a color filter layer CFL, and an overcoat layer OC are formed on the first to third light-emitting elements ED1, ED2, and ED3 and the metal layer structure MTLS, thereby obtaining the display device 10. The thin-film encapsulation layer TFEL, the light-blocking layer BM, the color filter layer CFL, and the overcoat layer OC are as already described above, and thus, a detailed descriptions thereof will be omitted for economy of description.

In concluding the detailed description, those skilled in the art will appreciate that many variations and modifications can be made to the described embodiments without substantially departing from the principles of the present disclosure. Therefore, the described embodiments of the present disclosure are used in a generic and descriptive sense only and not for purposes of limitation.

What is claimed is:

1. A display device comprising:

a first pixel electrode and a second pixel electrode disposed on a substrate and arranged to be spaced apart from each other;

an inorganic insulating layer disposed on the substrate and partially overlapping the first pixel electrode and the second pixel electrode;

a metal layer structure disposed on the inorganic insulating layer and including a first opening overlapping the first pixel electrode and defining a first light emission area and a second opening overlapping the second pixel electrode and defining a second light emission area;

a first light-emitting layer and a second light-emitting layer disposed on the first pixel electrode and the second pixel electrode, respectively; and a first common electrode and a second common electrode disposed on the first light-emitting layer and the second light-emitting layer, respectively, wherein the metal layer structure includes a plurality of first metal layers and a plurality of second metal layers that are alternately stacked with each other, wherein the first metal layers comprise uppermost and lowermost layers of the alternately stacked plurality of first and second metal layers, and each of the plurality of first metal layers includes metal tips that protrude beyond the plurality of second metal layers and are positioned on sidewalls of each of the first opening and the second opening, wherein side surfaces of the metal tip of a lowermost layer of the plurality of first metal layers positioned on the sidewalls of the first and second openings are directly covered by the first-light emitting layer and the second-light emitting layer, respectively.

2. The display device of claim 1, wherein:

the plurality of first metal layers include titanium (Ti); and the plurality of second metal layers include aluminum (Al).

3. The display device of claim 1, wherein:

the first common electrode and the second common electrode directly contact side surfaces of one second metal layer of the plurality of second metal layers disposed directly above a lowermost first metal layer of the metal layer structure.

4. The display device of claim 3, wherein:

the first light-emitting layer and the second light-emitting layer directly contact with the side surfaces of the one second metal layer disposed directly above the lowermost first metal layer of the metal layer structure.

5. The display device of claim 1, wherein:

the inorganic insulating layer is spaced apart from top surfaces of the first pixel electrode and the second pixel electrode;

a portion of the first light-emitting layer is disposed between the first pixel electrode and the inorganic insulating layer; and a portion of the second light-emitting layer is disposed between the second pixel electrode and the inorganic insulating layer.

6. The display device of claim 1, further comprising:

residual organic patterns disposed on metal tips of a middle first metal layer that is positioned between a lowermost first metal layer and an uppermost first metal layer of the metal layer structure;

the residual organic patterns include a same material as the first light-emitting layer or the second light-emitting layer; and residual electrode patterns are disposed on the residual organic patterns and include a same material as the first common electrode or the second common electrode.

7. The display device of claim 1, further comprising:

first organic patterns disposed on an uppermost first metal layer of the plurality of first metal layers and including a same material as the first light-emitting layer;

first electrode patterns disposed on the first organic patterns and including a same material as the first common electrode;

second organic patterns disposed on the first electrode patterns and including a same material as the second light-emitting layer; and second electrode patterns disposed on the second organic patterns and including a same material as the second common electrode.

8. The display device of claim 7, further comprising:

a first capping layer disposed on the sidewalls of the first opening and on the first common electrode and the first electrode patterns; and a second capping layer disposed on the sidewalls of the second opening and on the second common electrode and the second electrode patterns, wherein the second organic patterns are disposed directly on the first capping layer.

9. The display device of claim 8, wherein one second organic pattern of the second organic patterns and one second electrode pattern of the second electrode patterns disposed around the first opening has a smaller width than one second organic pattern of the second organic patterns and one second electrode pattern of the second electrode patterns disposed around the second opening.

10. The display device of claim 7, further comprising:

a third pixel electrode disposed on the substrate and arranged to be spaced apart from the second pixel electrode;

a third light-emitting layer disposed on the third pixel electrode; and a third common electrode disposed on the third light-emitting layer, wherein the metal layer structure further includes a third opening overlapping the third pixel electrode, and the display device further comprises third organic patterns disposed on the second electrode patterns and including a same material as the third light-emitting layer, and third electrode patterns disposed on the third organic patterns and including a same material as the third common electrode.

11. The display device of claim 1, wherein:

the metal layer structure further includes a trench disposed between the first opening and the second opening, the trench penetrating an uppermost first metal layer of the plurality of first metal layers and at least one second metal layer of the plurality of second metal layers; and metal tips are formed in each of the plurality of first metal layers positioned on sidewalls of the trench to protrude beyond the plurality of second metal layers.

12. The display device of claim 11, further comprising:

fourth organic patterns disposed in the trench of the metal layer structure and including a same material as the first light-emitting layer;

fourth electrode patterns disposed on the fourth organic patterns and including a same material as the first common electrode;

fifth organic patterns disposed on the fourth electrode patterns and including a same material as the second light-emitting layer; and fifth electrode patterns disposed on the fifth organic patterns and including a same material as the second common electrode.

13. The display device of claim 1, further comprising:

a first thin-film encapsulation layer disposed on the metal layer structure, the first common electrode, and the second common electrode;

a second thin-film encapsulation layer disposed on the first thin-film encapsulation layer; and a third thin-film encapsulation layer disposed on the second thin-film encapsulation layer.

14. The display device of claim 13, further comprising:

a light-blocking layer disposed on the third thin-film encapsulation layer and including a plurality of holes overlapping the first opening and the second opening;

a first color filter disposed on the first light-emitting layer and overlapping the first opening; and a second color filter overlapping the second opening.

15. A method of fabricating a display device, comprising:

forming a first pixel electrode and a second pixel electrode on a substrate, the first pixel electrode and the second pixel electrode are arranged to be spaced apart from each other, a sacrificial layer is disposed on the first pixel electrode and the second pixel electrode, an inorganic insulating layer is disposed on the sacrificial layer, and a plurality of first metal layers and a plurality of second metal layers are alternately stacked on the inorganic insulating layer;

forming a first hole that does not overlap the first pixel electrode and the second pixel electrode and penetrates at least some of the plurality of first metal layers and at least some of the plurality of second metal layers, and a second hole that penetrates the plurality of first metal layers and the plurality of second metal layers to expose a portion of the sacrificial layer on the first pixel electrode;

removing the sacrificial layer by wet etching the sacrificial layer and sidewalls of each of the first hole and the second hole to form metal tips in each of the plurality of first metal layers that protrude beyond sidewalls of each of the second metal layers; and forming a first light-emitting layer and a first common electrode on the first pixel electrode in a first opening that is obtained from the wet etching of the second hole, the first opening defining a first light emission area, and forming a first capping layer on the first common electrode, the first metal layers, and the second metal layers, wherein a side surface of the metal tip of a lowermost layer of the plurality of first metal layers positioned on a sidewall of the first opening is directly covered by the first light-emitting layer.

16. The method of fabricating a display device of claim 15, wherein:

the forming of the first light-emitting layer and the first common electrode, comprises depositing materials for forming the first light-emitting layer and the first common electrode; and the depositing of the materials for forming the first light-emitting layer and the first common electrode comprises depositing the materials for forming the first light-emitting layer and the first common electrode in a diagonal direction with respect to a top surface of the substrate, wherein:

the depositing of the materials for forming the first light-emitting layer and the first common electrode comprises depositing the material for forming the first light-emitting layer at an angle in a range of about 45° to about 50° with respect to the top surface of the substrate; and depositing the material for forming the first common electrode at an angle less than or equal to about 30° with respect to the top surface of the substrate.

17. The method of fabricating a display device of claim 15, wherein the forming of the first light-emitting layer and the first common electrode comprises forming residual organic patterns in the first opening, the residual organic patterns are disposed on the metal tips and include a same material as the first light-emitting layer, and forming residual electrode patterns on the residual organic patterns and include a same material as the first common electrode.

18. The method of fabricating a display device of claim 15, wherein:

the forming of the first light-emitting layer and the first common electrode comprises forming first organic patterns that are disposed on the plurality of first metal layers and the plurality of second metal layers and include a same material as the first light-emitting layer, and first electrode patterns that include a same material as the first common electrode; and the first capping layer is disposed on the first electrode patterns.

19. The method of fabricating a display device of claim 18, further comprising, after the forming the first capping layer:

forming a second opening overlapping the second pixel electrode and penetrating the first organic patterns, the first electrode patterns, the first capping layer, the first metal layers, and the second metal layers, the second opening defining a second light emission area; and forming a second light-emitting layer and a second common electrode on the second pixel electrode in the second opening, and forming a second capping layer on the second common electrode, the plurality of first metal layers, and the plurality of second metal layers, wherein a side surface of the metal tip of the lowermost layer of the plurality of first metal layers positioned on a sidewall of the second opening is directly covered by the first light-emitting layer.

20. An electronic device, comprising:

a display device comprising:

a first pixel electrode and a second pixel electrode disposed on a substrate and arranged to be spaced apart from each other;

an inorganic insulating layer disposed on the substrate and partially overlapping the first pixel electrode and the second pixel electrode;

a metal layer structure disposed on the inorganic insulating layer and including a first opening overlapping the first pixel electrode and defining a first light emission area and a second opening overlapping the second pixel electrode and defining a second light emission area;

a first light-emitting layer and a second light-emitting layer disposed on the first pixel electrode and the second pixel electrode, respectively; and a first common electrode and a second common electrode disposed on the first light-emitting layer and the second light-emitting layer, respectively, wherein the metal layer structure includes a plurality of first metal layers and a plurality of second metal layers that are alternately stacked with each other, wherein the first metal layers comprise uppermost and lowermost layers of the alternately stacked plurality of first and second metal layers, and each of the plurality of first metal layers includes metal tips that protrude beyond the plurality of second metal layers and are positioned on sidewalls of each of the first opening and the second opening, wherein side surfaces of the metal tip of a lowermost layer of the plurality of first metal layers positioned on the sidewalls of the first and second openings are directly covered by the first-light emitting layer and the second-light emitting layer, respectively.

* * * * *